(12) United States Patent
Quinn et al.

(10) Patent No.: US 8,937,301 B2
(45) Date of Patent: Jan. 20, 2015

(54) PHOTOCURABLE POLYMERIC DIELECTRICS CONTAINING 6-SUBSTITUTED COUMARIN MOIETIES AND METHODS OF PREPARATION AND USE THEREOF

(75) Inventors: Jordan Quinn, Skokie, IL (US); He Yan, Skokie, IL (US); Yan Zheng, Skokie, IL (US); Christopher Newman, Evanston, IL (US); Silke Annika Koehler, Basel (CH); Antonio Facchetti, Chicago, IL (US); Thomas Breiner, Laudenbach (DE)

(73) Assignees: BASF SE, Ludwigshafen (DE); Polyera Corporation, Skokie, IL (US)

( * ) Notice: Subject to any disclaimer, the term of this patent is extended or adjusted under 35 U.S.C. 154(b) by 770 days.

(21) Appl. No.: 13/128,961

(22) PCT Filed: Nov. 20, 2009

(86) PCT No.: PCT/EP2009/065569
§ 371 (c)(1),
(2), (4) Date: May 12, 2011

(87) PCT Pub. No.: WO2010/057984
PCT Pub. Date: May 27, 2010

(65) Prior Publication Data
US 2011/0215334 A1  Sep. 8, 2011

Related U.S. Application Data

(60) Provisional application No. 61/117,404, filed on Nov. 24, 2008.

(51) Int. Cl.
*H01L 29/786* (2006.01)
*H01L 51/05* (2006.01)
(Continued)

(52) U.S. Cl.
CPC .......... *H01L 51/052* (2013.01); *H01L 51/0043* (2013.01); *C08G 61/02* (2013.01); *H01L 51/004* (2013.01); *H01L 51/0073* (2013.01)
USPC .............. 257/40; 257/66; 257/E29.295

(58) Field of Classification Search
CPC .................... H01L 51/052; H01L 51/0073
USPC ........................... 257/40, 66, E29.295
See application file for complete search history.

(56) References Cited

U.S. PATENT DOCUMENTS 6,585,914 B2  7/2003  Marks et al.
6,608,323 B2  8/2003  Marks et al.
(Continued)

FOREIGN PATENT DOCUMENTS

EP       1 958 972 A1    8/2008
WO   WO 2005/029605 A1    3/2005
WO   WO 2005029605 A1 *  3/2005

OTHER PUBLICATIONS

Jackson, Peregrine O et al.; An Investigation of the Role of Cross-Linking and Photodegradation of Side-Chain Coumarin Polymers in the Photoalignment of Liquid Crystals; Chem. Mater.; Published 2001; vol. 13; pp. 694-703.*

(Continued)

*Primary Examiner* — Michael Jung
*Assistant Examiner* — John P Dulka
(74) *Attorney, Agent, or Firm* — Oblon, Spivak, McClelland, Maier & Neustadt, L.L.P.

(57) ABSTRACT

Disclosed are polymer-based dielectric compositions (e.g., formulations) and materials (e.g. films) and associated devices. The polymers generally include photocrosslinkable pendant groups; for example, the polymers can include one or more coumarin-containing pendant groups.

11 Claims, 14 Drawing Sheets a)

b)

c)

d)

(51) Int. Cl.
*H01L 51/00* (2006.01)
*C08G 61/02* (2006.01)

(56) References Cited

U.S. PATENT DOCUMENTS

| | | | |
|---|---|---|---|
| 6,991,749 B2 | 1/2006 | Marks et al. | |
| 7,893,265 B2 | 2/2011 | Facchetti et al. | |
| 8,580,384 B2* | 11/2013 | Zheng et al. | 428/411.1 |
| 2005/0176970 A1 | 8/2005 | Marks et al. | |
| 2006/0186401 A1 | 8/2006 | Marks et al. | |
| 2007/0034861 A1 | 2/2007 | Nakamura | |
| 2007/0282094 A1 | 12/2007 | Marks et al. | |
| 2008/0021220 A1 | 1/2008 | Marks et al. | |
| 2008/0167435 A1 | 7/2008 | Marks et al. | |
| 2008/0177073 A1 | 7/2008 | Facchetti et al. | |
| 2008/0185555 A1 | 8/2008 | Facchetti et al. | |
| 2008/0185577 A1 | 8/2008 | Facchetti et al. | |
| 2008/0249309 A1 | 10/2008 | Facchetti et al. | |
| 2009/0114907 A1* | 5/2009 | Nakamura | 257/40 |
| 2010/0283047 A1 | 11/2010 | Facchetti et al. | |
| 2010/0319778 A1 | 12/2010 | Kastler et al. | |
| 2010/0326527 A1 | 12/2010 | Facchetti et al. | |
| 2011/0101329 A1 | 5/2011 | Kastler et al. | |
| 2011/0120558 A1 | 5/2011 | Facchetti et al. | |
| 2011/0136333 A1 | 6/2011 | Facchetti et al. | |
| 2013/0153885 A1* | 6/2013 | Mueller et al. | 257/40 |
| 2014/0021465 A1* | 1/2014 | Facchetti et al. | 257/43 |

OTHER PUBLICATIONS

U.S. Appl. No. 13/002,392, filed Mar. 18, 2011, Kastler, et al.
U.S. Appl. No. 13/002,208, filed Dec. 30, 2010, Kastler, et al.
Yanqing Tian, et al., "Photocrosslinkable Liquid-Crystalline Block Copolymers with Coumarin Units Synthesized with Atom Transfer Radical Polymerization", Journal of Polymer Science, Part A: Polymer Chemistry, vol. 41, No. 14, XP 2590147, Jul. 6, 2003, pp. 2197-2206.
Chunki Kim, et al., "New Insight into Photoalignment of Liquid Crystals on Coumarin-Containing Polymer Films", Macromolecules, vol. 39, No. 11, XP 2578222, May 30, 2006, pp. 3817-3823.
Seungmoon Pyo, et al., "An Organic Thin-Film Transistor with a Photoinitiator-Free Photosensitive Polyimide as Gate Insulator", Advanced Functional Materials, vol. 15, No. 4, XP 1226058, Apr. 1, 2005, pp. 619-626.
Peregrine Orr Jackson, et al., "An Investigation of the Role of Cross-Linking and Photodegradation of Side-Chain Coumarin Polymers in the Photoalignment of Liquid Crystals", Chemistry of Materials, vol. 13, XP 2590145, Mar. 1, 2001, pp. 694-703.
Scott R. Trenor, et al., "Coumarins in Polymers: From Light Harvesting to Photo-Cross-Linkable Tissue Scaffolds", Chemical Reviews, vol. 104, No. 6, XP 2590146, Jun. 2004, pp. 3059-3077.
U.S. Appl. No. 13/809,496, filed Jan. 10, 2013, Koehler, et al.
English translation of the Taiwanese Search Report issued May 13, 2014, in Taiwanese Patent Application No. 098139975.

* cited by examiner

PHOTOCURABLE POLYMERIC DIELECTRICS CONTAINING 6-SUBSTITUTED COUMARIN MOIETIES AND METHODS OF PREPARATION AND USE THEREOF

CROSS REFERENCE TO RELATED APPLICATION

This application claims priority to and the benefit of U.S. Provisional Patent Application Ser. No. 61/117,404, filed on Nov. 24, 2008, the disclosure of which is incorporated by reference herein in its entirety.

INTRODUCTION

Development of the next generation of electronic devices is based on organic materials, flexible substrates and low-cost solution-processing. A critical component in most organic electronic devices is a polymeric dielectric layer that serves as the gate insulator material in thin-film transistors, which are key building blocks of any electronic circuit. The polymer dielectric layer can be formed on either the gate contact (for bottom-gate transistor structures) or the semiconductor layer (for top-gate transistor structures) by depositing a solution of an electrically insulating (i.e., dielectric) polymer via a solution phase process such as spin-coating or printing. To create a robust, insoluble dielectric material, a crosslinking step usually is required.

Crosslinked dielectric films can be prepared by irradiation (i.e., photocuring), chemical initiators, or thermal treatment (i.e., annealing). Photocuring is advantageous because it can be easily implemented and can avoid chemical initiators or prolonged heating either of which can disrupt film uniformity. A limitation of several current-generation photocurable materials is the need for high-energy light such as short-wavelength UV rays and prolonged exposure to achieve sufficient curing. However, because many polymeric backbones and crosslinked units can absorb short-wavelength UV light, the use of these photocurable materials can lead to inefficient curing of the dielectric film. Therefore, it is advantageous to develop polymeric dielectric materials that can be crosslinked at longer wavelengths, which will lead to a faster and deeper cure of the dielectric layer.

Accordingly, there is a desire in the art for photocurable polymeric dielectric compositions that can be crosslinked with longer-wavelength ultraviolet light. More generally, the art also desires polymeric compositions that can afford solution-processable dielectric films which, preferably, are air- and/or moisture-stable, compatible with diverse gate and/or semiconductor materials, and exhibit low current leakage densities.

SUMMARY

In light of the foregoing, the present teachings provide electrically insulating (i.e., dielectric) polymers, polymer-based dielectric compositions (e.g., formulations) and materials (e.g., films), and associated devices that can address various deficiencies and shortcomings of the prior art, including those outlined above.

In one aspect, the present teachings provide various polymers and compositions including those polymers that can be used to prepare dielectric materials. Among other desirable properties, the polymers of the present teachings can be soluble in common organic solvents but can become insoluble in the same solvents after undergoing crosslinking, for example, photocrosslinking, which gives rise to certain processing advantages. More specifically, the present teachings provide polymers having crosslinkable functional groups, for example, photocrosslinkable functional groups, in their pendant groups (or side groups), enabling the polymers to crosslink, for example, upon radiation exposure. The crosslinking functionality can allow formation of a densely crosslinked polymeric matrix. Photopolymers of the present teachings and their crosslinked products can have excellent electrically insulating properties, which can enable their use as dielectrics. In some embodiments, the photopolymers and their crosslinked products can have a leakage current density that is less than or equal to about $1 \times 10^{-8}$ A/cm$^2$ at an electric field of 2 MV/cm.

The polymers of the present teachings can have a coumarin-containing pendant group, wherein the coumarin-containing pendant group can be represented by the formula:

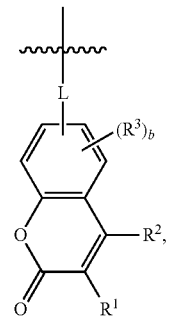

for example,

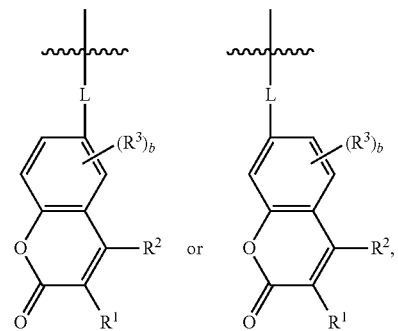

wherein $R^1$, $R^2$, $R^3$, L and b are as defined herein.

In certain embodiments, the polymer can be a homopolymer or a copolymer based on vinyl phenol monomers. For example, certain embodiments of the present polymers can be represented by the formula:

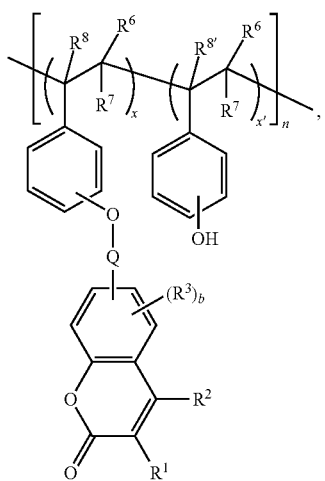

wherein x and x' independently are real numbers; x+x'=1; x>0; 0≤x'<1; n is an integer greater than 2 (e.g., between 10-1,000); and $R^1$, $R^2$, $R^3$, $R^6$, $R^7$, $R^8$, $R^{8'}$, Q and b are as defined herein. In some embodiments, the present polymers can have the formula:

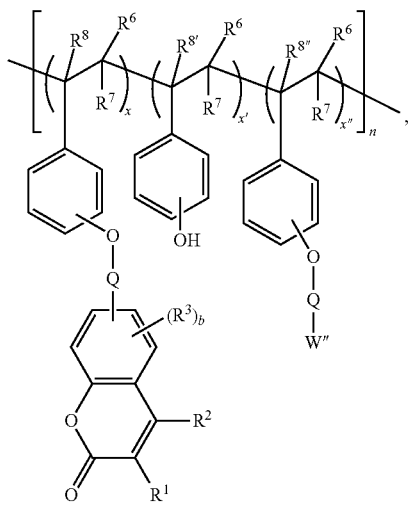

wherein x, x', x" independently are real numbers; x+x'+x"=1; x, x">0; 0≤x'<1; n is an integer greater than 2 (e.g., between 10-1,000); and $R^1$, $R^2$, $R^3$, $R^6$, $R^7$, $R^8$, $R^{8'}$, $R^{8''}$, Q, W" and b are as defined herein. For example, —O-Q-W" can be a derivative of the hydroxyl group of the phenol group.

In particular embodiments, the present polymers can be a copolymer including a pendant group -L-W and optionally a pendant group -L-W', and can have the formula:

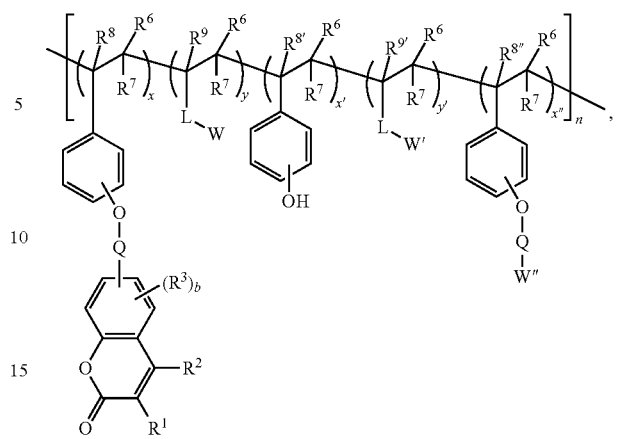

wherein each of x, x', x", y and y' independently is a real number; x, y>0; 0≤x'<1; 0≤x"<1; 0≤y'<1; n is an integer greater than 2 (e.g., between 10-1,000); and $R^1$, $R^2$, $R^3$, $R^6$, $R^7$, $R^8$, $R^{8'}$, $R^{8''}$, $R^9$, $R^{9'}$, L, Q, W, W', W" and b are as defined herein.

The present teachings also provide polymeric compositions and dielectric materials that include the polymers described above. For example, the dielectric materials can be prepared from the polymers described above. Multilayer dielectric materials are provided which include two or more layers of dielectric materials sequentially deposited on top of each other, where at least one of the layers is prepared from polymers of the present teachings. The present polymers can be used to prepare dielectric materials using various solution processes, including various printing techniques.

The present teachings further provide electronic devices that include or are made from any of the dielectric materials described above. Examples of electronic devices include, but are not limited to, organic thin film transistors (OTFTs) (e.g., organic field effect transistors (OFETs)) and capacitors. In addition to a dielectric component, these devices can include, for example, a substrate component, a semiconductor component, and/or one or more metallic contact components. In some embodiments, the present teachings can provide a thin film transistor device including a dielectric layer; a semiconductor layer; a gate electrode; a source electrode; and a drain electrode; where the dielectric layer can be coupled to the semiconductor layer and the gate electrode, and the source electrode and the drain electrode can be in contact with the semiconductor layer, and where the dielectric layer can include a polymeric film (e.g., a photocrosslinked polymeric film) that includes one or more of the polymers described herein.

Methods for preparing the polymers, their use in electronic devices, the dielectric materials, and the electronic devices described above are also provided and are within the scope of the present teachings.

The foregoing as well as other features and advantages of the present teachings will be more fully understood from the following figures, description, and claims.

BRIEF DESCRIPTION OF DRAWINGS

It should be understood that the drawings described below are for illustration purpose only. The drawings are not necessarily to scale, with emphasis generally being placed upon illustrating the principles of the present teachings. The drawings are not intended to limit the scope of the present teachings in any way.

DETAILED DESCRIPTION

Figure 1:
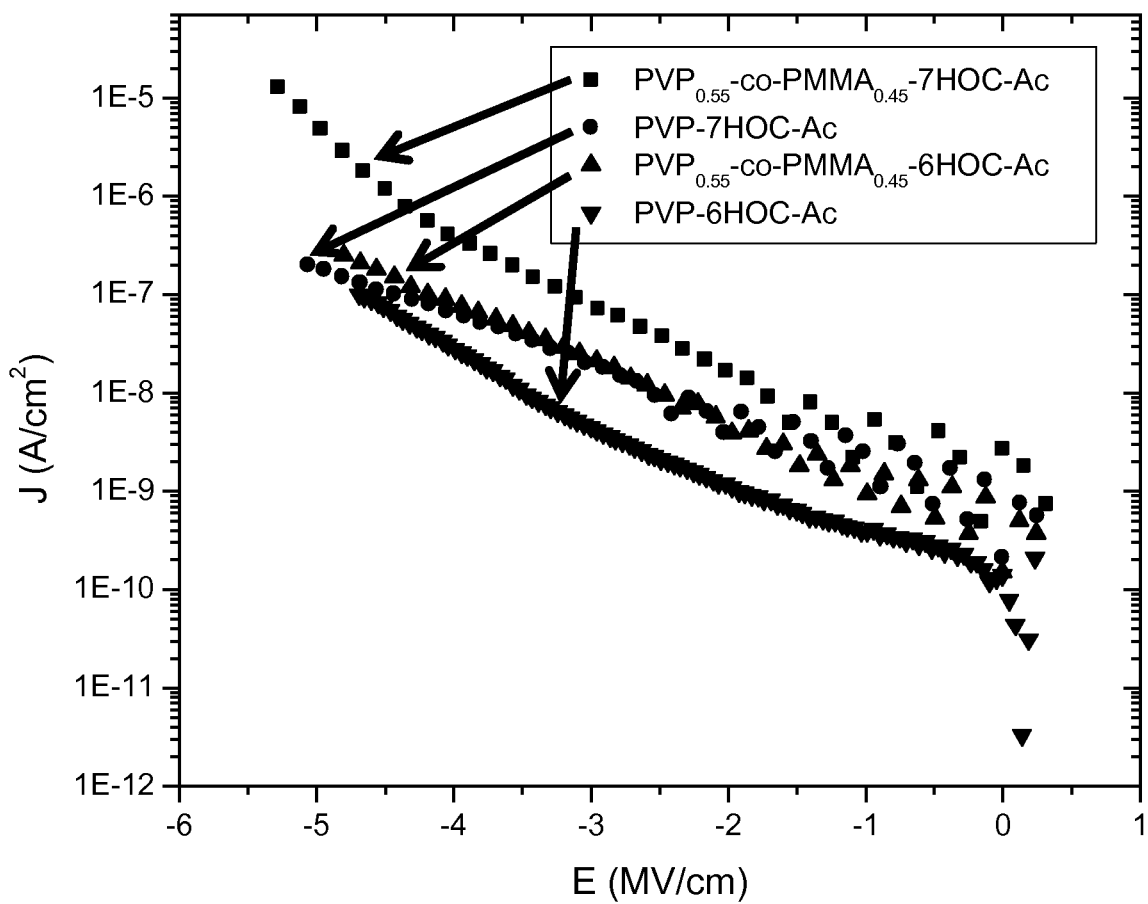
FIG. 1 provides leakage current density (J) versus electric field (E) plots of various metal-insulator-metal capacitor structures that were fabricated using dielectric materials of the present teachings.
Figure 2:
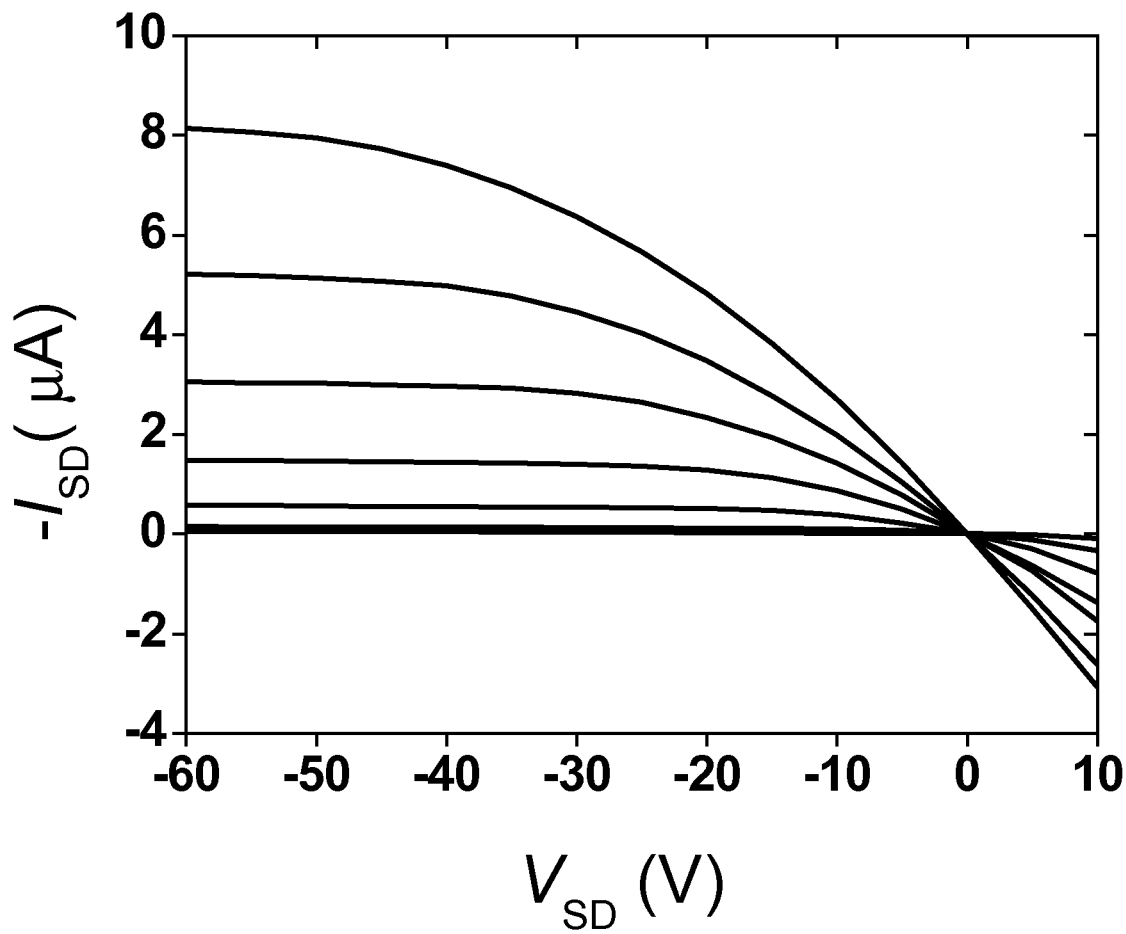
FIG. 2 provides representative output plots of poly(3-hexylthiophene)-based organic field effect transistors fabricated in a top-gate structure with dielectric materials of the present teachings (a crosslinked dielectric film prepared from $PVP_{0.55}$-co-$PMMA_{0.45}$-6HOC-Ac).
Figure 3:
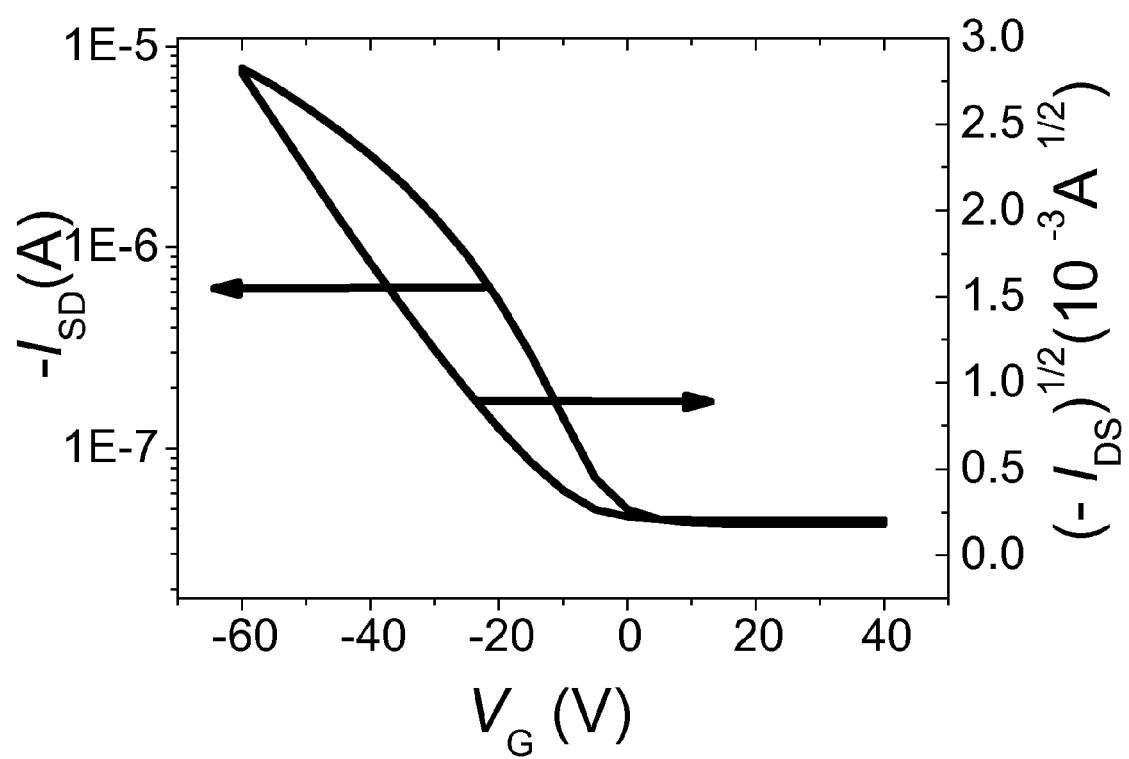
FIG. 3 provides representative transfer plots of poly(3-hexylthiophene)-based organic field effect transistors fabricated in a top-gate structure with dielectric materials of the present teachings (a crosslinked dielectric film prepared from $PVP_{0.55}$-co-$PMMA_{0.45}$-6HOC-Ac).
Figure 4:
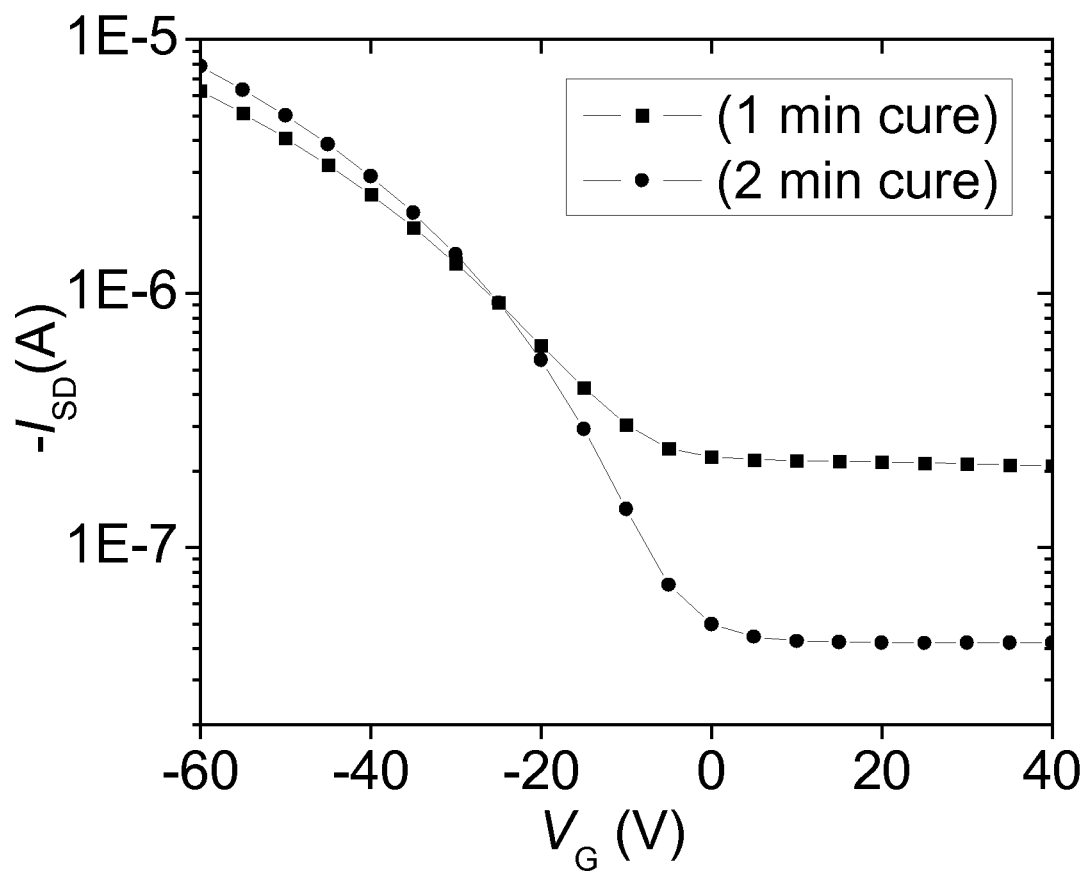
FIG. 4 provides representative transfer plots of poly(3-hexylthiophene)-based organic field effect transistors fabricated in a top-gate structure with dielectric materials of the present teachings (a crosslinked dielectric film prepared from $PVP_{0.55}$-co-$PMMA_{0.45}$-6HOC-Ac) cured with various radiation doses.
Figure 5:
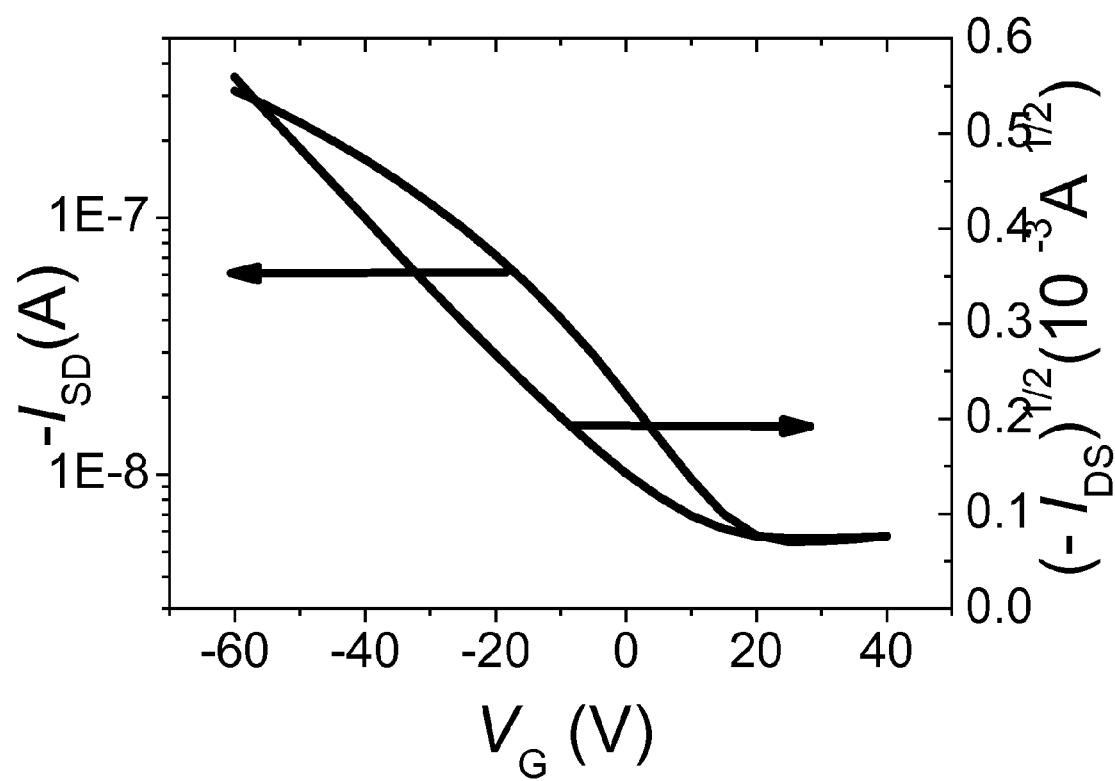
FIG. 5 provides comparative representative transfer plots of poly(3-hexylthiophene)-based organic field effect transistors fabricated in a bottom-gate top-contact structure with a $SiO_2$ dielectric layer.

The present teachings relate to organic dielectric materials that include crosslinkable polymers as well as associated compositions, composites, and/or devices that include such crosslinkable polymers and dielectric materials. More specifically, the present teachings provide solution-processable polymers that can be crosslinked, for example, photo-crosslinked, to provide insoluble robust dielectric materials that can exhibit electrically insulating properties and can be used to fabricate various organic electronic devices, including OTFTs. The dielectric materials also can be air-stable and can have long shelf stability, and can be compatible with a wide range of p-type and n-type organic and inorganic semiconductors, making them attractive materials for fabricating various organic electronic devices.

Throughout the application, where compositions are described as having, including, or comprising specific components, or where processes are described as having, including, or comprising specific process steps, it is contemplated that compositions of the present teachings also consist essentially of, or consist of, the recited components, and that the processes of the present teachings also consist essentially of, or consist of, the recited process steps.

In the application, where an element or component is said to be included in and/or selected from a list of recited elements or components, it should be understood that the element or component can be any one of the recited elements or components or can be selected from a group consisting of two or more of the recited elements or components. Further, it should be understood that elements and/or features of a composition, an apparatus, or a method described herein can be combined in a variety of ways without departing from the spirit and scope of the present teachings, whether explicit or implicit herein.

The use of the terms "include," "includes", "including," "have," "has," or "having" should be generally understood as open-ended and non-limiting unless specifically stated otherwise.

The use of the singular herein includes the plural (and vice versa) unless specifically stated otherwise. In addition, where the use of the term "about" is before a quantitative value, the present teachings also include the specific quantitative value itself, unless specifically stated otherwise. As used herein, the term "about" refers to a ±10% variation from the nominal value unless otherwise indicated or inferred.

It should be understood that the order of steps or order for performing certain actions is immaterial so long as the present teachings remain operable. Moreover, two or more steps or actions may be conducted simultaneously.

As used herein, a "polymer" or "polymeric compound" refers to a molecule (e.g., a macromolecule) including a plurality of repeating units connected by covalent chemical bonds. A polymer can be represented by the general formula:

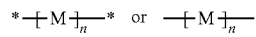

wherein M is the repeating unit or monomer, and n is the number of M's in the polymer. The polymer or polymeric compound can have only one type of repeating unit as well as two or more types of different repeating units. In the former case, the polymer can be referred to as a homopolymer. In the latter case, the term "copolymer" or "copolymeric compound" can be used instead, especially when the polymer includes chemically significantly different repeating units. The polymer or polymeric compound can be linear or branched. Branched polymers can include dendritic polymers, such as dendronized polymers, hyperbranched polymers, brush polymers (also called bottle-brushes), and the like. Unless specified otherwise, the assembly of the repeating units in the copolymer can be head-to-tail, head-to-head, or tail-to-tail. In addition, unless specified otherwise, the copolymer can be a random copolymer, an alternating copolymer, or a block copolymer. In some embodiments, formulae similar to the one below can be used to represent a copolymer, and such formulae should be interpreted to embrace a copolymer having any repeating pattern consisting of $x^0$ % of $M^1$, $y^0$ % of $M^2$, and $z^0$ % of $M^3$, where $M^1$, $M^2$, and $M^3$ are different repeating units:

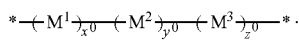

That is, the order and orientation and $M^1$, $M^2$, and $M^3$ are not intended to be specific, and the formula is intended to encompass alternating, random, and block copolymers of $M^1$, $M^2$, and $M^3$.

As used herein, a "pendant group" or "side group" is part of a repeating unit of a polymer and refers to a moiety that is attached covalently to the backbone of the polymer.

As used herein, a "photopolymer" refers to a polymer that can be cured, for example, crosslinked by exposure to light, often using light in the ultraviolet region of the spectrum, or other types of radiation.

As used herein, "solution-processable" refers to polymers, materials, or compositions that can be used in various solution-phase processes including spin-coating, printing (e.g., inkjet printing, screen printing, pad printing, offset printing, gravure printing, flexographic printing, lithographic printing, mass-printing and the like), spray coating, electrospray coating, drop casting, dip coating, and blade coating. "Solution-processable" also include dispersions of polymers, materials, or compositions as long as they can be processed by the processes mentioned above.

As used herein, "halo" or "halogen" refers to fluoro, chloro, bromo, and iodo.

As used herein, "oxo" refers to a double-bonded oxygen (i.e., $=O$).

As used herein, "alkyl" refers to a straight-chain or branched saturated hydrocarbon group. Examples of alkyl groups include methyl (Me), ethyl (Et), propyl (e.g., n-propyl and iso-propyl), butyl (e.g., n-butyl, iso-butyl, sec-butyl, tert-butyl), pentyl groups (e.g., n-pentyl, iso-pentyl, neopentyl), hexyl groups, and the like. In various embodiments, an alkyl group can have 1 to 40 carbon atoms (i.e., $C_{1-40}$ alkyl group), for example, 1-20 carbon atoms (i.e., $C_{1-20}$ alkyl group). In some embodiments, an alkyl group can have 1 to 6 carbon atoms, and can be referred to as a "lower alkyl group." Examples of lower alkyl groups include methyl, ethyl, propyl (e.g., n-propyl and iso-propyl), butyl (e.g., n-butyl, iso-butyl, sec-butyl, tert-butyl), and hexyl groups. In some embodiments, alkyl groups can be substituted as described herein. An alkyl group is generally not substituted with another alkyl group, an alkenyl group, or an alkynyl group.

As used herein, "haloalkyl" refers to an alkyl group having one or more halogen substituents. At various embodiments, a haloalkyl group can have 1 to 40 carbon atoms (i.e., $C_{1-40}$ haloalkyl group), for example, 1 to 20 carbon atoms (i.e., $C_{1-20}$ haloalkyl group). Examples of haloalkyl groups include $CF_3$, $C_2F_5$, $CHF_2$, $CH_2F$, $CCl_3$, $CHCl_2$, $CH_2Cl_5$, and the like. Perhaloalkyl groups, i.e., alkyl groups where all of the hydrogen atoms are replaced with halogen atoms (e.g., $CF_3$ and $C_2F_5$), are included within the definition of "haloalkyl." For example, a $C_{1-40}$ haloalkyl group can have the formula $-C_zH_{2z+1-t}X^0{}_t$, where $X^0$, at each occurrence, is F, Cl, Br or I, z is an integer in the range of 1 to 40, and t is an integer in the range of 1 to 81, provided that t is less than or equal to $2z+1$. Haloalkyl groups that are not perhaloalkyl groups can be substituted as described herein.

As used herein, "alkoxy" refers to —O-alkyl group. Examples of alkoxy groups include, but are not limited to, methoxy, ethoxy, propoxy (e.g., n-propoxy and isopropoxy), t-butoxy, pentoxyl, hexoxy groups, and the like. The alkyl group in the —O-alkyl group can be substituted as described herein.

As used herein, "alkylthio" refers to an —S-alkyl group. Examples of alkylthio groups include, but are not limited to, methylthio, ethylthio, propylthio (e.g., n-propylthio and iso-propylthio), t-butylthio, pentylthio, hexylthio groups, and the like. The alkyl group in the —S-alkyl group can be substituted as described herein.

As used herein, "arylalkyl" refers to an -alkyl-aryl group, where the arylalkyl group is covalently linked to the defined chemical structure via the alkyl group. An arylalkyl group is within the definition of a —Y—$C_{6-14}$ aryl group, where Y is as defined herein. An example of an arylalkyl group is a benzyl group (—$CH_2$—$C_6H_5$). An arylalkyl group can be optionally substituted, i.e., the aryl group and/or the alkyl group, can be substituted as disclosed herein.

As used herein, "alkenyl" refers to a straight-chain or branched alkyl group having one or more carbon-carbon double bonds. Examples of alkenyl groups include ethenyl, propenyl, butenyl, pentenyl, hexenyl, butadienyl, pentadienyl, hexadienyl groups, and the like. The one or more carbon-carbon double bonds can be internal (such as in 2-butene) or terminal (such as in 1-butene). In various embodiments, an alkenyl group can have 2 to 40 carbon atoms (i.e., $C_{2-40}$ alkenyl group), for example, 2 to 20 carbon atoms (i.e., $C_{2-20}$ alkenyl group). In some embodiments, alkenyl groups can be substituted as described herein. An alkenyl group is generally not substituted with another alkenyl group, an alkyl group, or an alkynyl group.

As used herein, "alkynyl" refers to a straight-chain or branched alkyl group having one or more triple carbon-carbon bonds. Examples of alkynyl groups include ethynyl, propynyl, butynyl, pentynyl, hexynyl, and the like. The one or more triple carbon-carbon bonds can be internal (such as in 2-butyne) or terminal (such as in 1-butyne). In various embodiments, an alkynyl group can have 2 to 40 carbon atoms (i.e., $C_{2-40}$ alkynyl group), for example, 2 to 20 carbon atoms (i.e., $C_{2-20}$ alkynyl group). In some embodiments, alkynyl groups can be substituted as described herein. An alkynyl group is generally not substituted with another alkynyl group, an alkyl group, or an alkenyl group.

As used herein, "cycloalkyl" refers to a non-aromatic carbocyclic group including cyclized alkyl, alkenyl, and alkynyl groups. In various embodiments, a cycloalkyl group can have 3 to 20 carbon atoms, for example, 3 to 14 carbon atoms (i.e., $C_{3-14}$ cycloalkyl group). A cycloalkyl group can be monocyclic (e.g., cyclohexyl) or polycyclic (e.g., containing fused, bridged, and/or spiro ring systems), where the carbon atoms are located inside or outside of the ring system. Any suitable ring position of the cycloalkyl group can be covalently linked to the defined chemical structure. Examples of cycloalkyl groups include cyclopropyl, cyclobutyl, cyclopentyl, cyclohexyl, cycloheptyl, cyclopentenyl, cyclohexenyl, cyclohexadienyl, cycloheptatrienyl, norbornyl, norpinyl, norcaryl, adamantyl, and spiro[4.5]decanyl groups, as well as their homologs, isomers, and the like. In some embodiments, cycloalkyl groups can be substituted as described herein.

As used herein, "heteroatom" refers to an atom of any element other than carbon or hydrogen and includes, for example, nitrogen, oxygen, silicon, sulfur, phosphorus, and selenium.

As used herein, "cycloheteroalkyl" refers to a non-aromatic cycloalkyl group that contains at least one ring heteroatom selected from O, S, Se, N, P, and Si (e.g., O, S, and N), and optionally contains one or more double or triple bonds. A cycloheteroalkyl group can have 3 to 20 ring atoms, for example, 3 to 14 ring atoms (i.e., 3-14 membered cycloheteroalkyl group). One or more N, P, S, or Se atoms (e.g., N or S) in a cycloheteroalkyl ring may be oxidized (e.g., morpholine N-oxide, thiomorpholine S-oxide, thiomorpholine S,S-dioxide). In some embodiments, nitrogen or phosphorus atoms of cycloheteroalkyl groups can bear a substituent, for example, a hydrogen atom, an alkyl group, or other substituents as described herein. Cycloheteroalkyl groups can also contain one or more oxo groups, such as oxopiperidyl, oxooxazolidyl, dioxo-(1H,3H)-pyrimidyl, oxo-2(1H)-pyridyl, and the like. Examples of cycloheteroalkyl groups include, among others, morpholinyl, thiomorpholinyl, pyranyl, imidazolidinyl, imidazolinyl, oxazolidinyl, pyrazolidinyl, pyrazolinyl, pyrrolidinyl, pyrrolinyl, tetrahydrofuranyl, tetrahydrothiophenyl, piperidinyl, piperazinyl, and the like. In some embodiments, cycloheteroalkyl groups can be substituted as described herein.

As used herein, "aryl" refers to an aromatic monocyclic hydrocarbon ring system or a polycyclic ring system in which two or more aromatic hydrocarbon rings are fused (i.e., having a bond in common with) together or at least one aromatic monocyclic hydrocarbon ring is fused to one or more cycloalkyl and/or cycloheteroalkyl rings. An aryl group can have 6 to 20 carbon atoms in its ring system (e.g., $C_{6-14}$ aryl group), which can include multiple fused rings. In some embodiments, a polycyclic aryl group can have from 8 to 20 carbon atoms. Any suitable ring position of the aryl group can be covalently linked to the defined chemical structure. Examples of aryl groups having only aromatic carbocyclic ring(s) include phenyl, 1-naphthyl (bicyclic), 2-naphthyl (bicyclic), anthracenyl (tricyclic), phenanthrenyl (tricyclic), and like groups. Examples of polycyclic ring systems in which at least one aromatic carbocyclic ring is fused to one or more cycloalkyl and/or cycloheteroalkyl rings include, among others, benzo derivatives of cyclopentane (i.e., an indanyl group, which is a 5,6-bicyclic cycloalkyl/aromatic ring system), cyclohexane (i.e., a tetrahydronaphthyl group, which is a 6,6-bicyclic cycloalkyl/aromatic ring system), imidazoline (i.e., a benzimidazolinyl group, which is a 5,6-bicyclic cycloheteroalkyl/aromatic ring system), and pyran (i.e., a chromenyl group, which is a 6,6-bicyclic cycloheteroalkyl/aromatic ring system). Other examples of aryl groups include benzodioxanyl, benzodioxolyl, chromanyl, indolinyl groups, and the like. In some embodiments, aryl groups can be substituted as described herein. In some embodiments, an aryl group can have one or more halogen substituents, and can be referred to as a "haloaryl" group. Perhaloaryl groups, i.e., aryl groups where all of the hydrogen atoms are replaced with halogen atoms (e.g., $-C_6F_5$), are included within the definition of "haloaryl." In certain embodiments, an aryl group is substituted with another aryl group and can be referred to as a biaryl group. Each of the aryl groups in the biaryl group can be substituted as disclosed herein.

As used herein, "heteroaryl" refers to an aromatic monocyclic ring system containing at least one ring heteroatom selected from oxygen (O), nitrogen (N), sulfur (S), silicon (Si), and selenium (Se) or a polycyclic ring system where at least one of the rings present in the ring system is aromatic and contains at least one ring heteroatom. Polycyclic heteroaryl groups include two or more heteroaryl rings fused together and monocyclic heteroaryl rings fused to one or more aromatic carbocyclic rings, non-aromatic carbocyclic rings, and/or non-aromatic cycloheteroalkyl rings. A heteroaryl group, as a whole, can have, for example, 5 to 20 ring atoms and contain 1-5 ring heteroatoms (i.e., 5-20 membered heteroaryl group). The heteroaryl group can be attached to the defined chemical structure at any heteroatom or carbon atom that results in a stable structure. Generally, heteroaryl rings do not contain O—O, S—S, or S—O bonds. However, one or more N or S atoms in a heteroaryl group can be oxidized (e.g., pyridine N-oxide, thiophene S-oxide, thiophene S,S-dioxide). Examples of heteroaryl groups include, for example, the 5- or 6-membered monocyclic and 5-6 bicyclic ring systems shown below:

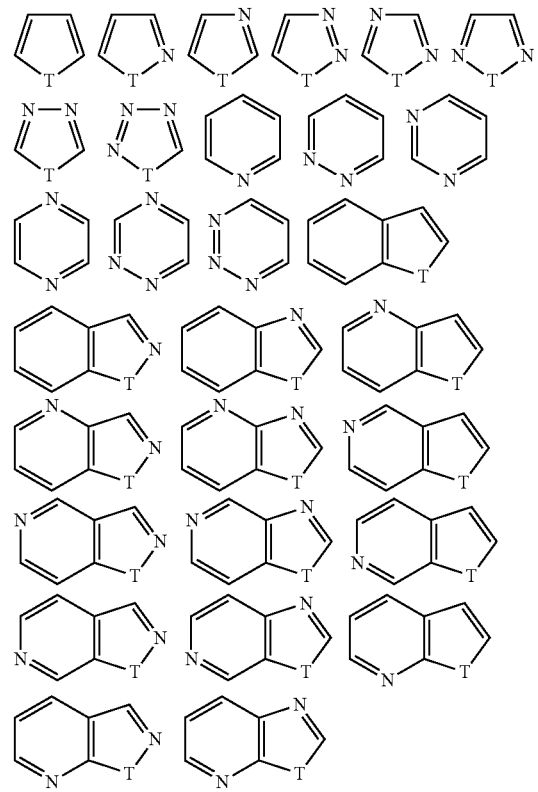

where T is O, S, NH, N-alkyl, N-aryl, N-(arylalkyl) (e.g., N-benzyl), $SiH_2$, SiH(alkyl), $Si(alkyl)_2$, SiH(arylalkyl), $Si(arylalkyl)_2$, or Si(alkyl)(arylalkyl). Examples of such heteroaryl rings include pyrrolyl, furyl, thienyl, pyridyl, pyrimidyl, pyridazinyl, pyrazinyl, triazolyl, tetrazolyl, pyrazolyl, imidazolyl, isothiazolyl, thiazolyl, thiadiazolyl, isoxazolyl, oxazolyl, oxadiazolyl, indolyl, isoindolyl, benzofuryl, benzothienyl, quinolyl, 2-methylquinolyl, isoquinolyl, quinoxalyl, quinazolyl, benzotriazolyl, benzimidazolyl, benzothiazolyl, benzisothiazolyl, benzisoxazolyl, benzoxadiazolyl, benzoxazolyl, cinnolinyl, 1H-indazolyl, 2H-indazolyl, indolizinyl, isobenzofuyl, naphthyridinyl, phthalazinyl, pteridinyl, purinyl, oxazolopyridinyl, thiazolopyridinyl, imidazopyridinyl, furopyridinyl, thienopyridinyl, pyridopyrimidinyl, pyridopyrazinyl, pyridopyridazinyl, thienothiazolyl, thienoxazolyl, thienoimidazolyl groups, and the like. Further examples of heteroaryl groups include 4,5,6,7-tetrahydroindolyl, tetrahydroquinolinyl, benzothienopyridinyl, benzofuropyridinyl groups, and the like. In some embodiments, heteroaryl groups can be substituted as described herein.

Polymers of the present teachings can include a "divalent group" defined herein as a linking group capable of forming a covalent bond with two other moieties. For example, polymers of the present teachings can include a divalent $C_{1-20}$ alkyl group (e.g., a methylene group), a divalent $C_{2-20}$ alkenyl group (e.g., a vinylyl group), a divalent $C_{2-20}$ alkynyl group (e.g., an ethynylyl group), a divalent $C_{6-14}$ aryl group (e.g., a phenylyl group); a divalent 3-14 membered cycloheteroalkyl group (e.g., a pyrrolidylyl), and/or a divalent 5-14 membered heteroaryl group (e.g., a thienylyl group).

At various places in the present specification, substituents on a chemical group are disclosed in groups or in ranges. It is specifically intended that the description include each and every individual subcombination of the members of such groups and ranges. For example, the term "$C_{1-6}$ alkyl" is specifically intended to individually disclose $C_1$, $C_2$, $C_3$, $C_4$, $C_5$, $C_6$, $C_1$-$C_6$, $C_1$-$C_5$, $C_1$-$C_4$, $C_1$-$C_3$, $C_1$-$C_2$, $C_2$-$C_6$, $C_2$-$C_5$, $C_2$-$C_4$, $C_2$-$C_3$, $C_3$-$C_6$, $C_3$-$C_5$, $C_3$-$C_4$, $C_4$-$C_6$, $C_4$-$C_5$, and $C_5$-$C_6$ alkyl. By way of other examples, an integer in the range of 0 to 40 is specifically intended to individually disclose 0, 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, and 40, and an integer in the range of 1 to 20 is specifically intended to individually disclose 1, 2, 3, 4, 5, 6, 7, 8, 9, 10, 11, 12, 13, 14, 15, 16, 17, 18, 19, and 20. Additional examples include that the phrase "optionally substituted with 1-5 substituents" is specifically intended to individually disclose a chemical group that can include 0, 1, 2, 3, 4, 5, 0-5, 0-4, 0-3, 0-2, 0-1, 1-5, 1-4, 1-3, 1-2, 2-5, 2-4, 2-3, 3-5, 3-4, and 4-5 substituents.

As used herein, a "p-type semiconductor material" or a "p-type semiconductor" refers to a semiconductor material having holes as the majority current carriers. In some embodiments, when a p-type semiconductor material is deposited on a substrate, it can provide a hole mobility in excess of about $10^{-5}$ cm$^2$/Vs. In the case of field-effect devices, a p-type semiconductor can also exhibit a current on/off ratio of greater than about 10.

As used herein, an "n-type semiconductor material" or an "n-type semiconductor" refers to a semiconductor material having electrons as the majority current carriers. In some embodiments, when an n-type semiconductor material is deposited on a substrate, it can provide an electron mobility in excess of about $10^{-5}$ cm$^2$/Vs. In the case of field-effect devices, an n-type semiconductor can also exhibit a current on/off ratio of greater than about 10.

It will be understand that when two components are described as being coupled to each other, the two components can be directly in contact (e.g., directly coupled to each other), or the two components can be coupled to each other via one or more intervening components or layers.

Throughout the specification, structures may or may not be presented with chemical names. Where any question arises as to nomenclature, the structure prevails.

In one aspect, the present teachings provide polymers that include one or more crosslinkable functionalities. The crosslinking group can form or be a portion of a pendant group covalently attached to the backbone of the polymers. More specifically, the present teachings provide a polymer having one or more repeating units that include a coumarin-containing pendant group. The coumarin moiety can be introduced into the polymer before or after polymerization, and can be optionally substituted and represented by the formula:

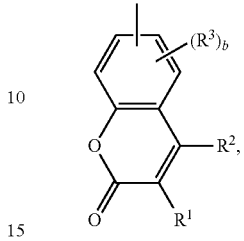

where $R^1$ and $R^2$ independently can be H or a non-hydrogen substituent, each $R^3$ independently can be a non-hydrogen substituent, and b is 0, 1, 2, or 3.

For example, $R^1$ and $R^2$ independently can be selected from a) H, b) halogen, c) —CN, d) —NO$_2$, e) —OR$^4$, f) —N(R$^4$)$_2$, g) —CHO, h) —C(O)R$^4$, i) —C(O)OR$^4$, j) —C(O)N(R$^4$)$_2$, k) a $C_{1-20}$ alkyl group, l) a $C_{2-20}$ alkenyl group, m) a $C_{2-20}$ alkynyl group, n) a $C_{1-20}$ alkoxy group, o) a $C_{1-20}$ alkylthio group, p) a $C_{1-20}$ haloalkyl group, q) a —Y—$C_{3-14}$ cycloalkyl group, r) a —Y—$C_{6-14}$ aryl group, s) a —Y-3-14 membered cycloheteroalkyl group, and t) a —Y-5-14 membered heteroaryl group, where each of the $C_{1-20}$ alkyl group, the $C_{2-20}$ alkenyl group, the $C_{2-20}$ alkynyl group, the $C_{3-14}$ cycloalkyl group, the $C_{6-14}$ aryl group, the 3-14 membered cycloheteroalkyl group, and the 5-14 membered heteroaryl group optionally can be substituted with 1-5 R$^5$ groups; and $R^3$, at each occurrence, independently can be selected from a) halogen, b) —CN, c) —NO$_2$, d) —OR$^4$, e) —N(R$^4$)$_2$, f) —CHO, g) —C(O)R$^4$, h) —C(O)OR$^4$, i) —C(O)N(R$^4$)$_2$, j) a $C_{1-20}$ alkyl group, k) a $C_{2-20}$ alkenyl group, l) a $C_{2-20}$ alkynyl group, m) a $C_{1-20}$ alkoxy group, n) a $C_{1-20}$ alkylthio group, o) a $C_{1-20}$ haloalkyl group, p) a —Y—$C_{3-14}$ cycloalkyl group, q) a —Y—$C_{6-24}$ aryl group, r) a —Y-3-14 membered cycloheteroalkyl group, and s) a —Y-5-14 membered heteroaryl group, wherein each of the $C_{1-20}$ alkyl group, the $C_{2-20}$ alkenyl group, the $C_{2-20}$ alkynyl group, the $C_{3-14}$ cycloalkyl group, the $C_{6-14}$ aryl group, the 3-14 membered cycloheteroalkyl group, and the 5-14 membered heteroaryl group optionally can be substituted with 1-5 R$^5$ groups, wherein:

$R^4$, at each occurrence, independently can be selected from a) H, b) a $C_{1-20}$ alkyl group, c) a $C_{2-20}$ alkenyl group, d) a $C_{2-20}$ alkynyl group, e) a $C_{1-20}$ alkoxy group, f) a $C_{1-20}$ alkylthio group, g) a $C_{1-20}$ haloalkyl group, h) a —Y—$C_{3-14}$ cycloalkyl group, i) a —Y—$C_{6-14}$ aryl group, j) a —Y-3-14 membered cycloheteroalkyl group, and k) a —Y-5-14 membered heteroaryl group, wherein each of the $C_{1-20}$ alkyl group, the $C_{2-20}$ alkenyl group, the $C_{2-20}$ alkynyl group, the $C_{3-14}$ cycloalkyl group, the $C_{6-14}$ aryl group, the 3-14 membered cycloheteroalkyl group, and the 5-14 membered heteroaryl group optionally can be substituted with 1-5 R$^5$ groups;

$R^5$, at each occurrence, independently can be selected from a) halogen, b) —CN, c) —NO$_2$, d) —OH, e) —O—$C_{6-14}$ aryl, f) —NH$_2$, g) —NH—$C_{1-10}$ alkyl, h) —N($C_{1-10}$ alkyl)$_2$, i) —NH—$C_{6-14}$ aryl, j) —N($C_{1-10}$ alkyl)-$C_{6-14}$ aryl, k) —N($C_{6-14}$ aryl)$_2$, l) —CHO, m) —C(O)—$C_{1-10}$ alkyl, n) —C(O)—$C_{6-14}$ aryl, o) —C(O)OH, p) —C(O)—O$C_{1-10}$ alkyl, q) —C(O)—O$C_{6-14}$ aryl, r) —C(O)NH$_2$, s) —C(O)NH—$C_{1-10}$ alkyl, t) —C(O)N($C_{1-10}$ alkyl)$_2$, u) —C(O)NH—$C_{6-14}$ aryl, v) —C(O)N ($C_{1-10}$ alkyl)-$C_{6-14}$ aryl, w) —C(O)N($C_{6-14}$ aryl)$_2$, x) a $C_{1-10}$ alkyl group, y) a $C_{2-10}$ alkenyl group, z) a $C_{2-10}$ alkynyl group, aa) a $C_{1-10}$ alkoxy group, ab) a $C_{1-10}$ alkylthio group, ac) a $C_{1-10}$ haloalkyl group, ad) a —Y—$C_{3-14}$ cycloalkyl group, ae) a —Y—$C_{6-14}$ aryl group, af) a —Y-3-14 membered cycloheteroalkyl group, and ag) a —Y-5-14 membered heteroaryl group, wherein each of the $C_{1-10}$ alkyl group, the $C_{2-10}$ alkenyl group, the $C_{2-10}$ alkynyl group, the $C_{3-14}$ cycloalkyl group, the $C_{6-14}$ aryl group, the 3-14 membered cycloheteroalkyl group, and the 5-14 membered heteroaryl group optionally can be substituted with 1-5 substituents independently selected from a halogen, CN, a $C_{1-6}$ alkyl group, a $C_{1-6}$ haloalkyl group, a $C_{1-6}$ alkoxy group, a —O—$C_{1-6}$ haloalkyl group, a —C(O)—$C_{1-6}$ alkyl group, a —C(O)—$C_{1-6}$ haloalkyl group, and a —C(O)—O—$C_{1-6}$ alkyl group; and Y, at each occurrence, can be a divalent $C_{1-6}$ alkyl group, a divalent $C_{2-6}$ alkenyl group, a divalent $C_{2-6}$ alkynyl group, or a covalent bond.

In some embodiments, the coumarin moiety can be unsubstituted, in which case, $R^1$ and $R^2$ are H, and b is 0. In other embodiments, the coumarin moiety can be substituted with one or more functional groups. In these embodiments, at least one of $R^1$ and $R^2$ can be a non-hydrogen substituent and/or at least one $R^3$ group is present.

In some embodiments, the crosslinkable coumarin moiety can be covalently linked to the polymeric backbone directly or via a linker (or spacer) group at a specific carbon atom:

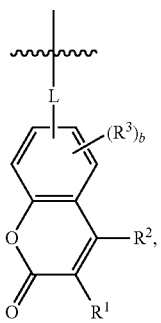

where L is a covalent bond or a linker, and $R^1$, $R^2$, $R^3$, and b are as defined herein. For example, the crosslinkable coumarin moiety can be covalently linked to the polymeric backbone at C6 or C7 as shown below, respectively:

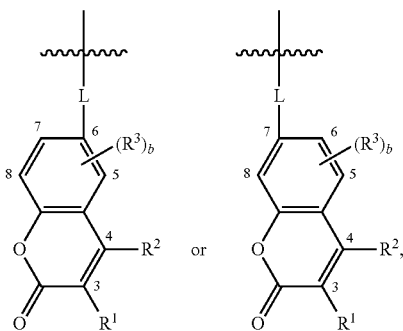

wherein $R^1$, $R^2$, $R^3$, L and b are as defined herein. In certain embodiments, the crosslinkable coumarin moiety can be covalently linked to the polymeric backbone at C6.

In various embodiments, polymers having C6-linked coumarin moieties can be crosslinked at a faster rate than their counterparts having C7-linked coumarin moieties. That is, in using the present polymers to prepare a dielectric material (e.g., film), it often is desirable to ensure that the dielectric material achieves a sufficient degree of crosslinking, such that subsequent device processing conditions will not jeopardize the properties of the dielectric material. A dielectric material can be considered "sufficiently crosslinked" if, after the crosslinking step, the thickness of the dielectric film does not decrease by more than about 10% when treated with the solvent used to prepare the dielectric material ("mother solvent"). In addition or alternatively, a dielectric material can be considered "sufficiently crosslinked" if, after the crosslinking step, the leakage current does not increase by more than about 5 times at 2 MV/cm when the crosslinked dielectric film has been in contact with the mother solvent. In certain embodiments, when comparing polymers having C6-linked coumarin moieties with their counterparts having C7-linked coumarin moieties, the polymers having C6-linked coumarin moieties can achieve a sufficient degree of crosslinking at least 2 times (e.g., at least 3 times) faster than their counterparts having C7-linked coumarin moieties.

In most embodiments, the present polymers can include a coumarin-containing repeating unit where the coumarin moiety is the terminal moiety of the pendant group. In these embodiments, any substitutent(s) on the coumarin moiety generally are small functional groups such as F, Cl, OH, or other non-cyclic organic groups such as R, OR, C(O)R, OC(O)R, OC(O)OR, where R is a $C_{1-6}$ alkyl group.

However, in certain embodiments, the present polymers can include a coumarin-containing repeating unit where the coumarin moiety is not the terminal moiety of the pendant group. In these embodiments, depending on how the coumarin moiety is linked to the polymeric backbone, $R^1$, $R^2$, or $R^3$ can represent the terminal moiety of the pendant group. For example, $R^1$, $R^2$, or $R^3$ can be a larger functional group (e.g., including 6 carbon atoms or more), which optionally can include one or more crosslinkable groups (e.g., cinnamoyl groups, azobenzenes, and the like).

The present polymers can be homopolymers or copolymers. In most embodiments, the present polymers are vinyl polymers polymerized from one or more non-cyclic vinyl monomers, i.e., a non-cyclic vinyl monomer does not contain a cyclic group that forms part of the backbone of the resulting polymer, however, a non-cyclic vinyl monomer can contain a cyclic group as a pendant group. Examples of non-cyclic vinyl monomers include ethene, propene, butadiene, styrene, vinyl phenol (or hydroxyl styrene), vinyl chloride, vinyl acetate, acrylate (e.g., methacrylate, methyl methacrylate, acrylic acid, methacrylic acid, acrylamide), acrylonitrile, and derivatives thereof. Vinyl polymers have a carbon-only backbone and all the repeating units can be represented by the formula —[$CR^0_2$—$CR^{0'}_2$]$_n$—, where each $R^0$ and $R^{0'}$ independently is H or a pendant group.

In some embodiments, the present polymers can be derived from one or more vinyl phenol monomers or derivatives thereof. In embodiments where the present polymers are derived from a vinyl phenol derivative, the derivatization can occur before or after polymerization. As a result of such derivatization, the hydrogen atom of the hydroxyl group of the phenol moiety is replaced with a different functional group. For example, the present polymers can include vinyl phenol polymers (e.g., poly-4-vinylphenol, PVP), where at least some of the phenol pendant groups are derivatived to include the coumarin moiety described herein.

In certain embodiments, the present polymers can include additional repeating unit(s) that are not vinyl phenol or vinyl phenol derivatives. In particular embodiments, the present polymers can include copolymers of vinyl phenol and/or vinyl phenol derivatives, and at least one other vinyl monomer. For example, the other vinyl monomer can be an acrylic monomer such as methyl methacrylate, methacrylate, acrylic acid, methacrylic acid, acrylamide, and derivatives thereof. In such embodiments, the coumarin moiety can be attached to the vinyl phenol repeating unit or the acrylate repeating unit. To illustrate further, the present polymers can include copolymers of vinyl phenol and/or vinyl phenol derivatives and methyl methacrylate and/or methacrylate derivatives, where at least some of the vinyl phenol repeating units are derivatized with a coumarin moiety. However, the coumarin moiety also can be introduced into the non-vinyl phenol units instead of or in addition to the vinyl phenol units.

In some embodiments, for example those having C6-linked coumarin moieties, the present polymers can include at least one repeating unit having one or more heteroatoms (e.g., O, N, Si) and/or one or more cyclic (carbocyclic or heterocyclic) moieties, which provides one or more heteroatoms and/or cyclic moieties within the polymeric backbone. Examples of such embodiments include polyethers (e.g. polyethylene glycol), polyethylene amine, polyesters, polyamides, polyimides (e.g., polymaleimides), siloxane polymers, and copolymers thereof, including copolymers with one or more non-cyclic vinyl monomers described herein, as well as other polymers suitable for use as dielectric materials.

Certain embodiments of the present polymers can be represented by the formula:

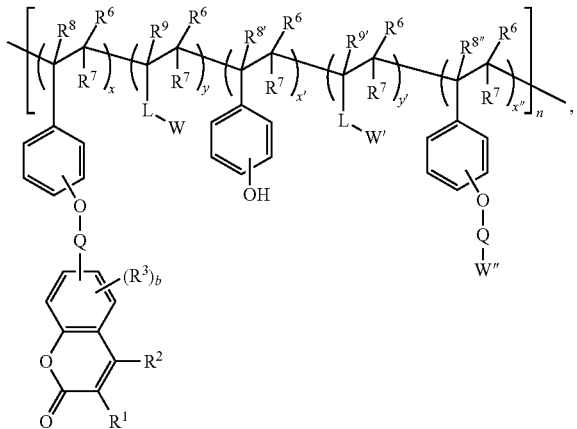

wherein:
L and Q, at each occurrence, independently can be a linker group or a covalent bond;
W, W', and W" independently can be selected from a) H, b) a halogen, c) a $C_{1-20}$ alkyl group, d) a $C_{2-20}$ alkenyl group, e) a $C_{1-20}$ haloalkyl group, f) a $C_{3-14}$ cycloalkyl group, g) a $C_{6-14}$ aryl group, h) a 3-14 membered cycloalkyl group, and i) a 5-14 membered heteroaryl group, wherein each of the $C_{1-20}$ alkyl group, the $C_{2-20}$ alkenyl group, the $C_{1-20}$ haloalkyl group, the $C_{3-14}$ cycloalkyl group, the $C_{6-14}$ aryl group, the 3-14 membered cycloheteroalkyl group, and the 5-14 membered heteroaryl group optionally can be substituted with 1 to 5 substituents independently selected from a halogen, —CN, an oxo group, a $C_{1-6}$ alkyl group, a $C_{1-6}$ haloalkyl group, a $C_{1-6}$ alkoxy group, a —C(O)—$C_{1-6}$ alkyl group, a —C(O)—$C_{1-6}$ haloalkyl group, and a —C(O)—O—$C_{1-6}$ alkyl group;

$R^6$ and $R^7$, at each occurrence, independently can be selected from a) H, b) a halogen, c) a $C_{1-10}$ alkyl group, and d) a $C_{6-14}$ aryl group, wherein each of the $C_{1-10}$ alkyl group and the $C_{6-14}$ aryl group optionally can be substituted with 1-5 $R^5$ groups;
$R^8$, $R^{8'}$, $R^{8''}$, $R^9$, and $R^{9'}$ independently are selected from a) H, b) a halogen, c) a $C_{1-10}$ alkyl group, and d) a $C_{6-14}$ aryl group, wherein each of the $C_{1-10}$ alkyl group and the $C_{6-14}$ aryl group optionally is substituted with 1-5 $R^5$ groups;
x, x', x", y, and y' independently are a real number, wherein $0<x\leq1$, $0\leq x'<1$, $0\leq x''<1$, $0\leq y<1$, $0\leq y'<1$, and $x+x'+x''+y+y'=1$; and
$R^1$, $R^2$, $R^3$, and b and n are as defined herein.

In other words, the polymers represented by the formula provided above generally include x amount of a first unit including a pendant group that includes a coumarin moiety (monomer A), and optionally one or more of x' amount of a second unit comprising vinyl phenol (monomer B), x" amount of a third unit comprising a vinyl phenol derivative (monomer C), y amount of a fourth unit comprising a pendant group L-W (monomer D), and y' amount of a fifth unit comprising a pendant group L-W' (monomer E), wherein x, x', x", y, y', L, W, and W' are as defined herein.

In certain embodiments, the present polymers can be a poly(vinyl phenol) that includes the crosslinkable coumarin moiety in at least some of its phenol pendant groups (i.e., x", y, y'=0; x+x'=1). These embodiments can be represented by the formula:

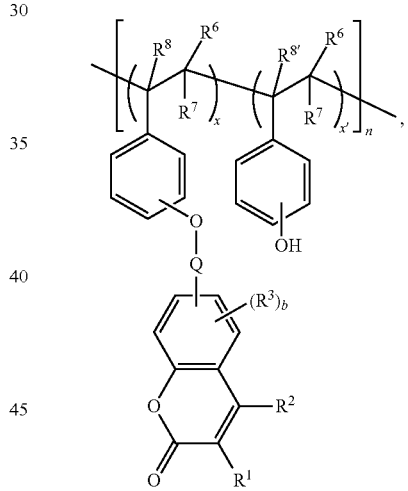

wherein x and x' independently are a real number and x+x'=1; and $R^1$, $R^2$, $R^3$, $R^6$, $R^7$, $R^8$, $R^{8'}$, Q, b and n are as defined herein. In particular embodiments, substantially all of the phenol pendant groups can be derivatized with the crosslinkable coumarin moiety (e.g., x'≤0.1). In other embodiments, a percentage of the phenol pendant groups can be derivatized with the crosslinkable coumarin moiety (e.g., 0.1≤x≤0.8), while the remaining phenol pendant groups can remain underivatized. As used herein, a "derivative" of a compound or a moiety should be understood as a modified form of the compound or moiety, wherein the modified form has replaced at least one atom in the compound or moiety with another atom or group of atoms. The derivatization can take place before or after polymerization or copolymerization.

In certain embodiments, the phenol pendant groups can be derivatized to provide a third unit (monomer C) that is different from the first unit containing the coumarin moiety (monomer A). For example, the present polymers can be a copolymer of monomers A and C, and optionally monomer B (i.e., y and y' can be 0). Accordingly, the present polymers can be represented by the formula:

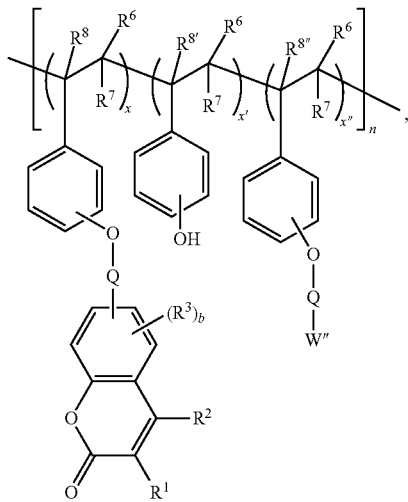

wherein x, x', and x" independently are a real number; x+x'+x"=1; x, x">0; 0≤x'<1; and $R^1$, $R^2$, $R^3$, $R^6$, $R^7$, $R^8$, $R^{8'}$, $R^{8''}$, Q, W", b and n are as defined herein. For example, —O-Q-W" can be a derivative of the hydroxyl group of the phenol group. In some embodiments, Q and/or W" can provide a second (i.e., non-coumarin) crosslinkable moiety. In some embodiments, Q and/or W" can include a functional group that can confer some advantageous property to the polymer as a whole. For example, the functional group can help improve solubility or more generally, processability of the polymer, and/or stability of the polymer (e.g., by increasing hydrophobicity).

In some embodiments, the present teachings can provide a vinyl phenol copolymer including a repeating unit that includes a pendant group L-W. Accordingly, the present polymers can be represented by the formula:

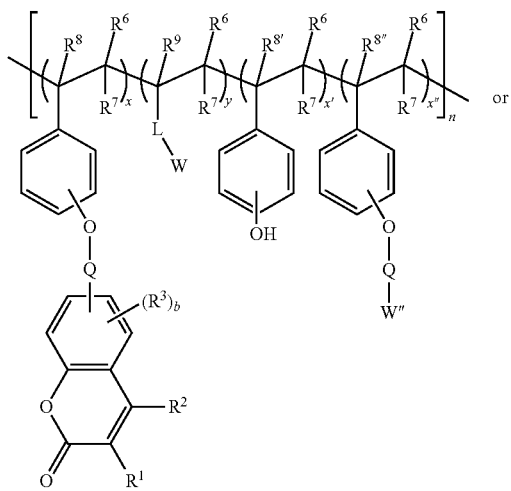

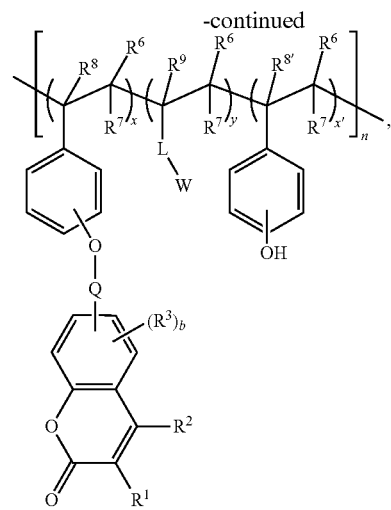

wherein x, x', x", and y independently are a real number; x+x'+x"+y=1; x>0; y>0; 0≤x'<1; 0≤x"<1; and $R^1$, $R^2$, $R^3$, $R^6$, $R^7$, $R^8$, $R^{8'}$, $R^{8''}$, $R^9$, Q, W, W", b and n are as defined herein. In certain embodiments, x can be larger than about 0.25; and x+x'+x" can be larger than about 0.5. For example, x can be larger than about 0.6; y can be larger than about 0.2; 0≤x'<0.10; and 0≤x"<0.10.

In some embodiments, the present teachings can provide a vinyl phenol copolymer including a repeating unit that includes a pendant group L-W and a repeating unit that includes a pendant group L-W', where L-W and L-W' are different. These embodiments can be represented by the formula:

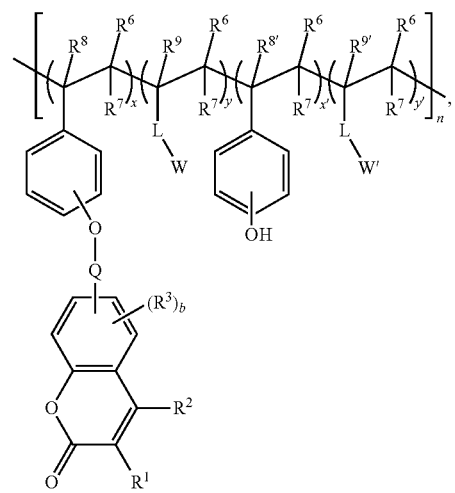

wherein x, x', y and y' independently are a real number; x+x'+y+y'=1; x>0; y>0; y'>0; 0≤x'<1; and $R^1$, $R^2$, $R^3$, $R^6$, $R^7$, $R^8$, $R^{8'}$, $R^9$, $R^{9'}$, Q, W, W', b and n are as defined herein. In certain embodiments, x can be larger than about 0.25; and x+x' can be larger than about 0.5. For example, x can be larger than about 0.6; y' can be larger than about 0.2; 0≤x'<0.10; and 0<y<0.10.

In certain embodiments, the repeating unit

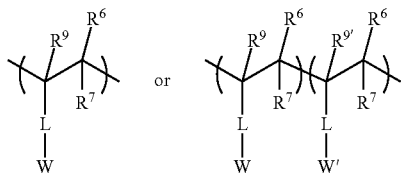

can be selected from —(CH$_2$—CH$_2$)—, —(CHCH$_3$—CH$_2$)—, —(CHCl—CH$_2$)—, —(CHOH—CH$_2$)—, —(CHC$_6$H$_5$—CH$_2$)—, —(CHOC(O)CH$_3$—CH$_2$)—, —(CCH$_3$C(O)OCH$_3$—CH$_2$)—, and combinations thereof. In certain embodiments, the repeating unit above can be methyl methacrylate. In certain embodiments, the repeating unit above can be vinyl acetate-co-vinyl alcohol. In certain embodiments, L-W' can be a derivative of L-W, wherein L and W are as defined herein. For example, W can be OH, and W' can be OCH$_3$.

In various embodiments, L and Q, at each occurrence, independently can be a linker group selected from a divalent C$_{1-20}$ alkyl group, a divalent C$_{2-20}$ alkenyl group or a divalent C$_{2-20}$ alkynyl group, where 1-5 methylene groups (adjacent or non-adjacent) of each of these groups optionally can be replaced with a functionality independently selected from O, S(O)$_k$, C(O), OSiR$^4$$_2$, NR$^4$, N(C(O)R$^4$), C(NR$^4$), and a divalent C$_{6-14}$ aryl group, and each of the C$_{1-20}$ alkyl group, the C$_{2-20}$ alkenyl group, the C$_{2-20}$ alkynyl group, and the C$_{6-14}$ aryl group optionally can be substituted with 1-5 R$^5$ groups, wherein k is 0, 1 or 2; and R$^4$ and R$^5$ are as defined herein.

In some embodiments, L, at each occurrence, independently can be a covalent bond or a linker group of the formula:

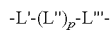

wherein:
L' is linked to the backbone of the polymer and can be selected from —Y'—O—, —Y'—NR$^4$—, —Y'—N(C(O)R$^4$)—, —Y'—S—, —Y'—C(O)—, —Y'—C(O)O—, —Y'—OC(O)—, —Y'—NR$^4$C(O)—, —Y'—C(O)NR$^4$—, —Y'—Si(R$^4$)$_2$—, and a covalent bond;
L", at each occurrence, independently can be selected from —Y"—, —(Y")$_m$—O—Y"—, —Y"—NR$^4$—Y"—, —Y"—C(NR$^4$)—Y"—, —Y"—Si(R$^4$)$_2$—Y"—, —O—Si(R$^4$)$_2$—Y"—, and a covalent bond;
L'" is linked to the coumarin moiety and can be selected from —C(O)—, —C(O)—O—, —O—C(O)—, —C(O)—Y'"—, —C(O)—Y'"—O—, —O—Y'"—C(O)—, —C(O)—NR$^4$—, —NR$^4$—C(O)—, —C(O)—Y'"—NR$^4$—, —NR$^4$—Y'"—C(O)—, —O—S(O)$_k$—, —O—Y'"—S(O)$_k$—, and a covalent bond;
provided that at least one of L', L", and L'" is not a covalent bond;
Y' can be selected from a divalent C$_{1-6}$ alkyl group, a divalent C$_{2-6}$ alkenyl group, a divalent C$_{2-6}$ alkynyl group, a divalent C$_{6-14}$ aryl group, and a covalent bond, wherein each of the C$_{1-6}$ alkyl group, the C$_{2-6}$ alkenyl group, the C$_{2-6}$ alkynyl group, and the C$_{6-14}$ aryl group optionally can be substituted with 1-5 R$^5$ groups;
Y", at each occurrence, can be selected from a divalent C$_{1-6}$ alkyl group, a divalent C$_{2-6}$ alkenyl group, and a divalent C$_{6-14}$ aryl group, wherein each of the C$_{1-6}$ alkyl group, the C$_{2-6}$ alkenyl group, and the C$_{6-14}$ aryl group optionally can be substituted with 1-5 R$^5$ groups;
Y'" can be selected from a divalent C$_{1-6}$ alkyl group, a divalent C$_{2-6}$ alkenyl group, and a divalent C$_{6-14}$ aryl group, wherein each of the C$_{1-6}$ alkyl group, the C$_{2-6}$ alkenyl group, and the C$_{6-14}$ aryl group optionally can be substituted with 1-5 R$^5$ groups;
k is 0, 1 or 2;
m is 1, 2, 3, 4, 5 or 6;
p is 0, 1, 2, 3, 4, 5, 6, 7, 8, 9 or 10; and
R$^4$ and R$^5$ are as defined herein.

In certain embodiments, L can be a linker group of the formula -L'-(L")$_p$-L'"-, wherein L' can be selected from —Y'—O—, —Y'—C(O)—, —Y'—OC(O)—, —Y'—C(O)O—, and a covalent bond; L", at each occurrence, independently can be selected from —Y"—, —(Y")$_m$—O—, and a covalent bond; L'" can be selected from —C(O)—, —C(O)—O—, —C(O)—Y'"—O—, —C(O)—Y'"—NR$^4$—, and a covalent bond, provided that at least one of L', L", and L'" is not a covalent bond; wherein R$^4$, Y', Y", Y'" and m are as defined herein. In particular embodiments, L, at each occurrence, independently can be selected from —(CH$_2$CH$_2$O)$_{p'}$—, —O—, —O—(CH$_2$CH$_2$O)$_{p'}$—, —O—C(O)—, —O—C(O)(CH$_2$CH$_2$O)$_{p'}$—, —C(O)—O—, —C(O)—O—(CH$_2$CH$_2$O)$_{p'}$—, —C$_6$H$_4$—O—(CH$_2$CH$_2$O)$_{p'}$—, —C$_6$H$_4$—O—, —C$_6$H$_4$—O—C(O)—, —C$_6$H$_4$—O—C(O)(CH$_2$CH$_2$O)$_{p'}$—, —C(O)—O—CF$_2$CF$_2$—O—, —(CH$_2$CH$_2$O)$_{p'}$—C(O)—CH$_2$—O—, —C(O)—CH$_2$—O—, —O—C(O)—CH$_2$—O—, —O—(CH$_2$CH$_2$O)$_{p'}$—C(O)—CH$_2$—O—, —O—C(O)(CH$_2$CH$_2$O)$_{p'}$—C(O)—CH$_2$—O—, —C(O)—O—(CH$_2$CH$_2$O)$_{p'}$—C(O)—CH$_2$—O—, —C$_6$H$_4$—O—(CH$_2$CH$_2$O)$_{p'}$—C(O)—CH$_2$—O—, —C$_6$H$_4$—O—C(O)—CH$_2$—O—, —C$_6$H$_4$—O—C(O)(CH$_2$CH$_2$O)$_{p'}$—C(O)—CH$_2$—O—, —C(O)—O—CF$_2$CF$_2$—O—C(O)—CH$_2$—O—, —[CH$_2$CH$_2$Si(CH$_3$)$_2$]$_{p'}$—, —[OSi(CH$_3$)$_2$]$_{p'}$—, —Si(CH$_3$)$_2$—[CH$_2$CH$_2$Si(CH$_3$)$_2$]$_{p'}$—, and a covalent bond; wherein p' is 1, 2, 3, or 4. For example, L, at each occurrence, independently can be selected from —CH$_2$CH$_2$O—C(O)—CH$_2$—O—, —OC(O)—CH$_2$—O—, —O—CH$_2$CH$_2$O—C(O)—CH$_2$—O—, —O—C(O)CH$_2$CH$_2$O—C(O)—CH$_2$—O—, —C(O)—O—CH$_2$CH$_2$O—C(O)—CH$_2$—O—, —C$_6$H$_4$—O—C(O)—CH$_2$—O—, —C$_6$H$_4$—O—CH$_2$CH$_2$O—C(O)—CH$_2$—O—, —C$_6$H$_4$—O—C(O)—CH$_2$CH$_2$O—C(O)—CH$_2$—O—, and —C(O)—O—CF$_2$CF$_2$—O—C(O)—CH$_2$—O—.

In some embodiments, Q, at each occurrence, independently can be a covalent bond or a linker group of the formula:

wherein:
L", at each occurrence, independently can be selected from —Y"—, —(Y")$_m$—O—Y"—, —Y"—NR$^4$—Y"—, —Y"—C(NR$^4$)—Y"—, —Y"—Si(R$^4$)$_2$—Y"—, —O—Si(R$^4$)$_2$—Y"—, and a covalent bond;
L'" is linked to the coumarin moiety and can be selected from —C(O)—, —C(O)—O—, —O—C(O)—, —C(O)—Y'"—, —C(O)—Y'"—O—, —O—Y'"—C(O)—, —C(O)—NR$^4$—, —NR$^4$—C(O)—, —C(O)—Y'"—NR$^4$—, —NR$^4$—Y'"—C(O)—, —O—S(O)$_k$—, —O—Y'"—S(O)$_k$—, and a covalent bond;
provided that at least one of L" and L'" is not a covalent bond;
Y", at each occurrence, is selected from a divalent C$_{1-6}$ alkyl group, a divalent C$_{2-6}$ alkenyl group, and a divalent C$_{6-14}$ aryl group, wherein each of the C$_{1-6}$ alkyl group, the C$_{2-6}$ alkenyl group, and the C$_{6-14}$ aryl group optionally is substituted with 1-5 R$^5$ groups;
Y'" is selected from a divalent C$_{1-6}$ alkyl group, a divalent C$_{2-6}$ alkenyl group, and a divalent C$_{6-14}$ aryl group, wherein each of the C$_{1-6}$ alkyl group, the C$_{2-6}$ alkenyl group, and the C$_{6-14}$ aryl group optionally is substituted with 1-5 R$^5$ groups;

k is 0, 1 or 2;

m is 1, 2, 3, 4, 5 or 6;

p is 0, 1, 2, 3, 4, 5, 6, 7, 8, 9 or 10; and $R^4$ and $R^5$ are as defined herein.

In certain embodiments, Q, at each occurrence, independently can be selected from —C(O)—, —C(O)—O—, —C(O)—Y'''—, —C(O)—Y'''—O—, —C(O)—Y'''—NH—, and a covalent bond; wherein Y''' can be selected from a divalent $C_{1-6}$ alkyl group, a divalent $C_{1-6}$ alkenyl group, and a divalent phenyl group.

In some embodiments, W, W', and W'' independently can be selected from H, a $C_{1-10}$ alkyl group, a $C_{2-10}$ alkenyl group, a $C_{1-10}$ haloalkyl group, a phenyl group, and a 5-14 membered heteroaryl group, wherein each of the $C_{1-10}$ alkyl group, the $C_{2-10}$ alkenyl group, the $C_{1-10}$ haloalkyl group, the phenyl group, and the 5-14 membered heteroaryl group optionally can be substituted with 1 to 5 substituents independently selected from a halogen, —CN, an oxo group, a $C_{1-6}$ alkyl group, a $C_{1-6}$ haloalkyl group, a $C_{1-6}$ alkoxy group, a —C(O)—$C_{1-6}$ alkyl group, a —C(O)—$C_{1-6}$ haloalkyl group, and a —C(O)—O—$C_{1-6}$ alkyl group.

In various embodiments, $R^1$ can be selected from H, F, —CN, and $CF_3$. In certain embodiments, $R^2$ can be H. In certain embodiments, b can be 0 or 1, and $R^3$ can be selected from a halogen, OH, —CN, a $C_{1-6}$ alkyl group, a $C_{1-6}$ haloalkyl group, and a $C_{1-6}$ alkoxyl group. In particular embodiments, at least $R^1$ or $R^3$ can be an electron-withdrawing group selected from F, —CN, and $CF_3$. By substitution with particular electron-withdrawing groups or electron-donating groups on the coumarin moiety it is possible to shift the absorption range of the polymer compared to a similar polymer having an unsubstituted coumarin moiety.

In various embodiments, $R^6$ and $R^7$, at each occurrence, can be independently selected from H, a halogen, and a $C_{1-6}$ alkyl group, and a $C_{1-6}$ haloalkyl group. In various embodiments, $R^8$, $R^{8'}$, $R^{8''}$, $R^9$, and $R^{9'}$ can be independently selected from H, a halogen, and a $C_{1-6}$ alkyl group, and a $C_{1-6}$ haloalkyl group.

Accordingly, in some embodiments, the present polymers can be represented by the formula:

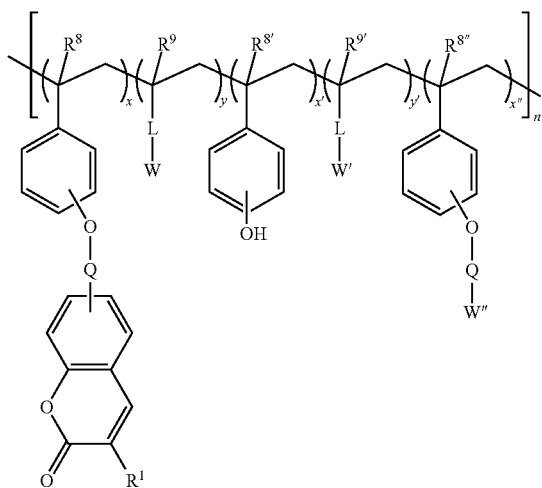

for example,

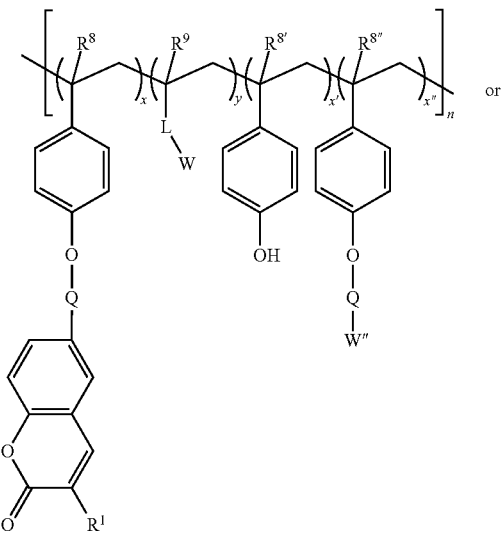

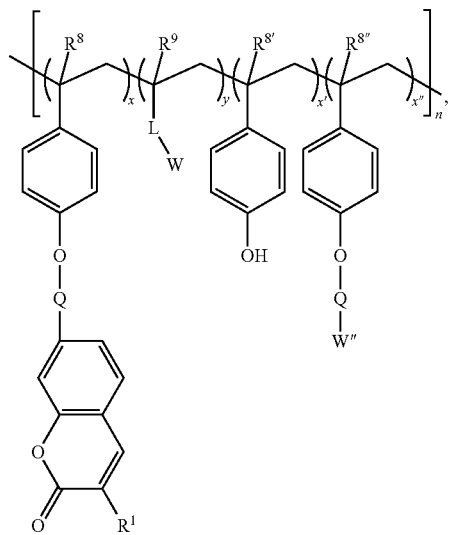

wherein L, Q, W, W', W''', $R^1$, $R^8$, $R^{8'}$, $R^{8''}$, $R^9$, $R^{9'}$, n, x, x', x'', y, and y' are as defined herein. In certain embodiments, x can be larger than about 0.25; and x+x'+x'' can be larger than about 0.5. For example, x can be larger than about 0.6; y can be larger than about 0.2; 0≤x'<0.10; and 0≤x''<0.10.

In some embodiments, the present polymers can have the formula:

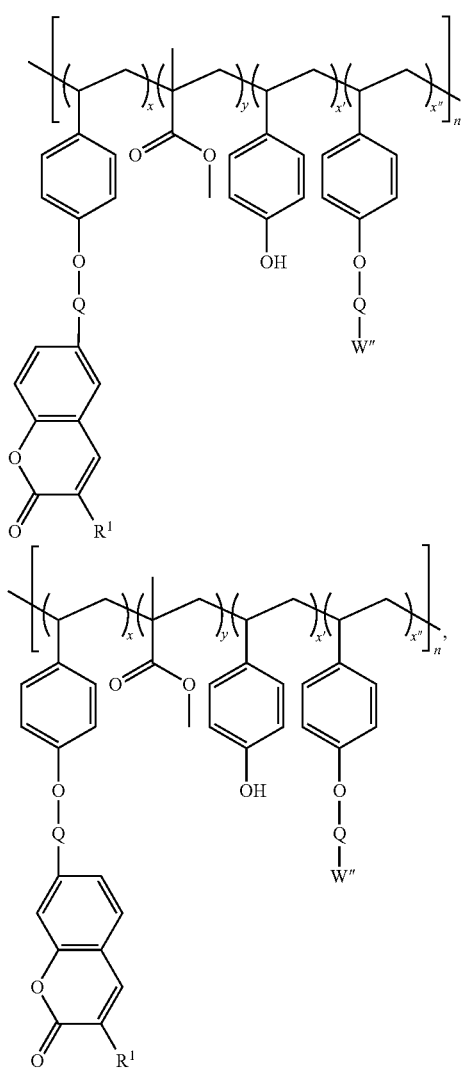

wherein Q, W", R¹, n, x, x', x", and y are as defined herein. In certain embodiments, x can be larger than about 0.25; and x+x'+x" can be larger than about 0.5. For example, x can be larger than about 0.5; y can be larger than about 0.25; 0≤x'<0.10; and 0≤x"<0.10.

In some embodiments, Q and W" in the repeating unit (or monomer C)

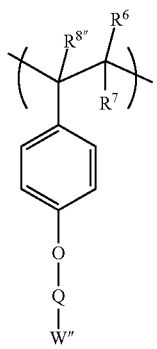

can be a —C(O)—C$_{2-6}$ alkenyl linker group and an optionally substituted phenyl or 5-14 membered heteroaryl group, respectively. For example, the repeating unit above (monomer C) can have the formula:

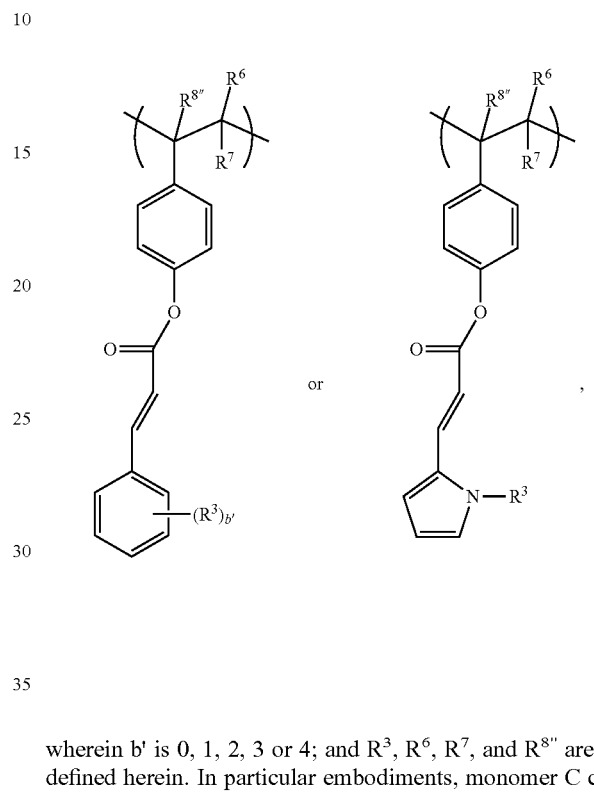

wherein b' is 0, 1, 2, 3 or 4; and R³, R⁶, R⁷, and R⁸" are as defined herein. In particular embodiments, monomer C can be selected from:

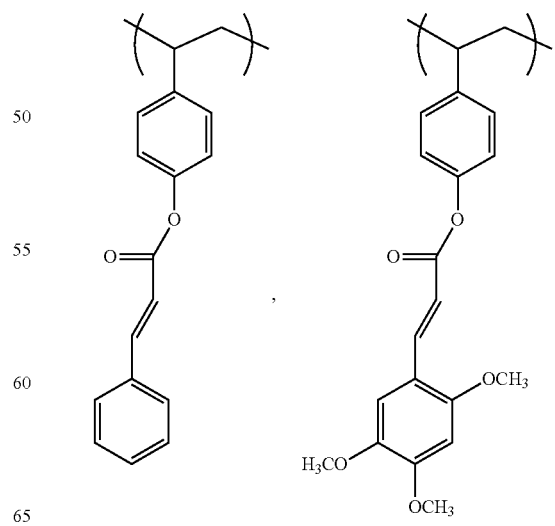

-continued

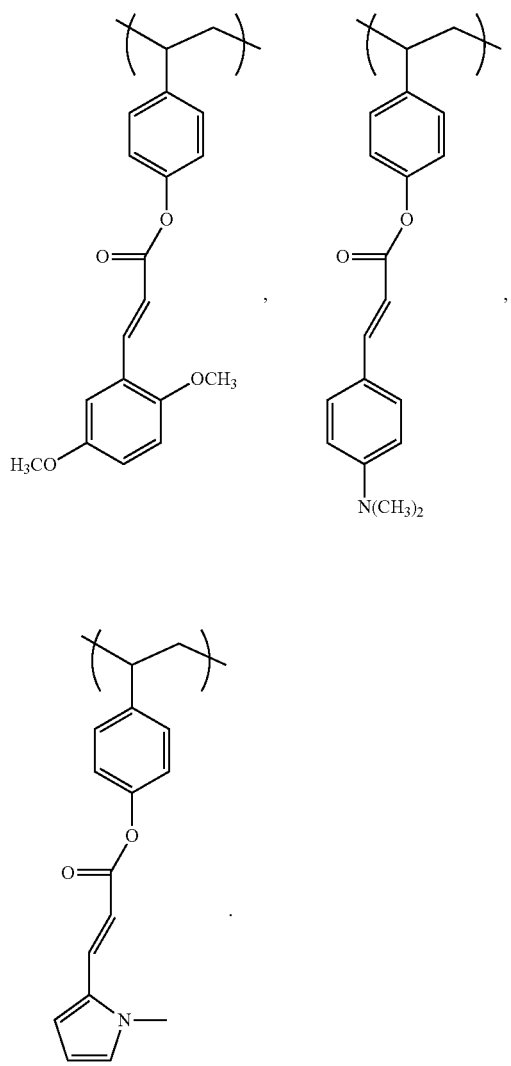

In other embodiments, Q and W" can be a —C(O)—C$_{1-20}$ alkyl group (e.g., —C(O)—CH$_3$), thereby providing a monomer C having a formula such as:

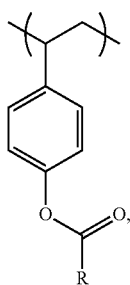

wherein R is a C$_{1-20}$ alkyl group. One or more of these monomers can be copolymerized with a coumarin-containing repeating unit as described herein. An exemplary polymer can be:

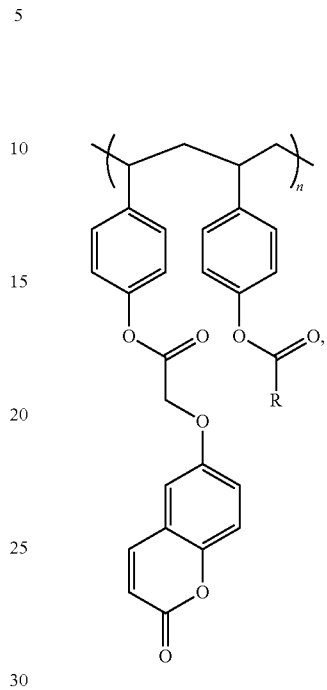

wherein R is a C$_{1-20}$ alkyl group (e.g., CH$_3$), and n is as defined herein.

Additional exemplary embodiments of the present polymers include:

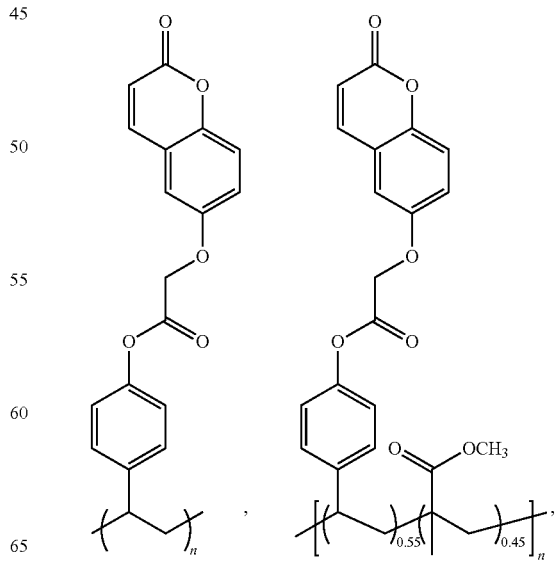

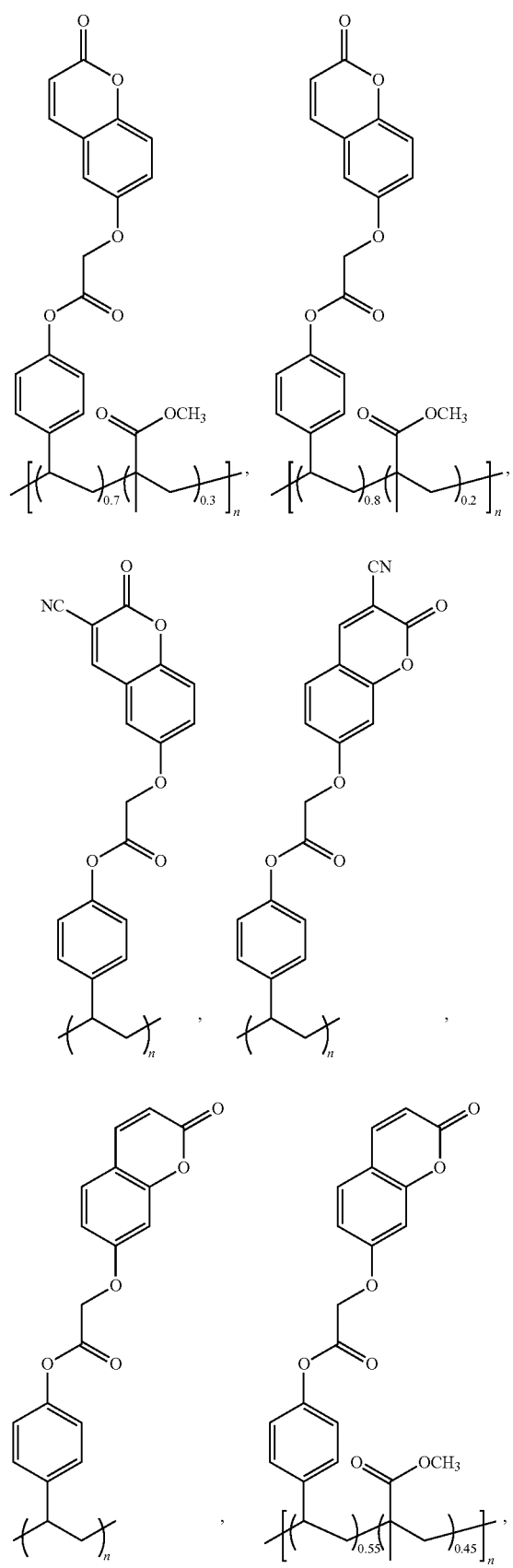
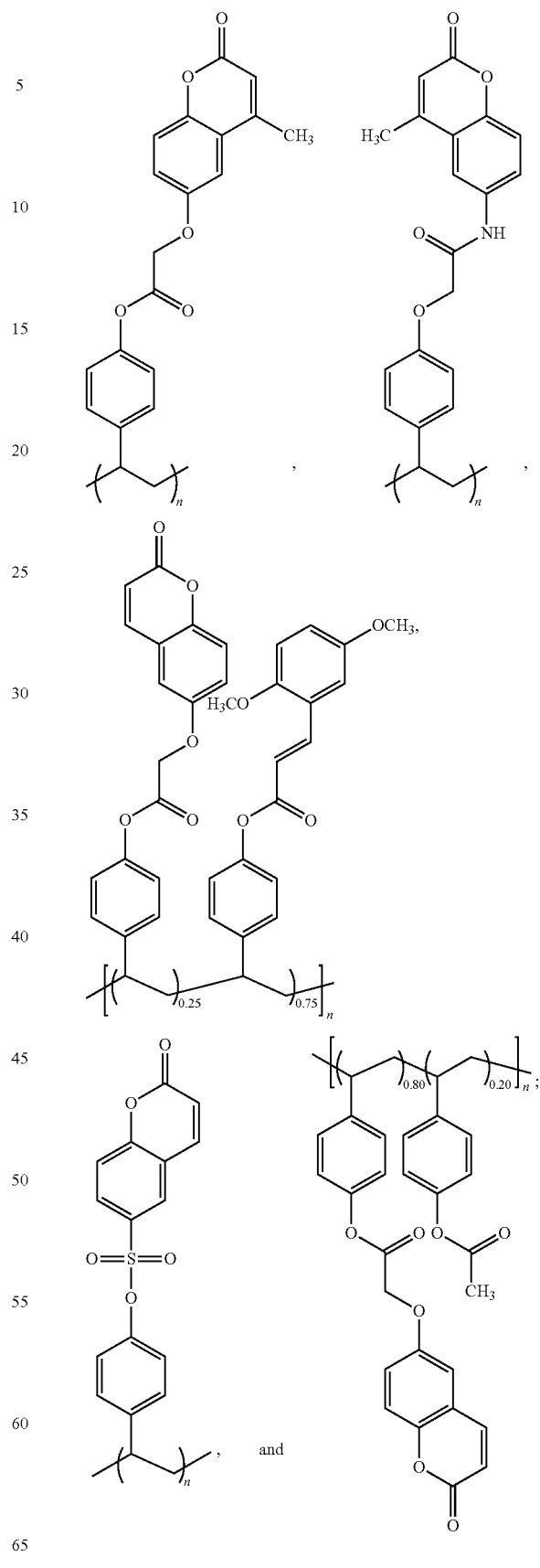
wherein n is as defined herein.

The present teachings also relate to coumarin-containing polymers, wherein the coumarin moiety can be linked to pendant groups other than a phenol group. In some embodiments, the coumarin moiety can be linked to such pendant groups via a specific carbon atom. For example, the coumarin moiety can be covalently linked to the rest of the polymer via its C6 position, that is, the coumarin moiety can be a coumarin-6-yl group. Examples of these embodiments include:

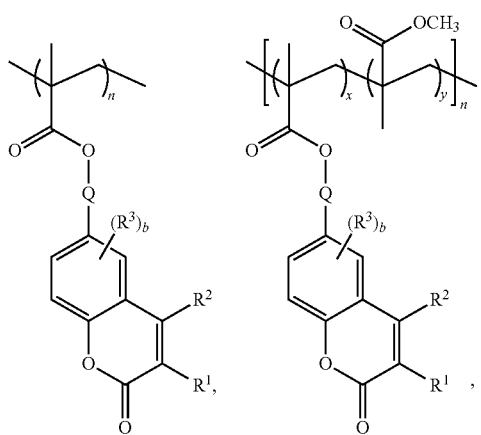

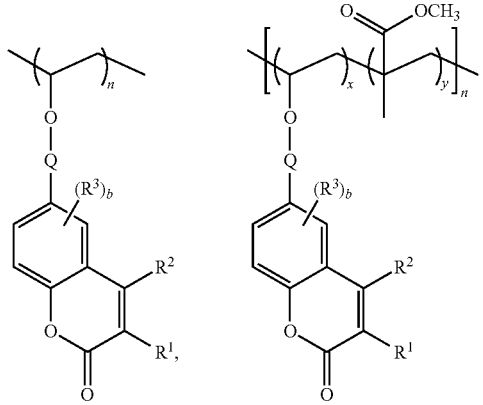

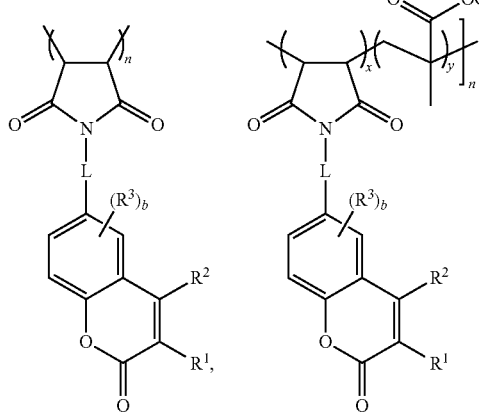

-continued

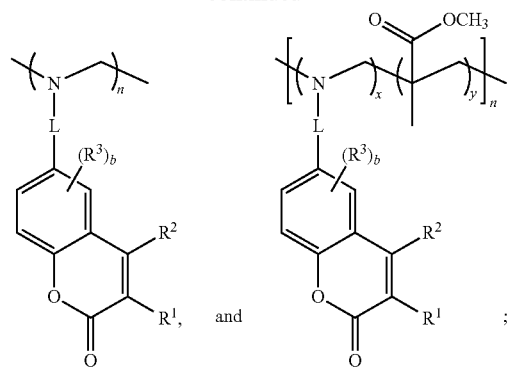

wherein L, Q, $R^1$, $R^2$, $R^3$, b, n, x, and y are as defined herein. In particular embodiments, the present polymers can have the formula:

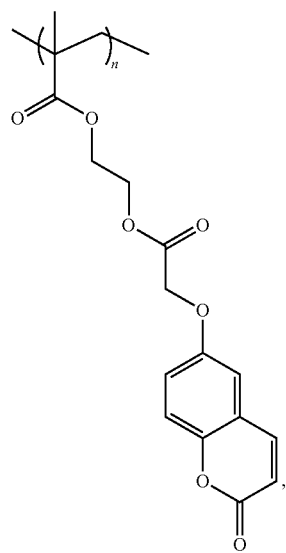

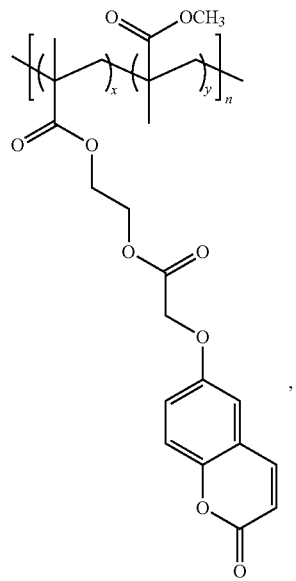

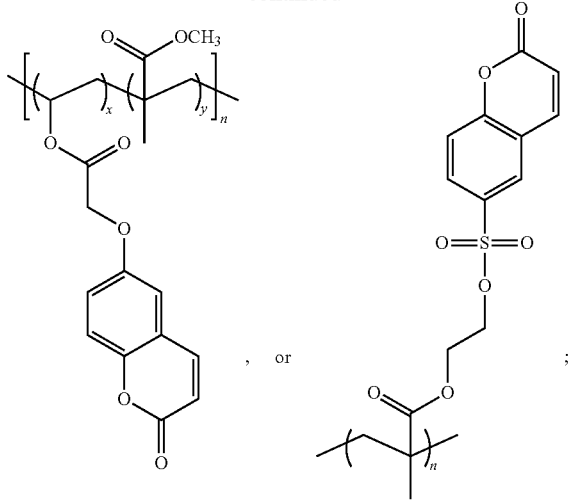

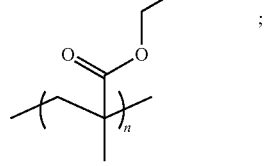

where n, x, and y are as defined herein.

For the various polymers described above, n can be an integer between 3 and 10,000. In some embodiments, n can be 10-10,000, 20-10,000, 50-10,000, or 100-10,000. For example, n can be 10-5,000, 10-1,000, 10-500, 10-400, 10-300, or 10-200. In certain embodiments, n can be 8-1,000. In various embodiments, the present polymers can have a molecular weight ($M_w$) between about 1,000 and about 5,000,000, for example, between about 2,000 and about 1,000,000; or between about 5,000 Da and about 500,000 Da.

The polymers disclosed herein can have satisfactory solubility in common organic solvents to afford photopolymer formulations. Examples of common organic solvents include, but are not limited to, petroleum ethers; aromatic hydrocarbons such as benzene, chlorobenzene, dichlorobenzene, 1,2, 3,4 tetrahydronaphthalene, cyclohexylbenzene, toluene, anisole, xylene, and mesitylene; ketones such as acetone, 2-butanone, cyclopentanone, and cyclohexanone; ethers such as tetrahydrofuran, diethyl ether, bis(2-methoxyethyl)ether, and dioxane; alcohols such as ethanol, propanol, and isopropyl alcohol; aliphatic hydrocarbons, such as hexanes and cyclohexane; esters, such as ethyl acetate or butyl acetate; halogenated aliphatic hydrocarbons such as dichloromethane, chloroform, and ethylene chloride; and other aprotic solvents such as dimethyl formamide, dimethyl sulfoxide, and N-methyl pyrrolidone. As used herein, a compound can be considered soluble in a solvent when at least 1 mg of the compound can be dissolved in 1 mL of the solvent.

Formulations of the polymers of the present teachings can be used in various solution-phase processes including, but not limited to, spin-coating, printing, drop casting, dip coating, spraying, and blade coating. Spin-coating involves applying an excess amount of the coating solution onto a substrate, then rotating the substrate at high speed to spread the fluid by centrifugal force. The thickness of the resulting dielectric film prepared by this technique is dependent on the spin-coating rate, the concentration of the solution, as well as the solvent used. Printing can be performed, for example, with a rotogravure printing press, a flexo printing press, pad printing, screen printing or an inkjet printer. The thickness of the dielectric film as processed by these printing methods can be dependent on the concentration of the solution, the choice of solvent, and the number of printing repetitions. Ambient conditions such as temperature, pressure, and humidity, can also affect the resulting thickness of the film. Depending on the specific printing techniques used, printing quality can be affected by different parameters including, but not limited to, rheological properties of the formulations such as tension energy and viscosity.

The present polymers are particularly useful for preparing dielectric layers in electronic devices, in preferably thin film transistor devices, most preferably thin film transistor devices based on organic semiconducting materials.

One of the advantages of the polymer formulations disclosed herein is their ability to crosslink, for example, photocrosslink, after deposition onto a substrate. The crosslinking functionality allows formation of a densely crosslinked polymeric matrix. The crosslinked polymeric matrix is robust enough to withstand various conditions that are common in device fabrication processes, including patterning and subsequent solution-phase processes, for example, to form/deposit overlying layers (e.g., the semiconductor layer in a bottom-gate OTFT structure or the gate layer for a top-gate OTFT structure). Without wishing to be bound to any particular theory, it is believed that the crosslinking chemistry can include a 2+2 photo-stimulated cycloaddition that provides stable cyclobutane moieties. The crosslinking chemistry can also involve free radical additions affording C—C and C—O bonds. Polymers of the present teachings can be cured, for example, photocrosslinked, by exposure to ultraviolet light, for example, at a wavelength of about 250-500 nm (e.g., between about 300 nm and about 450 nm). Shorter wavelengths of light can be filtered through, for example, an optical filter such as pyrex (cutoff ca. 300 nm). Crosslinking also can be achieved by other types of radiation, for example, with ion beams of charged particles, and electron beams with radioactive sources. Subsequent to the formation of the crosslinked matrix, the dielectric material of the present teachings can be subject to further patterning and process steps, by which additional layers, including additional dielectric, semiconductor and/or conducting layers, can be formed on top of the dielectric material.

Compositions (formulations) including one or more polymers of the present teachings can be used to prepare dielectric materials that can exhibit a wide range of desirable properties and characteristics including, but not limited to, low leakage current densities, high breakdown voltages, low hysteresis, tuned capacitance values, uniform film thickness, solution-processability, fabricability at low temperatures and/or atmospheric pressures, air and moisture stability, and/or compatibility with diverse gate materials and/or semiconductors.

Polymers of the present teachings can have a relatively high glass transition temperature ($T_g$). For example, the present polymers can have a $T_g$ between about 100° C. and about 200° C. This can be advantageous because the manufacturing process of many electronic devices can include an annealing step at a temperature of 100° C. or above, and a polymer having a $T_g$ less than about 100° C. may not be as useful in those processes. The present polymers also can have a dielectric constant between about 1.1 and about 5.0, wherein the dielectric constant can be determined using any procedures known in the art, including the procedures described in the standard test method ASTM D150. Without wishing to be bound by any particular theory, it is believed that copolymerization with PMMA can lead to a higher dielectric constant for certain particular embodiments of the present polymers, for example, those having a coumarin-containing vinyl phenol derivative repeating unit.

Leakage current density typically is defined as a vector whose magnitude is the leakage current per cross-sectional area. As used herein, "leakage current" refers to uncontrolled ("parasitic") current flowing across region(s) of a semiconductor structure or device in which no current should be flowing, for example, current flowing across the gate oxide in a metal-oxide-semiconductor (MOS) structure. As known by those skilled in the art, the leakage current density of a dielectric material can be determined by fabricating a standard metal-insulator-semiconductor (MIS) and/or metal-insulator-metal (MIM) capacitor structures with the dielectric material, then measuring the leakage current, and dividing the measured current by the area of the metal electrodes.

Polymers of the present teachings and their crosslinked products can have very low leakage current densities as measured from standard MIS and MIM capacitor structures. For example, polymers of the present teachings and their crosslinked products can have a leakage current density of less than or equal to about $4 \times 10^{-8}$ A/cm$^2$ at E=2 MV/cm, less than or equal to about $2 \times 10^{-8}$ A/cm$^2$ at E=2 MV/cm, less than or equal to about $1 \times 10^{-8}$ A/cm$^2$ at E=2 MV/cm, less than or equal to about $8 \times 10^{-9}$ A/cm$^2$ at E=2 MV/cm, less than or equal to about $7 \times 10^{-9}$ A/cm$^2$ at E=2 MV/cm, less than or equal to about $6 \times 10^{-9}$ A/cm$^2$ at E=2 MV/cm, less than or equal to about $4 \times 10^{-9}$ A/cm$^2$ at E=2 MV/cm, less than or equal to about $2 \times 10^{-9}$ A/cm$^2$ at E=2 MV/cm, or less than or equal to about $1 \times 10^{-9}$ A/cm$^2$ at E=2 MV/cm. Polymers of the present teachings also exhibit low leakage current densities at higher voltages, for example, a leakage current density of less than or equal to about $1 \times 10^{-6}$ A/cm$^2$ at E=4 MV/cm, less than or equal to about $5 \times 10^{-7}$ A/cm$^2$ at E=4 MV/cm, less than or equal to about $3 \times 10^{-7}$ A/cm$^2$ at E=4 MV/cm, less than or equal to about $1 \times 10^{-7}$ A/cm$^2$ at E=4 MV/cm, less than or equal to about $5 \times 10^{-8}$ A/cm$^2$ at E=4 MV/cm, or less than or equal to about $1 \times 10^{-8}$ A/cm$^2$ at E=4 MV/cm.

Dielectric materials prepared from polymers of the present teachings also can withstand very high breakdown voltages (i.e., the maximum voltage difference that can be applied across the dielectric before it breaks down and begins to conduct). For example, dielectric materials of the present teachings can withstand a breakdown voltage of 4 MV/cm or higher, a breakdown voltage of 6 MV/cm or higher, or a breakdown voltage of 7 MV/cm or higher.

The present teachings further provide articles of manufacture, for example, composites, that includes a dielectric material of the present teachings and a substrate component and/or a semiconductor component. The substrate component can be selected from, but is not limited to, doped silicon, an indium tin oxide (ITO), ITO-coated glass, ITO-coated polyimide or other plastics, aluminum or other metals alone or coated on a polymer or other substrate, a doped polythiophene, and the like. The composite can include a semiconductor component. The semiconductor component can be selected from, but is not limited to, various fused heterocycles, aromatic hydrocarbons, polythiophenes, fused (hetero)aromatics (e.g., perylene imides and naphthalene imides), and other such organic semiconductor compounds or materials, whether p-type or n-type, otherwise known or found useful in the art. For example, the semiconductor component can be prepared from one or more compounds and/or polymers as described in U.S. Pat. Nos. 6,585,914, 6,608,323, and 6,991,749; and U.S. Patent Publication Nos. 2005/0176970, 2006/0186401, 2007/0282094, 2008/0021220, 2008/0167435, 2008/0177073, 2008/0185555, 2008/0185577, and 2008/0249309. The semiconductor component also can include inorganic semiconductor materials such as silicon, germanium, gallium arsenide, metal oxide, and the like.

The composite can include one or more interlayers between the semiconductor layer and the dielectric layer. Such interlayers can be electrically insulating and can be prepared from various dielectric polymers. In some embodiments, the one or more interlayers can be prepared from polymers such as fluoropolymers (e.g., Cytop®, Asahi Glass Co., Wilmington, Del.; and Teflon® AF, Dupont, Wilmington, Del.), poly(isobutylene), poly(vinyl phenol-co-methyl methacrylate), poly(vinyl alcohol), poly(propylene), poly(vinyl chloride), polycyanopulluane, poly(vinyl phenol), poly(vinyl cyclohexane), benzocyclobutene-based polymers, poly(methyl methacrylate), poly(styrene-co-butadiene), poly(vinyl pyridine), poly(vinylidine fluoride), polyacrylonitrile, poly(4-vinylpyridine), poly(2-ethyl-2-oxazoline), poly(chlorotrifluoroethylene), polyvinylpyrrolidone, and poly(pentafluorostyrene).

The composite can include one or more electrical contacts. Such electrical contacts can be made of a metal (e.g., gold) or any other organic or inorganic electrically conducting material and can function as source, drain, or gate contacts. One or more of the composites described herein can be embodied within various organic electronic, optical, and optoelectronic devices such as organic thin film transistors (OTFTs), specifically, organic field effect transistors (OFETs), as well as sensors, capacitors, unipolar circuits, complementary circuits (e.g., inverter circuits), and the like. The present polymers and polymeric materials also can be used to prepare an ancillary component in articles of manufacture such as organic light-emitting diodes, photovoltaics or solar cells. Exploitation of polymers of the present teachings in such devices is within the knowledge of a skilled artisan.

Another aspect of the present teachings relates to methods for preparing a dielectric material. The method can include preparing a polymer composition (formulation) by dissolving one or more polymers described herein in a solvent, and printing the formulation onto a substrate to form a dielectric layer. The method can include exposing the dielectric layer to a radiation source (e.g., ultraviolet light) to induce crosslinking, thereby forming a crosslinked dielectric material. The method can also include printing an additional dielectric layer onto the crosslinked dielectric layer to form a multilayer dielectric material.

An aspect of the present teachings relates to a thin film transistor device including a dielectric layer including a dielectric material as described herein, a semiconductor layer, a gate electrode, a source electrode, and a drain electrode. The dielectric layer typically is disposed between the semiconductor layer and the gate electrode. The dielectric layer can be coupled to the semiconductor layer either directly or via optionally present intervening layer(s) such as a protective interlayer. Depending on the device geometry, the source and drain electrodes can be disposed above the semiconductor layer (top-contact), or the semiconductor layer can be disposed above the source and drain electrodes (bottom-contact). The dielectric layer can include a polymeric film (e.g., a photocrosslinked polymeric film), wherein the polymeric film can include a polymer having a repeating unit that has a pendant group including a photocrosslinkable pendant group, more specifically, a coumarin-6-yl group, of the formula:

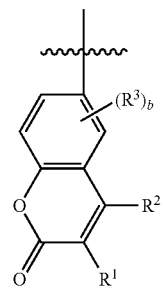

wherein $R^1$ $R^2$, $R^3$, and b are as defined herein.

Figure 14:
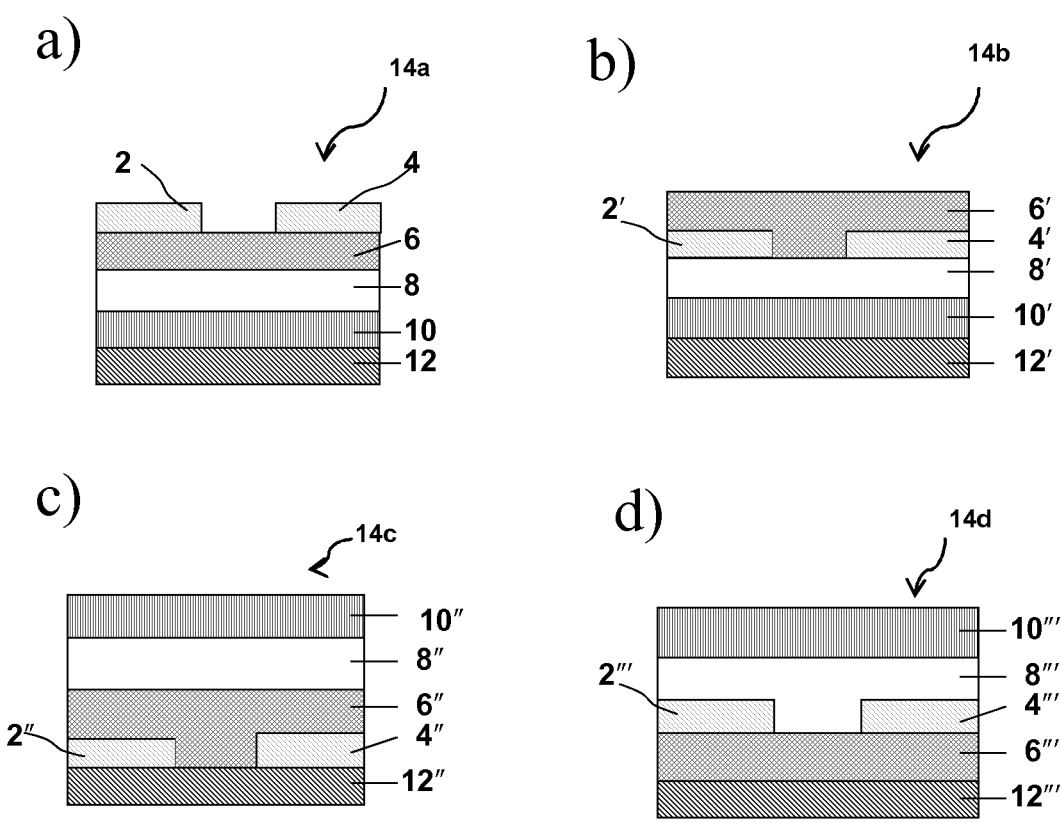
FIG. 14 illustrates four different configurations of thin film transistors: a) bottom-gate top contact, b) bottom-gate bottom-contact, c) top-gate bottom-contact, and d) top-gate top-contact; each of which can be used to incorporate one or more polymers of the present teachings, particularly as the dielectric layer or part of the dielectric component.

Another aspect of the present teachings relates to methods for fabricating organic field effect transistors that include a dielectric material of the present teachings. The dielectric materials of the present teachings can be used to fabricate various types of organic field effect transistors including, but not limited to, top-gate top-contact structures, top-gate bottom-contact structures, bottom-gate top-contact structures, and bottom-gate bottom-contact structures. FIG. 14 illustrates the four common types of OFET structures: (a) bottom-gate top-contact structure (14a), (b) bottom-gate bottom-contact structure (14b), (c) top-gate bottom-contact structure (14c), and (d) top-gate top-contact structure (14d). As shown in FIG. 14, an OFET can include a dielectric layer (8, 8', 8", and 8'"), a semiconductor/channel layer (6, 6', 6", and 6'"), a gate contact (10, 10', 10", and 10'"), a substrate (12, 12', 12", and 12'"), and source (2, 2', 2", and 2'") and drain contacts (4, 4', 4", and 4'").

In some embodiments, the method can include preparing a polymer formulation that includes one or more polymers described herein, printing the formulation onto a substrate (gate) to form a dielectric layer, forming a semiconductor layer above the dielectric material, and forming a first electrical contact and a second electrical contact (source and drain) on the semiconductor layer, to fabricate a top-contact bottom-gate organic field effect transistor. The method can include exposing the dielectric layer to radiation to induce crosslinking to form a crosslinked dielectric material.

In some embodiments, the method can include preparing a solution that includes one or more polymers described herein, printing the solution onto a substrate (gate) to form a dielectric layer, forming a first electrical contact and a second electrical contact (source and drain) above the dielectric material, and forming a semiconductor layer above the first and second electrical contacts and the dielectric material (i.e., to cover the electrical contacts and an area of the dielectric material between the electrical contacts), to fabricate a bottom-contact bottom-gate organic field effect transistor. The method can include exposing the dielectric layer to radiation to induce crosslinking to form a crosslinked dielectric material.

In some embodiments, the method can include forming a first electrical contact and a second electrical contact (source and drain) on a substrate, forming a semiconductor layer above the substrate and the first and second electrical contacts (to cover the electrical contacts and an area of the substrate between the electrical contacts), preparing a polymer formulation that includes one or more polymers described herein, printing the formulation above the semiconductor layer to form a dielectric layer, forming a third electrical contact (gate) on the dielectric material, wherein the third electrical contact is above an area between the first and second electrical contacts, to fabricate a bottom-contact top-gate organic field effect transistor. In some embodiments, the method can include exposing the dielectric layer to radiation to induce crosslinking to form a crosslinked dielectric material. In some embodiments, the method can include forming an interlayer above the semiconductor layer before depositing the dielectric polymer formulation.

In some embodiments, the method can include forming a semiconductor layer on a substrate, forming a first electrical contact and a second electrical contact (source and drain) above the semiconductor layer, preparing a polymer formulation that includes one or more polymers described herein, printing the formulation above the first and second electrical contacts and an area of the semiconductor layer between the first and second electrical contacts to form a dielectric layer, and forming a third electrical contact (gate) above the dielectric material, wherein the third electrical contact is above an area between the first and second electrical contacts, to fabricate a top-contact top-gate organic field effect transistor. In some embodiments, the method can include exposing the dielectric layer to radiation to induce crosslinking to form a crosslinked dielectric material. In some embodiments, the method can include forming an interlayer above the semiconductor layer before depositing the dielectric polymer formulation.

The semiconductor layer and the various electrical contacts can be formed by various deposition processes known to those skilled in the art. For example, the semiconductor layer and the interlayer can be formed by processes such as, but not limited to, physical vapor deposition, different types of printing techniques (e.g., flexo printing, litho printing, gravure printing, ink-jetting, pad printing, and so forth), drop casting, dip coating, doctor blading, roll coating, and spin-coating. Electrical contacts can be formed by processes such as, but not limited to, thermal evaporation and radiofrequency or e-beam sputtering, as well as various deposition processes, including but not limited to those described immediately above (e.g., flexo printing, litho printing, gravure printing, ink-jetting, pad printing, screen printing, drop casting, dip coating, doctor blading, roll coating, and spin-coating).

In the following examples, polymers and dielectric materials according to the present teachings were prepared and characterized by NMR, UV-Vis spectroscopy, differential scanning calorimetry (DSC), AFM, and metal-insulator-semiconductor (MIS) device leakage and impedance spectroscopy measurements, to demonstrate, among other things, their dielectric properties and their compatibility with various p-type and n-type organic semiconductors. Organic electronic devices, for example, organic thin film transistors (OTFTs), specifically, organic field effect transistors (OFETs), based on these dielectric films also have been fabricated and characterized, data of which are provided below.

The following examples are provided to illustrate further and to facilitate the understanding of the present teachings and are not in any way intended to limit the invention.

Example 1

Preparation of 6HOC-AcCl

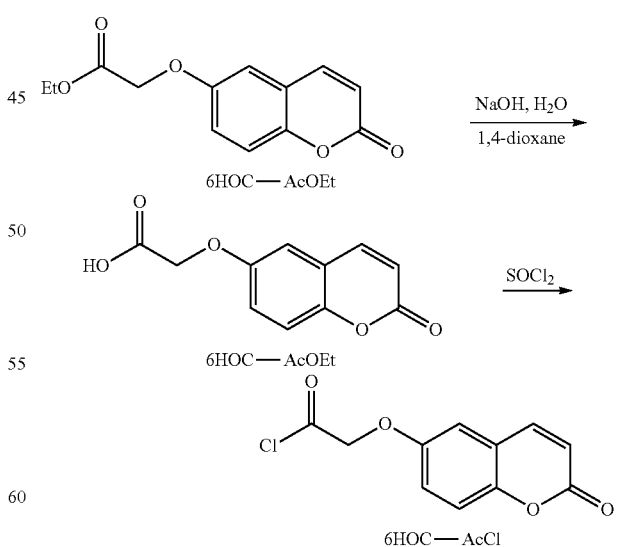

To a suspension of 25 g (0.15 mol) of 6-hydroxycoumarin and 30.7 g (0.22 mol) of $K_2CO_3$ in 550 mL of acetone was added 20.5 mL (30.9 g, 0.19 mol) of ethyl bromoacetate. The mixture was refluxed for 16 hours then filtered warm. The filtrate was concentrated in vacuo and the resulting solid was recrystallized from 100 mL of ethanol to give 34.8 g (91% yield) of 6HOC-AcOEt as yellow prisms.

M.P. 113-114° C.; $^1$H NMR (500 MHz, CDCl$_3$): δ 7.65 (d, 1H, J=8.5), 7.29 (d, 1H, J=9.5), 7.17 (d, 1H, J=8.7), 6.95 (s, 1H), 6.45 (d, 1H, J=9.8), 4.67 (s, 2H), 4.30 (q, 2H, J=6.5), 1.32 (t, 3H, J=6.8).

A mixture of 97 g (0.39 mol) of 6HOC-AcOEt, 62 g (1.5 mol) of NaOH, 1 L of 1,4-dioxane, and 1.5 L of water was stirred at ambient temperature for 22 hours. The solution was treated with 150 mL of concentrated aqueous hydrochloric acid in one portion, with rapid stirring. The resulting suspension was cooled to room temperature and filtered. The filter cake was washed with water (5×100 mL) then dried under vacuum at 100° C. to give 81.8 g (95% yield) of 6HOC-AcOH as a tan powder.

M.P. 258-261° C.; $^1$H NMR (500 MHz, DMSO-d$_6$): δ 13.05 (br s, 1H), 8.01 (d, 1H, J=9.6), 7.35 (d, 1H, J=8.9), 7.27 (d, 1H, J=3.9), 7.21 (dd, 1H, J=8.6, 2.9), 6.49 (d, 1H, J=8.9), 4.74 (s, 2H).

A mixture of 81.8 g (0.37 mol) of 6HOC-AcOH and 400 mL (5.5 mol) of SOCl$_2$ was refluxed for 6 hours then filtered hot through a heated glass frit. The filtrate was cooled in a water bath then placed in a freezer (0--5° C.) for 1 hour. The suspension was filtered and the filter cake was washed with 25 mL of THF. The solid was dried in air to give 75 g (85% yield) of 6HOC-AcCl as pink needles.

M.P. 160-163° C.; $^1$H NMR (500 MHz, DMSO-d$_6$): δ 8.02 (d, 1H, J=9.6), 7.35 (d, 1H, J=9.7), 7.27 (s, 1H), 7.22 (dd, 1H, J=8.8, 3.0), 6.49 (d, 1H, J=9.8), 4.74 (s, 2H).

Example 2

Preparation of PVP$_{0.55}$-co-PMMA$_{0.45}$-6HOC-Ac

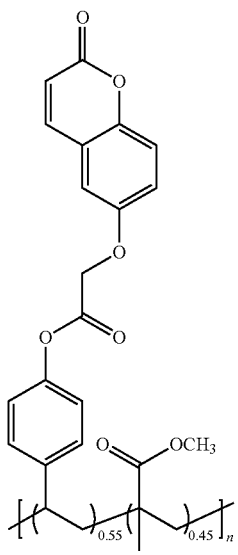

To a solution of 3.1 g of PVP-co-PMMA (MW 10 k, vinylphenol moiety molar ratio 55% based on calculation from proton NMR) and 10 mg of 4-dimethylamino-pyridine in 20 mL of pyridine was added a solution of 6.0 g (25 mmol) of 6HOC-AcCl in 60 mL of hot 1,4-dioxane. The resulting mixture was stirred at ambient temperature for 3 hours then treated with 150 mL of methanol. The cloudy supernatant was decanted and the remaining residue was precipitated three times from 20 mL chloroform/50 mL methanol, each time decanting the supernatant. The remaining residue was dissolved in 30 mL of chloroform and filtered directly into 100 mL of methanol cooled to −78° C. The precipitate was filtered off and dried in vacuo to give 6.3 g of PVP$_{0.55}$-co-PMMA$_{0.45}$-6HOC-Ac as a white powder.

$^1$H NMR (500 MHz, CDCl$_3$): δ 7.67 (br s, 1H), 7.35-6.65 (m, 7H), 6.45 (br s, 1H), 4.9 (m, 2H), 3.5-0.5 (br).

Example 3

Preparation of PVP$_{0.80}$-co-PMMA$_{0.20}$-6HOC-Ac

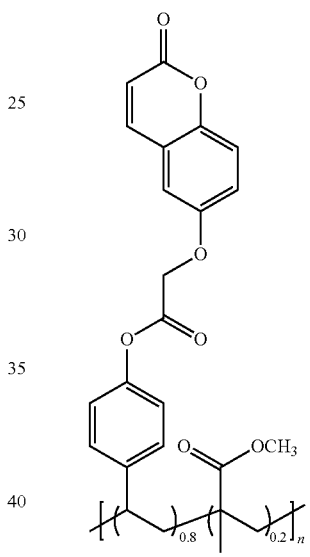

To a solution of 3.0 g of PVP$_{0.80}$-co-PMMA$_{0.20}$ (MW 70 k) and 10 mg of 4-dimethylaminopyridine in 15 mL of pyridine was added a solution of 7.5 g (31 mmol) of 6HOC-AcCl in 75 mL of hot 1,4-dioxane. The resulting mixture was stirred at ambient temperature for 3 hours then treated with 100 mL of methanol. The supernatant was decanted and the remaining residue was treated with 30 mL of chloroform and stirred for 15 minutes. The mixture was treated with 100 mL of methanol and the supernatant was decanted. The remaining residue was precipitated three times from 20 mL cyclopentanone/60 mL methanol, each time decanting the supernatant (traces of methanol were removed with a rotovap to aid dissolution in cyclopentanone). The remaining residue was dissolved in 60 mL of cyclopentanone and filtered directly into 300 mL of diethyl ether with rapid stirring. The precipitate was filtered off and washed with 3×50 mL of diethyl ether. The filter cake was dried under vacuum to give 5.4 g of PVP$_{0.80}$-co-PMMA$_{0.20}$-6HOC-Ac as a white powder.

$^1$H NMR NMR (500 MHz, DMSO-d6): δ 7.9 (br, 1H), 7.4-6.3 (br, 8H), 5.05 (br, 2H), 3.4-0.0 (br).

Example 4a

Preparation of PVP-6HOC-Ac

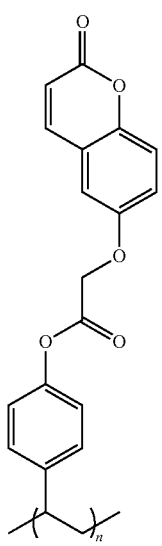

To a solution of 2.66 g of poly(4-vinylphenol) (MW 20 k) and 10 mg of 4-dimethylaminopyridine in 20 mL of pyridine was added a solution of 8.0 g (33.5 mmol) of 6HOC-AcCl in 80 mL of hot 1,4-dioxane. The resulting mixture was stirred at ambient temperature for 3 hours then the supernatant was decanted. The remaining residue was treated first with 20 mL cyclopentanone to dissolve the oily portion and then with 60 mL of methanol. The supernatant was decanted and the remaining residue was precipitated once from 20 mL cyclopentanone/60 mL methanol and once from 20 mL cyclopentanone/60 mL diethyl ether. The residue was dissolved in 50 mL of cyclopentanone and filtered. The filtrate was concentrated to 20 mL and treated with 70 mL of diethyl ether. The cloudy supernatant was removed and the remaining residue was treated with 50 mL of diethyl ether and shaken and/or stirred for 15 minutes. The suspension was filtered and the filter cake was dried in vacuo to give 5.4 g (76% yield) of PVP-6HOC-Ac as a white powder.

$^1$H NMR (500 MHz, DMSO-d$_6$): δ 7.81 (br s, 1H), 7.4-6.3 (br, 8H), 5.01 (br s, 2H), 2.0-1.0 (br, 3H).

Example 4b

Preparation of PVP-6HOC-Ac

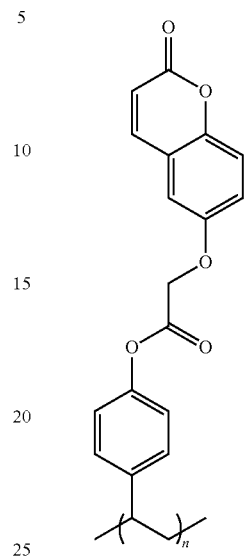

To a solution of 5.63 g of poly(4-vinylphenol) (MW 20 k) (n$_{OH}$=46.86 mmol), 20 mg of 4-dimethylaminopyridine and (1.5Eq, n=70.29 mmol, m=7.11 g, V=9.80 mL) of triethylamine in 30 mL of water-free DMAC was added a solution of 8.0 g (1.5Eq, n=70.29, m=16.63 g) of coumarin-COCl in 50 mL of water-free DMAC. The resulting mixture was stirred at ambient temperature for 12H. Afterwards, the polymer was precipitated dropwise in 1 L MeOH under a high stirring. The suspension was filtered and the filter cake was dissolved again in 40 mL DMAC. The polymer solution was precipitated a second time in 1 L methanol. The suspension was filtered and the filter cake was dried in vacuo to give 13.4 g (85% yield) of PVP-6HOC-Ac as a white powder.

$^1$H NMR (500 MHz, DMSO-d$_6$): δ 7.81 (br s, 1H), 7.4-6.3 (br, 8H), 5.01 (br s, 2H), 2.0-1.0 (br, 3H).

Example 5

Preparation of PVP$_{0.55}$-co-PMMA$_{0.45}$-7HOC-Ac

To a solution of 3.0 g of PVP-PMMA (MW 10 k, vinylphenol moiety molar ratio 55% based on calculation from proton NMR) and 10 mg of 4-dimethylamino-pyridine in 15 mL of pyridine was added a solution of 5.5 g (23 mmol) of 7HOC-AcCl (Chujo, Y.; Sada, K.; Saegusa, T., *Macromolecules*, 23: 2693-2697 (1990)) in 25 mL of warm THF. The mixture was treated with 120 mL of chloroform and stirred at ambient temperature for 1 hour. The mixture was treated with 5 mL of water and stirred for 2 minutes. The mixture was poured into 100 mL of methanol and the resulting suspension was reduced in volume by half using a rotary evaporator. The mixture was treated with 50 mL of methanol and the supernatant was decanted. The remaining residue was dissolved in chloroform (15 mL) and pyridine (1 mL) and precipitated using methanol (30 mL). The supernatant was decanted and the remaining residue was precipitated three times from chloroform (15 mL)/methanol (30 mL), each time decanting the supernatant. The remaining residue was dissolved in 50 mL of chloroform and added dropwise into 200 mL of methanol cooled to −78° C. The precipitate was filtered off and dried in vacuo to give 5.7 g of $PVP_{0.55}$-co-$PMMA_{0.45}$-7HOC-Ac as a pale yellow powder.

$^1$H NMR (500 MHz, $CDCl_3$): δ 7.68 (br, 1H), 7.44 (br, 1H), 7.2-6.6 (br, 6H), 6.29 (br, 1H), 4.9 (br, 2H), 3.5-0.5 (br).

Example 6

Preparation of PVP-7HOC-Ac

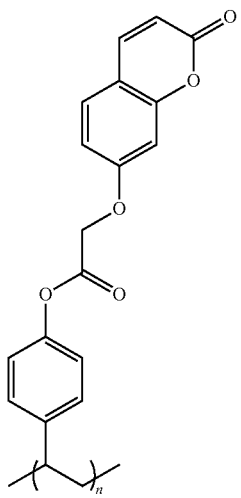

To a solution of 10 g of poly(4-vinylphenol) (MW 20 k) and 10 mg of 4-dimethylaminopyridine in 80 mL of pyridine was added a solution of 30 g (126 mmol) of 7HOC-AcCl in 100 mL of hot THF. The mixture was stirred at ambient temperature for 1 hour then treated with 200 mL of methanol. The supernatant was decanted and the remaining oil was precipitated three times from cyclopentanone (100 mL)/methanol (200 mL), each time decanting the supernatant. The remaining oil was dissolved in cyclopentanone (200 mL) and added dropwise into 400 mL of methanol cooled to −78° C. The material was collected by filtration and dried in vacuo to give 20 g of a PVP-7HOC-Ac as a yellow powder.

$^1$H NMR (500 MHz, DMSO-$d_6$): δ 7.9 (br s, 1H), 7.5 (br s, 1H), 7.2-6.1 (br, 7H), 5.1 (br s, 2H), 2.0-1.0 (br, 3H).

Example 7

Preparation of $(PVP-6HOC-Ac)_{0.80}$-co-$(PVP-Ac)_{0.20}$

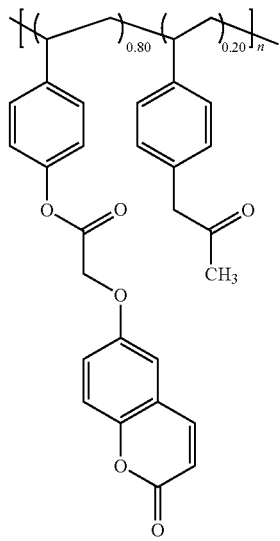

To a solution of 2.5 g of poly(4-vinylphenol) (MW 20 k) and 10 mg of 4-dimethylaminopyridine in 10 mL of pyridine was added a solution of 4.0 g (16.8 mmol) of 6HOC-AcCl in 40 mL of hot 1,4-dioxane. The resulting mixture was stirred at ambient temperature for 1 hour then the mixture was treated with 2 mL (20.8 mmol) of acetic anhydride. The mixture was heated to boiling then stirred at ambient temperature for 1 hour. The mixture was treated with 100 mL of methanol and the supernatant was decanted. The remaining residue was treated first with 10 mL cyclopentanone to dissolve the oily portion and then with 50 mL of methanol. The supernatant was decanted and the remaining residue was precipitated twice from 30 mL cyclopentanone/100 mL methanol, each time decanting the supernatant. The remaining residue was dissolved in 30 mL of cyclopentanone and filtered directly into −78° C. methanol with vigorous stirring. The suspension was filtered and the filter cake was dried in vacuo to give 3.2 g of $(PVP-6HOC-Ac)_{0.80}$-co-$(PVP-Ac)_{0.20}$ as an off-white powder.

$^1$H NMR (500 MHz, DMSO-$d_6$): δ 8.0-6.2 (br), 5.05 (br), 2.25-1.0 (br).

Example 8

Preparation of 4-vinylphenyl 2-(coumarin-6-yloxy)acetate (VP-6HOC-Ac)

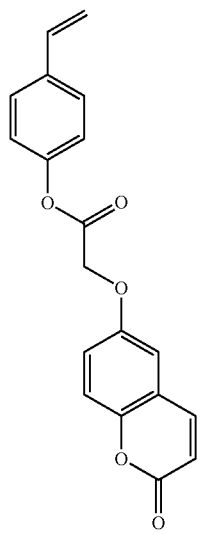 [SMILES: C=Cc1ccc(OC(=O)COc2ccc3oc(=O)ccc3c2)cc1]

To a suspension of 1.0 g (4.2 mmol) of 6HOC-AcCl (Example 1) in 10 mL of cyclopentanone was added a solution of 0.50 g (4.2 mmol) of 4-hydroxystyrene and 5 mg of 4-dimethylaminopyridine in 1 mL of pyridine while cooling in a water bath. The mixture was stirred at ambient temperature for 1 h then treated with 0.2 mL of water and stirred for 2 min. The mixture was treated with 80 mL of methanol and filtered. The filter cake was washed with methanol (2×10 mL) and dried under vacuum. The resulting powder dissolved in chloroform and passed through a short pad of silica gel. The filtrate was concentrated in vacuo and the resulting solid was recrystallized from 100 mL of ethanol to give 0.6 g (45% yield) of VP-6HOC-Ac as colorless needles.

$^1$H NMR (500 MHz, CDCl$_3$): δ 7.67 (d, 1H, J=10 Hz), 7.45-7.04 (m, 6H), 6.71 (dd, 1H, J=18, 11 Hz), 6.47 (d, 1H, J=10 Hz), 5.74 (d, 1H, J=18 Hz), 5.28 (d, 1H, J=11 Hz), 4.93 (s, 2H).

Example 9

Polymerization of VP-6HOC-Ac

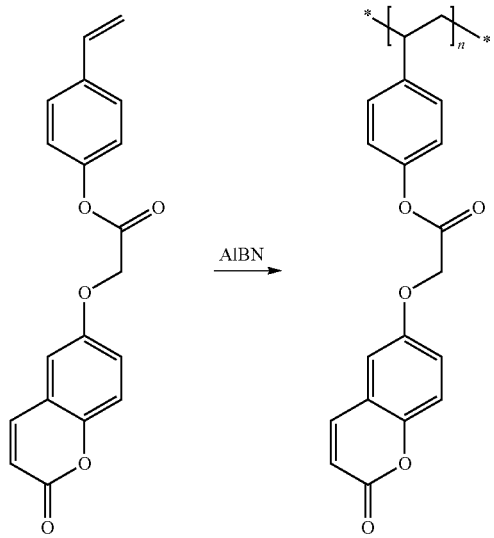

a) In a dark flask, 5 g (15.2 mmol) of VP-6HOC-Ac (Example 8) were dissolved in 25 ml of dry dimethylacetamide (DMAC) under inert atmosphere. After addition of 50 mg (0.3 mmol) of azobisisobutyronitrile (AIBN), the reaction mixture was heated to 60° C. and stirred at this temperature in dark for 15 h. Then the mixture was cooled to room temperature and precipitated in CHCl$_3$/MeOH (50/50).

Redissolution in dimethyformamide (DMF), precipitation in CHCl$_3$ and treatment with small amounts of MeOH yielded the product as a white powder. Yield: 3.6 g (72%). $M_n$=2,790 g/mol; $M_w$=25,100 g/mol; $M_w/M_n$=9.0.

b) In a dark flask, 5 g (15.2 mmol) of VP-6HOC-Ac (Example 8) were dissolved in 25 ml of dry DMAC under inert atmosphere. After addition of 50 mg (0.3 mmol) of AIBN, the reaction mixture was heated to 70° C. and stirred at this temperature in dark for 15 h. Then the mixture was cooled to room temperature and precipitated in CHCl$_3$/MeOH (50/50).

Redissolution in DMF, precipitation in CHCl$_3$ and treatment with small amounts of MeOH yielded the product as a white powder. Yield: 3.6 g (72%). $M_n$=3,640 g/mol; $M_w$=76,000 g/mol; $M_w/M_n$=20.9.

c) In a dark flask, 5 g (15.2 mmol) of VP-6HOC-Ac (Example 8) were dissolved in 25 ml of dry DMF under inert atmosphere. After addition of 50 mg (0.3 mmol) of AIBN, the reaction mixture was heated to 60° C. and stirred at this temperature in dark for 15 h. Then the mixture was cooled to room temperature and precipitated in CHCl$_3$/MeOH (50/50).

Redissolution in DMF, precipitation in CHCl$_3$ and treatment with small amounts of MeOH yielded the product as a white powder. Yield: 3.5 g (70%). $M_n$=4,440 g/mol; $M_w$=108,000 g/mol; $M_w/M_n$=24.3.

c) In a dark flask, 5 g (15.2 mmol) of VP-6HOC-Ac (Example 8) were dissolved in 25 ml of dry DMF under inert atmosphere. After addition of 100 mg (0.6 mmol) of AIBN, the reaction mixture was heated to 60° C. and stirred at this temperature in dark for 15 h. Then the mixture was cooled to room temperature and precipitated in CHCl$_3$/MeOH (50/50).

Redissolution in DMF, precipitation in CHCl$_3$ and treatment with small amounts of MeOH yielded the product as a white powder. Yield: 3.5 g (70%). $M_n$=4,810 g/mol; $M_w$=180,000 g/mol; $M_w/M_n$=37.5.

Example 10

Solubility of Photopolymer Materials Before and After Photocrosslinking

Many photopolymers of the present teachings are soluble in common organic solvents including, but not limited to, tetrahydrofuran, bis(2-methoxyethyl)ether, dioxane, chloroform, ethyl acetate, acetone, toluene, dichlorobenzene, cyclohexylbenzene, dimethylformamide, N-methyl pyrrolidone, dimethyl sulfoxide, cyclopentanone and cyclohexanone. Photopolymers from Examples 2-7 and 9, for example, have excellent solubility in common organic solvents. For instance, PVP$_{0.55}$-co-PMMA$_{0.45}$-6HOC-Ac from Example 2 can be dissolved in cyclopentanone without heating to give a solution having a concentration of 350 mg/mL. Such a solution is sufficiently viscous for use in gravure printing.

After printing or other solution-phase depositing steps, photopolymers of the present teachings can be cured by exposure to ultraviolet light (e.g., via treatment in a 400 W UV oven for 0.5-5 minutes), which renders them insoluble in the organic solvents in which they were initially soluble prior to the photocrosslinking step. The cured dielectric films were found to be robust enough to withstand relatively harsh processes. For example, a photocrosslinked dielectric film was soaked in cyclopentanone for 1-5 min, after which its thickness and physical appearance was found to be substantially the same as before the soaking step. This feature of the present dielectric materials makes them attractive candidates for solution-processed bottom-gate OFETs, which requires that the dielectric layer be insoluble in the solution-processing solvent for the deposition of the semiconductor layer.

Example 11

Dielectric Film Fabrication

Photopolymer formulations were prepared by dissolving 100-150 mg of a selected polymer in 1 mL of cyclopentanone. The formulations were spin-coated onto clean silicon substrates at 1000-2000 rpm (acceleration 20) to give films of thickness in the range of about 350-450 nm. Highly n-doped silicon wafers (obtained from Montco Silicon Tech, Inc., Spring City, Pa.), were cleaned by sonication in organic solvents before use. After the spin-coating step, the resulting dielectric films were irradiated using ultraviolet light generated from a 400 W medium pressure mercury arc lamp filtered through a blue filter (Hoya Optics, San Jose, Calif., cutoff ca. 320 nm) at a distance of ca. 20 cm from the lamp housing. The UV intensity and dose was measured (between ca. 320-390 nm) using a radiometer. The films were then annealed in a vacuum oven at 100° C. for 1-10 minutes to completely remove any residual solvent.

Crosslinked films were soaked for 30-60 s in various solvents to test for solubility. Table 1 indicates the minimum radiation dose (radiation dose $(J/cm^2)$=lamp intensity $(W/cm^2)$*time (s)) required to make a dielectric film substantially insoluble (that is, the solvent treatment does not decrease the thickness of the crosslinked film by more than about 10%) in a variety of solvents including, but not limited to: acetone, anisole, chloroform, cyclopentanone, dioxane, water, and xylene. Spin-coated photopolymer films exposed to ultraviolet light through a shadow mask exhibited a clear pattern negative to that of the shadow mask when rinsed with the solvent used for spin-coating.

TABLE 1

Minimum curing doses for representative photopolymers of the present teachings. Poly(vinyl cinnamate) is included for comparison purposes.

| Photopolymer | Dose $(J/cm^2)$ |
| --- | --- |
| Poly(vinyl cinnamate) | >30 |
| $PVP_{0.55}$-co-$PMMA_{0.45}$-7HOC—Ac | 3 |
| PVP-7HOC—Ac | 1 |
| $PVP_{0.55}$-co-$PMMA_{0.45}$-6HOC—Ac | 1.5 |
| PVP-6HOC—Ac | 0.5 |

Because the mercury arc lamp used in this example has an intensity of about 8 $mW/cm^2$, by means of examples, a dose of 1 $J/cm^2$ for sufficiently crosslinking PVP-7HOC-Ac requires about 2 minutes of crosslinking time, while PVP-6HOC-Ac was sufficiently crosslinked with a dose of 0.5 $J/cm^2$ or about 1 minute of crosslinking time.

Example 12

Dielectric Characterization

Metal-insulator-semiconductor (MIS) capacitor structures were fabricated using the resulting dielectric films from Example 4, and the capacitance of the dielectric films was measured. For MIS structure fabrication, heavily doped n-type Si (MEMC Electronic Materials, Antimony/n-doped) was used as the metal onto which the dielectric film was spin-coated to form the insulating layer. Top Au electrodes (area=1500 µm×1500 µm) were then vacuum-deposited on top of the photopolymer insulator at $<1\times10^{-6}$ Torr to complete the MIS capacitor structure. Using a shadow mask, rectangular- or square-shaped Au pads having a feature size ranging from 100 µm×100 µm to 1000 µm×1000 µm, can be deposited to form MIS structures of different sizes. Unless otherwise specified, leakage currents in this and following examples were determined using capacitor structures with Au pads having a feature size of 200 µm×200 µm. The J-E characteristics of capacitors based on the dielectric materials of the present teachings appear to be independent of the area of the Au pads.

The current (I)-voltage (V) responses of the MIS structures were measured using a high sensitivity Keithley 4200 semiconductor characterization system. All of the measurements were performed in ambient atmosphere (relative humidity=30-80%). To minimize electrical noise during the I-V scan, a triaxial cabling and probing system (Signatone, Gilroy, Calif.) was employed to probe the MIS structures. The combined use of the Signatone triaxial probing system and the Keithley 4200 system reduced the noise level to as low as $10^{-15}$ A and provided accurate current measurements as low as $10^{-14}$ A. During the measurement, the bottom electrode was probed with an instrument ground and the top Au pads were probed with a soft tip from the Triaxial probe connected to the Keithley source meter. As controlled by the Keithley 4200 program, an I-V scan was performed by applying bias to the triaxial probe and measuring current through the circuit. The scan rate was between 5-15 s/step, which was controlled by setting the delay time to between 0.5 s and 2 s and the number of measurements per step between 10 and 20. Representative plots of leakage current density (J) versus electric field (E) are shown in FIG. 1.

Example 13

Top-Gate OFETs with a Photopolymer Dielectric Layer and Solution-Processed p-Type Semiconductor In this example, bottom-contact top-gate OFETs were fabricated using a dielectric material of the present teachings ($PVP_{0.55}$-co-$PMMA_{0.45}$-6HOC-Ac from Example 2) as the dielectric layer. Step 1. Substrate: Glass slides 1"×1", 0.4 mm thickness (PGO) were cleaned by sonication in ethanol three times and kept in ethanol before the next step. Step 2. Source and drain electrodes: Glass substrates from Step 2 were loaded onto a CV302-FR metal evaporator (Cooke Vacuum). Gold electrodes were evaporated through a shadow mask with channel dimension 25×500, 50×1000, and 75×1500 µm to a final thickness of 300 Å at the evaporation rate of 0.6 Å/s. Step 3. Semiconductor spincoating: Poly(3-hexylthiophene) (BASF) semiconductor was prepared as a 7 mg/mL solution in DCB (Aldrich) and carefully heated on a 120° C. heating plate until the polymer completely dissolved. Substrates from step 2 were loaded onto the spincoater inside a glovebox charged with $N_2$ and carefully cleaned with a strong air flow. Semiconductor solution was applied to the substrate through a 0.2 μm PTFE syringe filter (Millipore) and was spincoated at 1500 rpm (acceleration 20). The resulting film was baked in a 110° C. vacuum oven for 4 hours before proceeding to the next step. Step 4. Gate Dielectric: The dielectric layer was prepared by spincoating a $PVP_{0.55}$-co-$PMMA_{0.45}$-6HOC-Ac solution in cyclopentanone (120 mg/mL) at 1000 rpm (acceleration 20) for 2 minutes. The film was cured in a UV-oven (Dymax) through a 320 nm filter (Hoya Optics) for 1-7 min (ca. 8 mW/cm$^2$ lamp intensity). The device was baked at 110° C. in a vacuum oven for 20 minutes. In some samples, prior to the deposition of the dielectric polymer solution, an interlayer was formed by spin-coating a solution of the interlayer material onto the device and baking the resulting device in a 110° C. vacuum oven for 10 minutes. Step 5. Gate electrode: The gate electrode was evaporated in the same metal evaporator mentioned about to a final thickness of 300 Å at the rate of 0.6 Å/s. The devices were tested using a Signatone H100 series probe station equipped with Keithley Interactive Test Environment software in a 4-terminal-n-FET mode. Transfer plots were recorded with 60 V drain bias, 0 V source bias, and a gate bias sweeping from −60 V to 60 V at 5 V intervals. Output plots were recorded with 0-60 V drain bias with 5 V steps and 0-60 V gate bias with 10 V steps, source bias at 0V. Output and transfer plots of such top-gate device and using $SiO_2$ dielectric are shown in FIGS. 2-5.

Example 14

Figure 6:
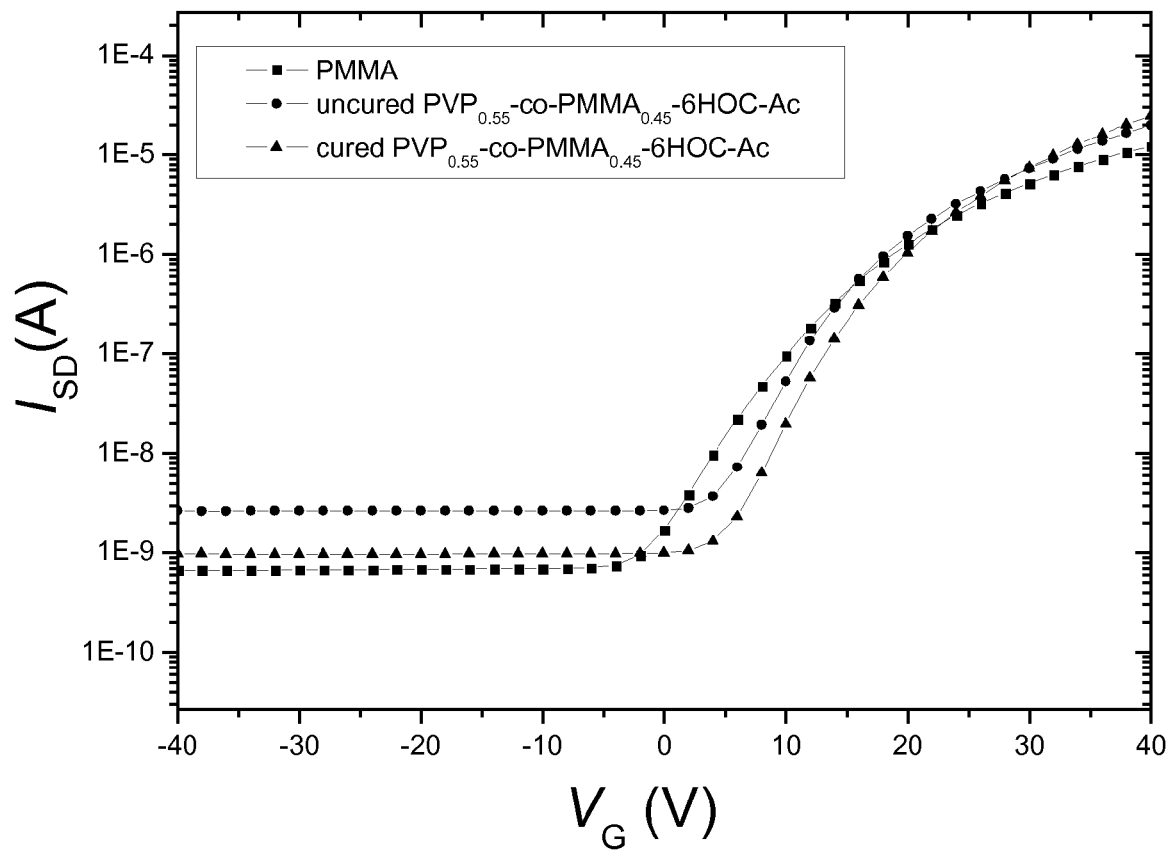
FIG. 6 provides representative transfer plots of perylene dicarboximide (PDI)-based organic field effect transistors fabricated in a top-gate structure with dielectric materials of the present teachings (a crosslinked dielectric film prepared from $PVP_{0.55}$-co-$PMMA_{0.45}$-6HOC-Ac).
Figure 7:
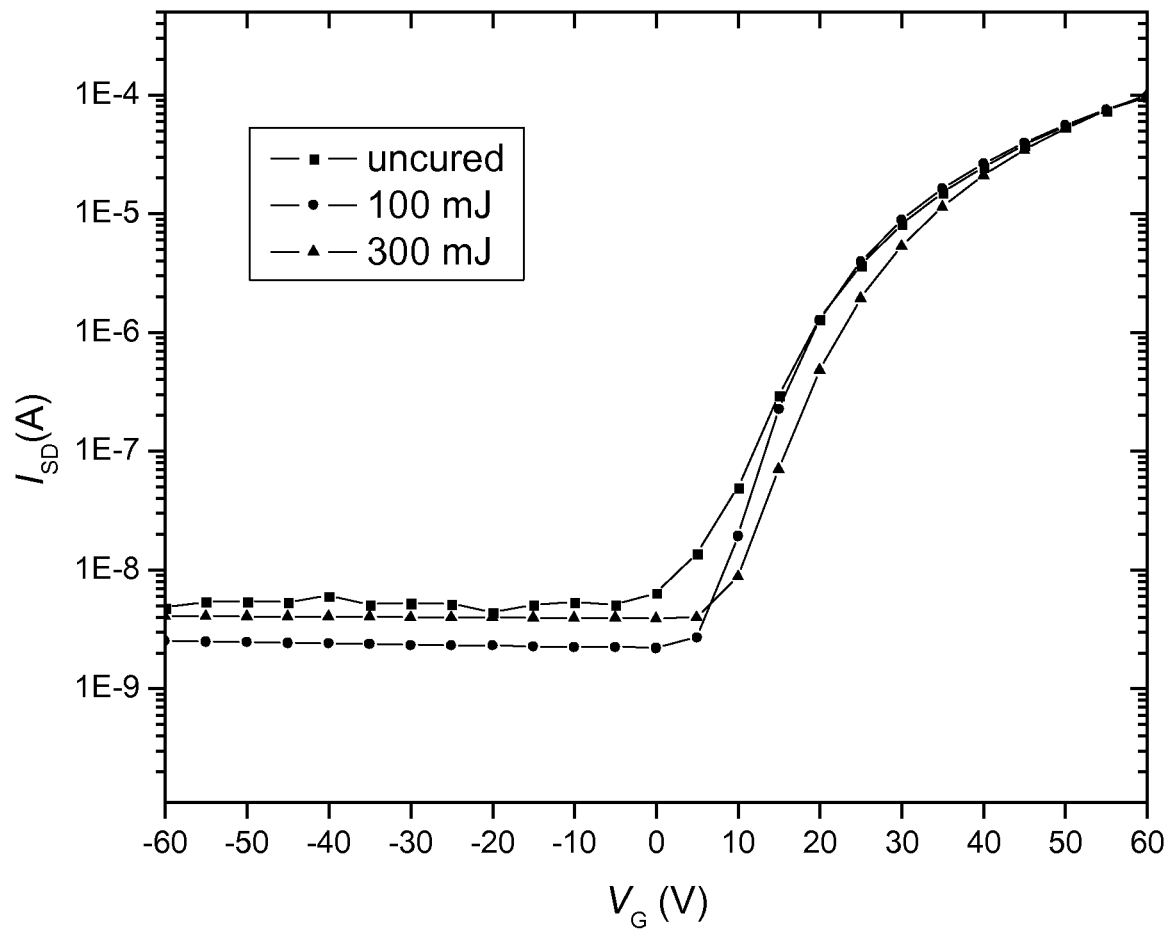
FIG. 7 provides representative transfer plots of PDI-based organic field effect transistors fabricated in a top-gate structure with dielectric materials of the present teachings (a crosslinked dielectric film prepared from PVP-6HOC-Ac) at different radiation doses.

Top-Gate OFETs with a Photopolymer Dielectric Layer and Solution-Processed n-Type Semiconductor A perylene-type n-type semiconductor, N,N'-bis(1-methylpentyl)-(1,7&1,6)-dicyanoperylene-3,4:9,10-bis(dicarboximide) (PDI1MP-$CN_2$) was used to fabricate n-type OFET devices with photopolymers of the present teachings as the dielectric layer. PDI1MP-$CN_2$ was synthesized according to procedures described in International Publication No. WO 2008/063609. Processing and measurement conditions were the same as in Example 10. Curing times were varied and PMMA was used as a control in some cases. Notably, UV-irradiation of the photopolymers through a 320 nm filter (Hoya Optics) did not affect the performance of the semiconductor. Representative OFET transfer plots are shown in FIGS. 6-7.

Example 15

Figure 8:
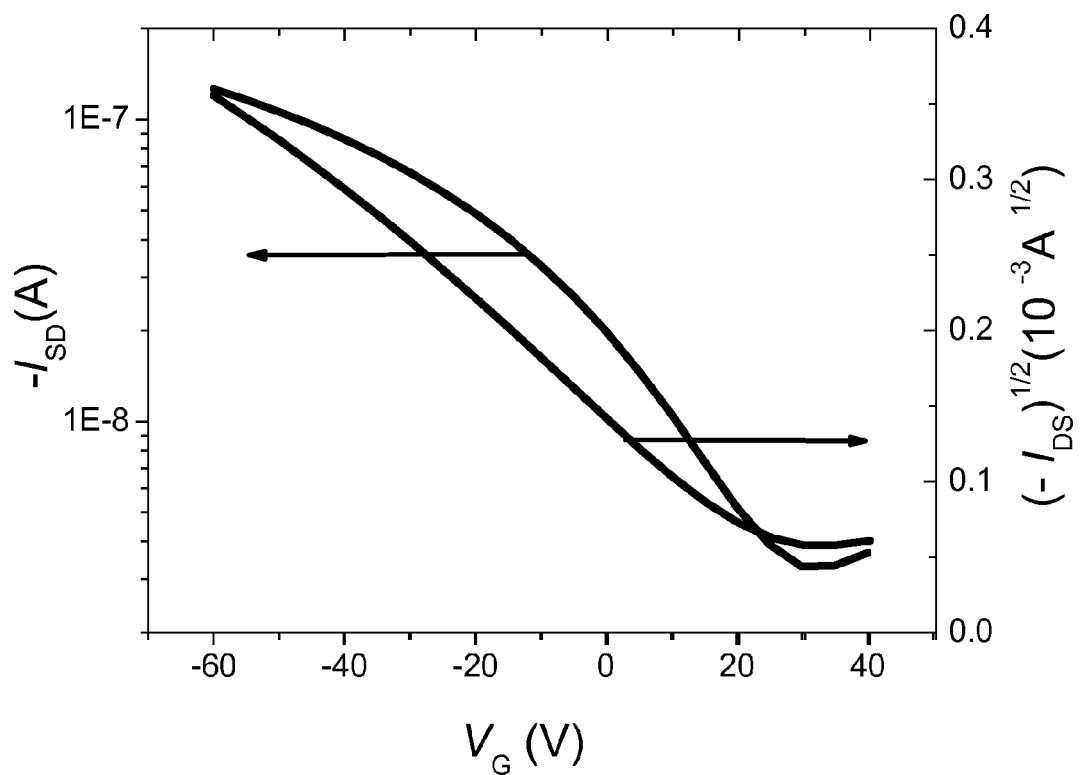
FIG. 8 provides representative transfer plots of poly(3-hexylthiophene)-based organic field effect transistors fabricated in a bottom-gate bottom-contact structure with dielectric materials of the present teachings (a crosslinked dielectric film prepared from $PVP_{0.55}$-co-$PMMA_{0.45}$-6HOC-Ac).

Bottom-Gate, Bottom-Contact OFETs with a Photopolymer Dielectric Layer and a Solution-Processed p-Type Semiconductor In this example, bottom-gate bottom-contact OFETs were fabricated using a dielectric material of the present teachings ($PVP_{0.55}$-co-$PMMA_{0.45}$-6HOC-Ac from Example 2) as the dielectric layer. Step 1. Substrate: A Si wafer (Montco) was prepared as 1"×1" pieces and cleaned by sonication with THF and ethanol. The wafers were loaded on a spincoater and rinsed with methanol twice at 5000 rpm. A 100~120 mg/mL solution of $PVP_{0.55}$-co-$PMMA_{0.45}$-6HOC-Ac in cyclopentanone was applied through a 0.22 um syringe filter and spin-coated at 1500~2000 rpm at acceleration 20. The films were transferred to a Dymax UV curing system and exposed to UV irradiation for 2-7 minutes under a 320 nm filter (ca. 8 mW/cm$^2$ lamp intensity) and baked at 110° C. in a vacuum oven for 20 minutes. Step 2. Source and drain electrode: Gold electrodes were evaporated to a final thickness of 300 Å at an evaporation rate of 0.5 Å/s. Step 3. Semiconductor: Poly(3-hexylthiophene) was spin-coated from a 8 mg/mL solution in dichlorobenzene at 1500 rpm. The devices were baked in a 110° C. vacuum oven overnight before measurement. Measurement was performed as in Example 10. Representative OFET transfer plots are shown in FIG. 8.

Example 16

Figure 9:
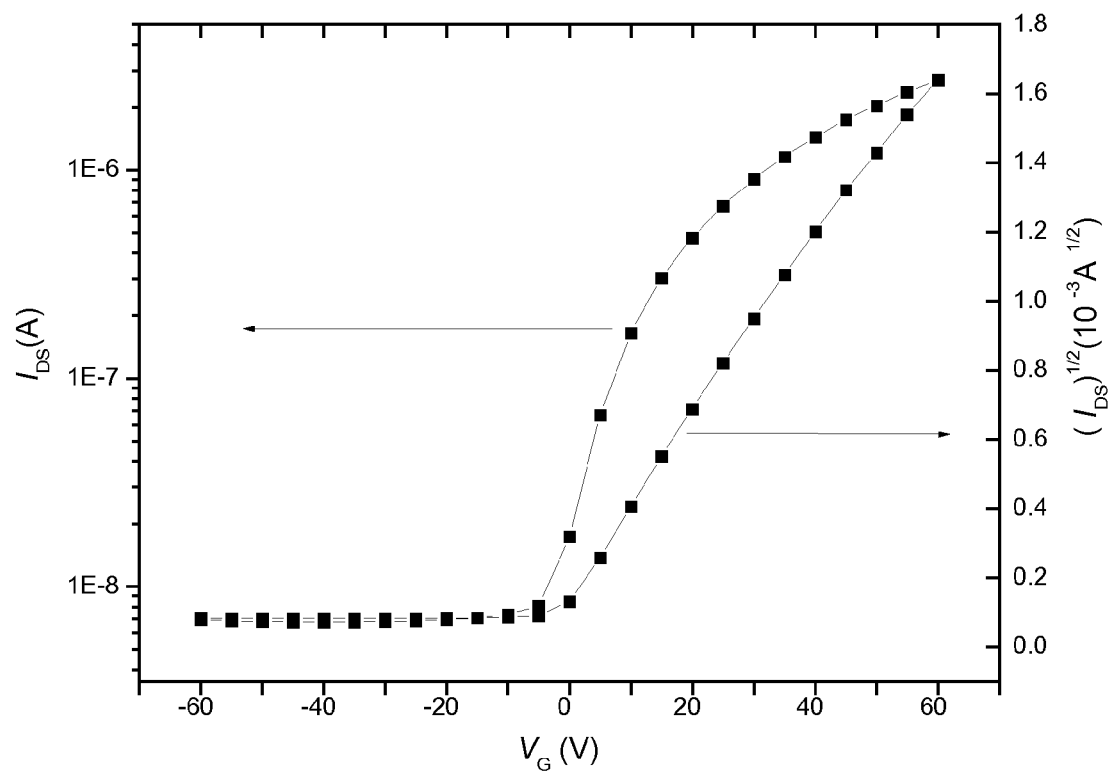
FIG. 9 provides representative transfer plots of PDI-based organic field effect transistors fabricated in a bottom-gate bottom-contact structure with dielectric materials of the present teachings (a crosslinked dielectric film prepared from $PVP_{0.55}$-co-$PMMA_{0.45}$-6HOC-Ac).

Bottom-Gate, Bottom-Contact OFETs with a Photopolymer Dielectric Layer and Solution-Processed n-Type Semiconductor In this example, bottom-gate bottom-contact OFETs were fabricated using a dielectric material of the present teachings ($PVP_{0.55}$-co-$PMMA_{0.45}$-6HOC-Ac from Example 2) as the dielectric layer. Step 1. Substrate: A Si wafer (Montco) was prepared as 1"×1" pieces and cleaned by sonication with THF and ethanol. The wafers were loaded on a spincoater and rinsed with methanol twice at 5000 rpm. A 120 mg/mL solution of $PVP_{0.55}$-co-$PMMA_{0.45}$-6HOC-Ac in cyclopentanone was applied through a 0.22 um syringe filter and spin-coated at 1100 rpm at acceleration 20. The films were transferred to a Dymax UV curing system and exposed to UV irradiation for 4 minutes under a 320 nm filter (ca. 8 mW/cm$^2$ lamp intensity) and baked at 110° C. in a vacuum oven for 20 minutes. Step 2. Source and drain electrode: Gold electrodes were evaporated to a final thickness of 300 Å at an evaporation rate of 0.5 Å/s. Step 3. Semiconductor: PDI2EH-CN2 semiconductor was spin-coated from a 7 mg/mL solution in dichlorobenzene at 1500 rpm. The devices were baked in a 110° C. vacuum oven overnight before measurement. Measurement was performed as in Example 10. Representative OFET transfer plots are shown in FIG. 9.

Example 17

Figure 10:
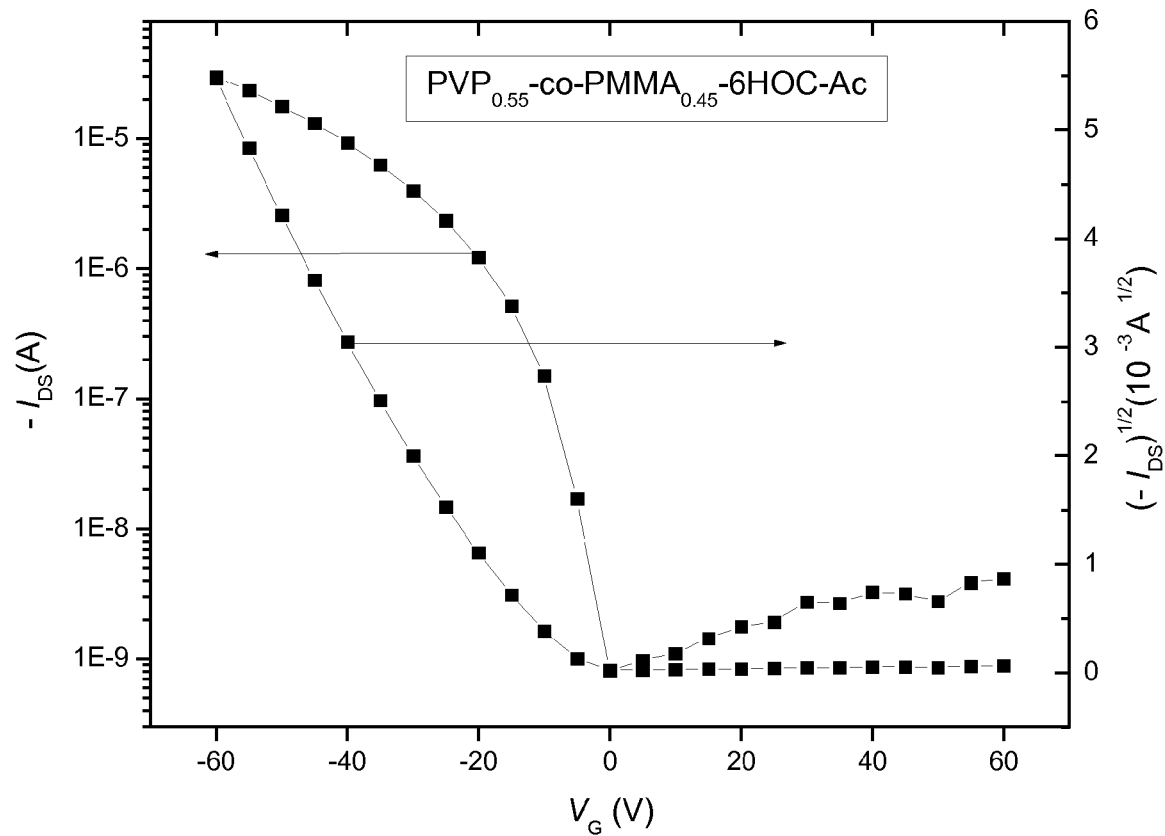
FIG. 10 provides representative transfer plots of pentacene-based organic field effect transistors fabricated in a bottom-gate top-contact structure with dielectric materials of the present teachings (a crosslinked dielectric film prepared from $PVP_{0.55}$-co-$PMMA_{0.45}$-6HOC-Ac).
Figure 11:
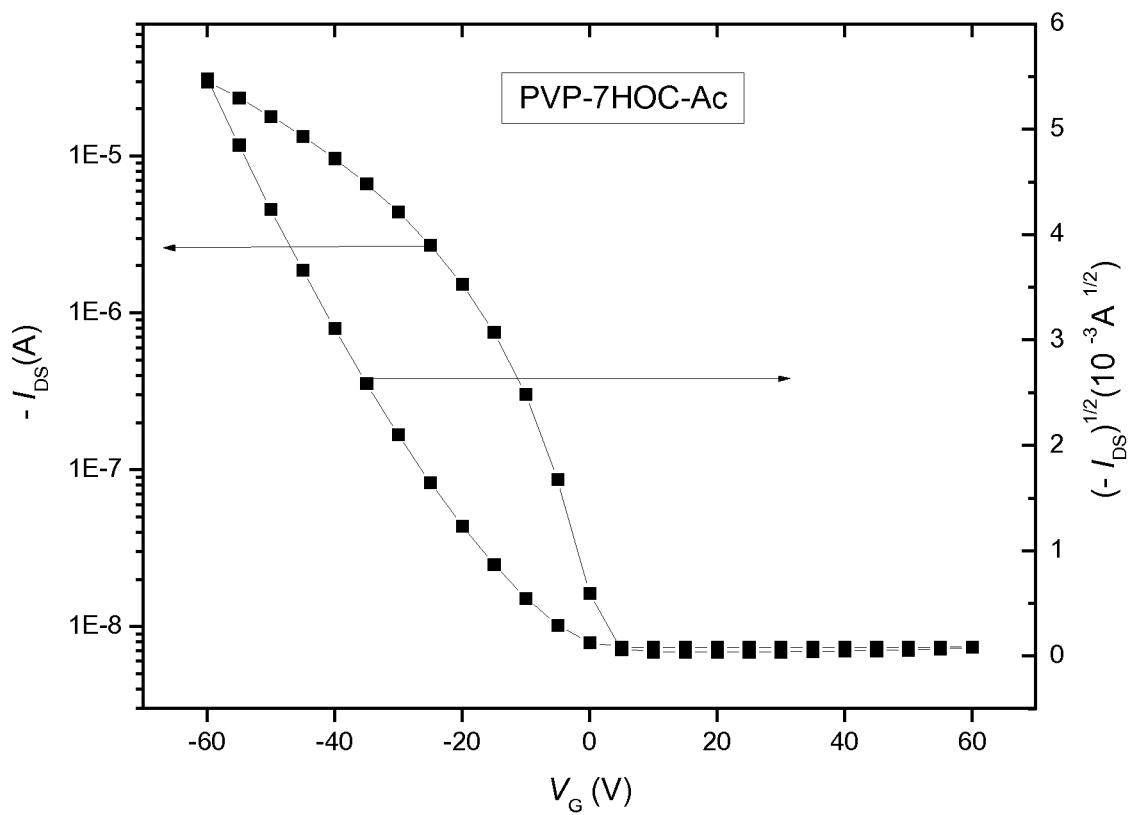
FIG. 11 provides representative transfer plots of pentacene-based organic field effect transistors fabricated in a bottom-gate top-contact structure with dielectric materials of the present teachings (a crosslinked dielectric film prepared from PVP-7HOC-Ac).

Bottom-Gate, Top-Contact OFETs with a Photopolymer Dielectric Layer and Vapor-Deposited Pentacene Semiconductor Pentacene OFETs were fabricated with dielectric films on silicon gate materials. A Si wafer (Montco) was prepared as 1"×1" pieces and cleaned by sonication with THF and ethanol. The wafers were loaded on a spincoater and rinsed with methanol twice at 5000 rpm. A 120 mg/mL solution of a photopolymer of the present teachings ($PVP_{0.55}$-co-$PMMA_{0.45}$-6HOC-Ac and PVP-7HOC-Ac) in cyclopentanone was applied through a 0.22 um syringe filter and spin-coated at 1800 rpm at acceleration 20. The films were transferred to a Dymax UV curing system and exposed to UV irradiation for 4 minutes under a 320 nm filter (ca. 8 mW/cm$^2$ lamp intensity) and baked at 110° C. in a vacuum oven for 20 minutes. Pentacene (Sigma-Aldrich, St. Louis, Mo.) was vacuum-deposited at about 2×10$^{-6}$ Torr (500 Å, 0.3 Å/s) while maintaining the substrate temperature at about 50° C. to about 70° C. Gold (Au) electrodes were vacuum-deposited through shadow masks at 3-4×10$^{-6}$ Torr (500 Å, 0.3 Å/s). The channel length was 50 μm, and the channel width was 5000 μm. Measurement was performed as in Example 10. Representative OFET transfer plots are shown in FIGS. 10-11.

OFET performances of the photopolymer-based devices described in Examples 10-14 are summarized in Table 2.

TABLE 2

Performance of devices fabricated using dielectrics of the present teachings. Pentacene was vapor-deposited and poly(3-hexylthiophene) and N,N-bis(2-ethylhexyl)-(1,7&1,6)-dicyanoperylene-3,4,9,10-bis(dicarboximide) (PDI2EH-CN2) were processed from solution.

| Device Structure | Dielectric | Semiconductor | Carrier mobility μcat (cm2/Vs) | Ion/Ioff |
|---|---|---|---|---|
| Top-gate | PVP0.55-co-PMMA0.45-6HOC—Ac/PVCH | Poly(3-hexylthiophene) | 0.042 | 100 |
| Bottom-gate, top-contact | SiO2 | Poly(3-hexylthiophene) | 0.00087 | 100 |
| Bottom-gate, bottom-contact | PVP0.55-co-PMMA0.45-6HOC—Ac | Poly(3-hexylthiophene) | 0.00029 | 40 |
| Bottom-gate, bottom-contact | PVP0.55-co-PMMA0.45-6HOC—Ac | PDI2EH-CN2 | 0.014 | 400 |
| Bottom-gate, top-contact | PVP-7HOC—Ac | Pentacene | 0.27 | 1800 |
| Bottom-gate, top-contact | PVP0.55-co-PMMA0.45-6HOC—Ac | Pentancene | 0.28 | 37000 |

Example 18

Figure 12:
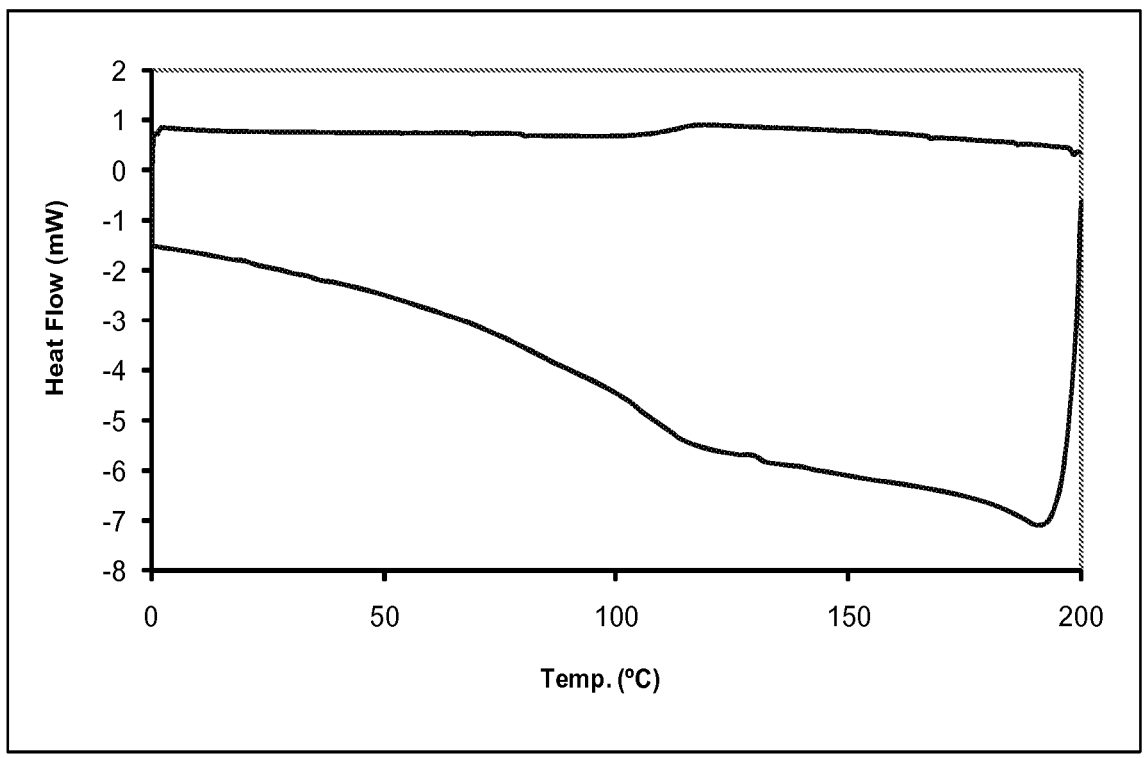
FIG. 12 provides a typical differential scanning calorimetry (DSC) plot of a polymer of the present teachings (PVP-6HOC-Ac).

Effects of Methyl Methacrylate Co-Monomer on Solubility, Dielectric Constant and Glass Transition Temperature of the Present Photopolymers The glass transition properties of the present photopolymers were characterized by differential scanning calorimetry (DSC). FIG. 12 shows a typical DSC plot of photopolymers of the present teachings PVP-6HOC-Ac dielectric ($T_g=107°$ C.). Incorporation of methyl methacrylate repeating units into the polymeric backbone improved solubility and slightly lowered the glass transition temperature. For example, the $T_g$ of $PVP_{0.80}$-co-$PMMA_{0.20}$-6HOC-Ac was 106° C. Increasing amounts of methyl methacrylate gave higher dielectric constants. For example, the dielectric constant of $PVP_{0.80}$-co-$PMMA_{0.20}$-6HOC-Ac was 3.8 and the dielectric constant of $PVP_{0.55}$-co-$PMMA_{0.45}$-6HOC-Ac was 3.9. The photopolymer $PVP_{0.55}$-co-$PMMA_{0.45}$-6HOC-Ac was soluble in a larger variety of solvents, including chloroform, whereas PVP-6HOC-Ac showed lower solubility in solvents such as chloroform.

Example 19

Effects of Solvent Treatment on Crosslinked Dielectric Films

Figure 13:
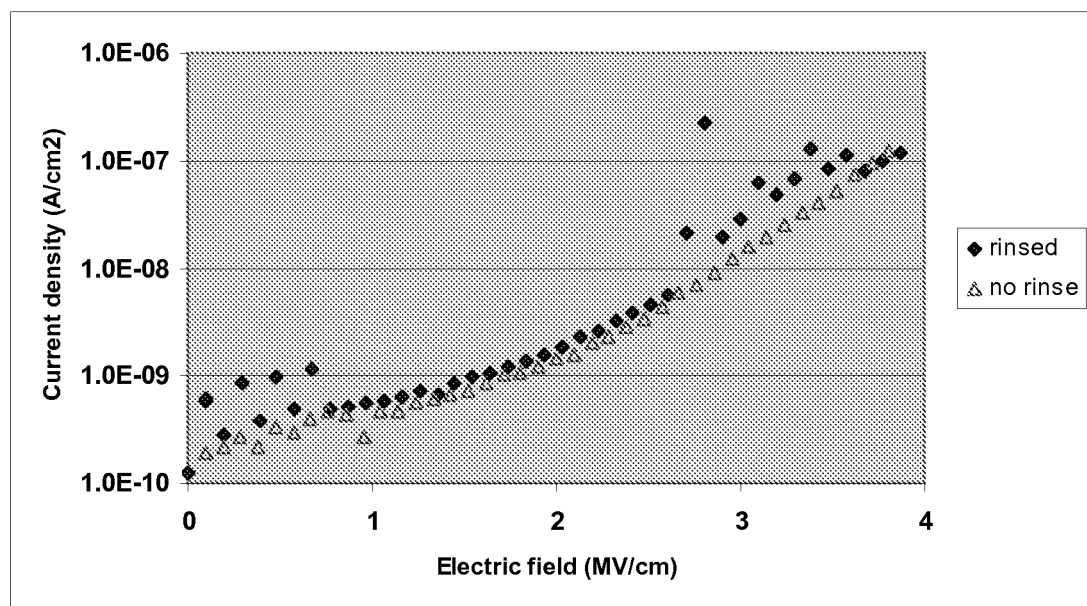
FIG. 13 provides leakage current density (J) versus electric field (E) plots of metal-insulator-metal capacitor structures incorporating dielectric materials of the present teachings (a crosslinked dielectric film prepared from PVP-6HOC-Ac) before and after post-crosslinking solvent treatment.

Photopolymer PVP-6HOC-Ac was dissolved in cyclopentanone at 100 mg/mL and spin-coated at 1000 rpm on a Si substrate (Montco Silicon Tech, Inc.). The film was irradiated with 1.5 J/cm$^2$ of ultraviolet light generated from a 400 W medium pressure mercury arc lamp filtered through a blue filter (Hoya Optics, San Jose, Calif., cutoff ca. 320 nm). The film was then baked in a vacuum oven at 110° C. for 10 minutes. To check if the film was well crosslinked and resistant to solvent the substrate first was cut into two equal pieces. One half was rinsed with cyclopentanone for 30 seconds. The thickness of the dielectric film after rinsing was about 517 nm compared to about 525 nm without rinsing. The minimal change in film thickness corresponded to minimal effects on the leakage properties of the film before or after solvent treatment. As shown in FIG. 13, solvent rinsing caused no significant changes on the leakage properties of the crosslinked dielectric films.

The present teachings can be embodied in other specific forms without departing from the spirit or essential characteristics thereof. The foregoing embodiments are therefore to be considered in all respects illustrative rather than limiting on the present teachings described herein. The scope of the present teachings is thus indicated by the appended claims rather than by the foregoing description, and all changes that come within the meaning and range of equivalency of the claims are intended to be embraced therein.

What is claimed is:

1. A thin film transistor device, comprising:
    a dielectric layer;
    a semiconductor layer;
    a gate electrode;
    a source electrode; and
    a drain electrode;
    wherein the dielectric layer is disposed between the semiconductor layer and the gate electrode;
    wherein the source electrode and the drain electrode are in contact with the semiconductor layer,
    wherein the dielectric layer comprises a polymeric film, the polymeric film comprising a polymer comprising a repeating unit having a pendant group comprising an optionally substituted coumarin-6-yl moiety, wherein the optionally substituted coumarin-6-yl moiety has a formula:

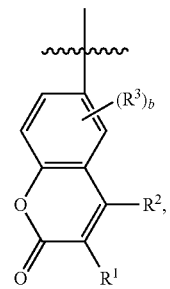

wherein:
$R^1$ and $R^2$ are independently selected from the group consisting of a) H, b) halogen, c) —CN, d) —NO$_2$, e) —OR$^4$, f) —N(R$^4$)$_2$, g) —CHO, h) —C(O)R$^4$, i) —C(O)OR$^4$, j) —C(O)N(R$^4$)$_2$, a C$_{1-20}$ alkyl group, l) a C$_{2-20}$ alkenyl group, m) a C$_{2-20}$ alkynyl group, n) a C$_{1-20}$ alkoxy group, o) a C$_{1-20}$ alkylthio group, p) a C$_{1-20}$ haloalkyl group, q) a —Y—C$_{3-14}$ cycloalkyl group, r) a —Y—C$_{6-14}$ aryl group, s) a —Y-3-14 membered cycloheteroalkyl group, and t) a —Y-5-14 membered heteroaryl group, wherein each of the C$_{1-20}$ alkyl group, the C$_{2-20}$ alkenyl group, the C$_{2-20}$ alkynyl group, the C$_{3-14}$ cycloalkyl group, the C$_{6-14}$ aryl group, the 3-14 membered cycloheteroalkyl group, and the 5-14 membered heteroaryl group is optionally substituted with 1-5 R$^5$ groups;
$R^3$, at each occurrence, is independently selected from the group consisting of a) halogen, b) —CN, c) —NO$_2$, d) —OR$^4$, e) —N(R$^4$)$_2$, f) —CHO, g) —C(O)R$^4$, h)

—C(O)OR⁴, i) —C(O)N(R⁴)₂, a C₁₋₂₀ alkyl group, k) a C₂₋₂₀ alkenyl group, l) a C₂₋₂₀ alkynyl group, m) a C₁₋₂₀ alkoxy group, n) a C₁₋₂₀ alkylthio group, o) a C₁₋₂₀ haloalkyl group, p) a —Y—C₃₋₁₄ cycloalkyl group, q) a —Y—C₆₋₁₄ aryl group, r) a —Y-3-14 membered cycloheteroalkyl group, and s) a —Y-5-14 membered heteroaryl group, wherein each of the C₁₋₂₀ alkyl group, the C₂₋₂₀ alkenyl group, the C₂₋₂₀ alkynyl group, the C₃₋₁₄ cycloalkyl group, the C₆₋₁₄ aryl group, the 3-14 membered cycloheteroalkyl group, and the 5-14 membered heteroaryl group is optionally substituted with 1-5 R⁵ groups, R⁴, at each occurrence, is independently selected from the group consisting of a) H, b) a C₁₋₂₀ alkyl group, c) a C₂₋₂₀ alkenyl group, d) a C₂₋₂₀ alkynyl group, e) a C₁₋₂₀ alkoxy group, f) a C₁₋₂₀ alkylthio group, g) a C₁₋₂₀ haloalkyl group, h) a —Y—C₃₋₁₄ cycloalkyl group, i) a —Y—C₆₋₁₄ aryl group, j) a —Y-3-14 membered cycloheteroalkyl group, and k) a —Y-5-14 membered heteroaryl group, wherein each of the C₁₋₂₀ alkyl group, the C₂₋₂₀ alkenyl group, the C₂₋₂₀ alkynyl group, the C₃₋₁₄ cycloalkyl group, the C₆₋₁₄ aryl group, the 3-14 membered cycloheteroalkyl group, and the 5-14 membered heteroaryl group optionally is substituted with 1-5 R⁵ groups;

R⁵, at each occurrence, is independently selected from the group consisting of a) halogen, b) —CN, c) —NO₂, d) —OH, e) —O—C₆₋₁₄ aryl, f) —NH₂, g) —NH—C₁₋₁₀ alkyl, h) —N(C₁₋₁₀ alkyl)₂, i) —NH—C₆₋₁₄ aryl, j) —N(C₁₋₁₀ alkyl)-C₆₋₁₄ aryl, k) —N(C₆₋₁₄ aryl)₂, l) —CHO, m) —C(O)—C₁₋₁₀ alkyl, n) —C(O)—C₆₋₁₄ aryl, o) —C(O)OH, p) —C(O)—OC₁₋₁₀ alkyl, q) —C(O)—OC₆₋₁₄ aryl, r) —C(O)NH₂, s) —C(O)NH—C₁₋₁₀ alkyl, t) —C(O)N(C₁₋₁₀ alkyl)₂, u) —C(O)NH—C₆₋₁₄ aryl, v) —C(O)N(C₁₋₁₀ alkyl)-C₆₋₁₄ aryl, w) —C(O)N(C₆₋₁₄ aryl)₂, x) a C₁₋₁₀ alkyl group, y) a C₂₋₁₀ alkenyl group, z) a C₂₋₁₀ alkynyl group, aa) a C₁₋₁₀ alkoxy group, ab) a C₁₋₁₀ alkylthio group, ac) a C₁₋₁₀ haloalkyl group, ad) a —Y—C₃₋₁₄ cycloalkyl group, ae) a —Y—C₆₋₁₄ aryl group, af) a —Y-3-14 membered cycloheteroalkyl group, and ag) a —Y-5-14 membered heteroaryl group, wherein each of the C₁₋₁₀ alkyl group, the C₂₋₁₀ alkenyl group, the C₂₋₁₀ alkynyl group, the C₃₋₁₄ cycloalkyl group, the C₆₋₁₄ aryl group, the 3-14 membered cycloheteroalkyl group, and the 5-14 membered heteroaryl group is optionally substituted with 1-5 substituents independently selected from the group consisting of a halogen, CN, a C₁₋₆ alkyl group, a C₁₋₆ haloalkyl group, a C₁₋₆ alkoxy group, a —O—C₁₋₆ haloalkyl group, a —C(O)—C₁₋₆ alkyl group, a —C(O)—C₁₋₆ haloalkyl group, and a —C(O)—O—C₁₋₆ alkyl group;

Y, at each occurrence, is a divalent C₁₋₆ alkyl group, a divalent C₂₋₆ alkenyl group, a divalent C₂₋₆ alkynyl group, or a covalent bond; and b is 0, 1, 2, or 3.

2. The device of claim 1, wherein R¹ and R² independently are selected from the group consisting of H, F, —CN, and CF₃.

3. The device of claim 1, wherein R³, at each occurrence, is independently selected from the group consisting of a halogen, OH, —CN, a C₁₋₆ alkyl group, a C₁₋₆haloalkyl group, and a C₁₋₆alkoxy group.

4. The device of claim 1, wherein the polymer comprises at least one repeating unit of a formula selected from the group consisting of:

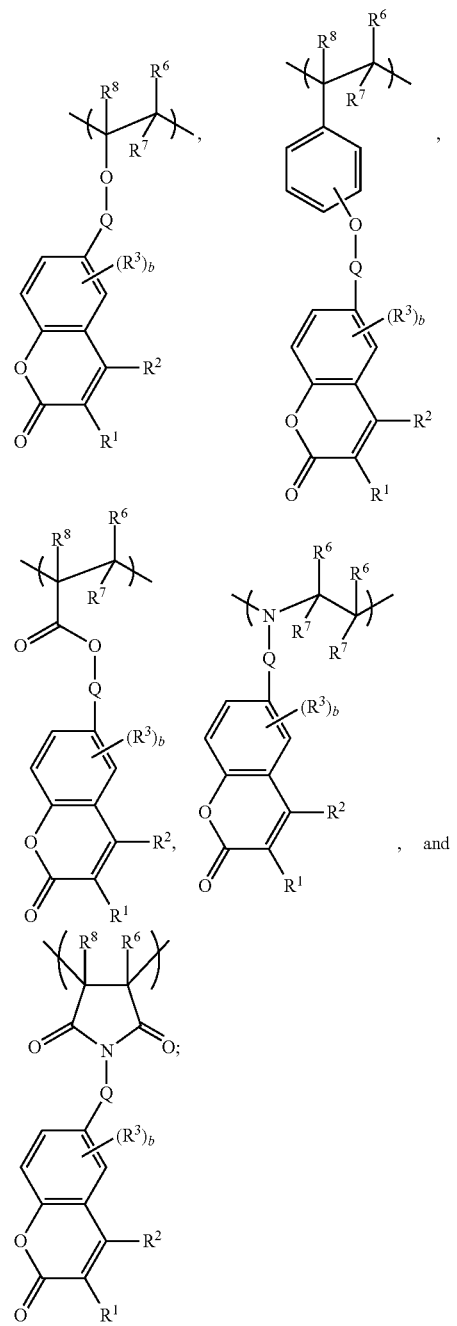

wherein:
Q is -(L″)-L‴-; and
R⁶, R⁷, and R⁸ are independently selected from the group consisting of H, a halogen, a C₁₋₁₀ alkyl group, and a C₆₋₁₄ aryl group, wherein each of the C₁₋₁₀ alkyl group and the C₆₋₁₄ aryl group is optionally substituted with 1-5 R⁵ groups;

L″, at each occurrence, is independently selected from the group consisting of —Y″—, —(Y″)ₘ—O—, —Y″—NR⁴—, —Y″—C(NR⁴)—, —Y″—Si(R⁴)₂—, —O—Si(R⁴)₂—, and a covalent bond;

L‴ is linked to the coumarin moiety and is selected from the group consisting of —C(O)—, —C(O)—O—, —O—C(O)—, —C(O)—Y‴—O—, —O—Y″—C(O)—, —C(O)—NR⁴—, —NR⁴—C(O)—, —C(O)—

Y'''—NR⁴—, —NR⁴—Y'''—C(O)—, —O—S(O)$_k$—, —O—Y'''—S(O)$_k$—, and a covalent bond;

Y'', at each occurrence, is selected from the group consisting of a divalent $C_{1-6}$alkyl group, a divalent $C_{2-6}$alkenyl group, and a divalent $C_{6-14}$ aryl group, wherein each of the $C_{1-6}$ alkyl group, the $C_{2-6}$alkenyl group, and the $C_{6-14}$ aryl group is optionally substituted with 1-5 R⁵ groups;

Y''' is selected from the group consisting of a divalent $C_{1-6}$ alkyl group, a divalent $C_{2-6}$ alkenyl group, and a divalent $C_{6-14}$ aryl group, wherein each of the $C_{1-6}$alkyl group, the $C_{2-6}$ alkenyl group, and the $C_{6-14}$ aryl group is optionally substituted with 1-5 R⁵ groups;

k is 0, 1, or 2;

m is 1, 2, 3, 4, 5, or 6;

p is an integer in a range from 0 to 10;

R¹ and R² are independently selected from the group consisting of a) H, b) halogen, c) —CN, d) —NO₂, e) —OR⁴, f) —N(R⁴)₂, g) —CHO, h) —C(O)R⁴, i) —C(O)OR⁴, j) —C(O)N(R⁴)₂, a $C_{1-20}$ alkyl group, l) a $C_{2-20}$ alkenyl group, m) a $C_{2-20}$ alkynyl group, n) a $C_{1-20}$ alkoxy group, o) a $C_{1-20}$ alkylthio group, p) a $C_{1-20}$ haloalkyl group, q) a —Y—$C_{3-14}$ cycloalkyl group, r) a —Y—$C_{6-14}$ aryl group, s) a —Y-3-14 membered cycloheteroalkyl group, and t) a —Y-5-14 membered heteroaryl group, wherein each of the $C_{1-20}$ alkyl group, the $C_{2-20}$ alkenyl group, the $C_{2-20}$ alkynyl group, the $C_{3-14}$ cycloalkyl group, the $C_{6-14}$ aryl group, the 3-14 membered cycloheteroalkyl group, and the 5-14 membered heteroaryl group is optionally substituted with 1-5 R⁵ groups;

R³, at each occurrence, is independently selected from the group consisting of a) halogen, b) —CN, c) —NO₂, d) —OR⁴, e) —N(R⁴)₂, f) —CHO, g) —C(O)R⁴, h) —C(O)OR⁴, i) —C(O)N(R⁴)₂, a $C_{1-20}$ alkyl group, k) a $C_{2-20}$ alkenyl group, l) a $C_{2-20}$ alkynyl group, m) a $C_{1-20}$ alkoxy group, n) a $C_{1-20}$ alkylthio group, o) a $C_{1-20}$ haloalkyl group, p) a —Y—$C_{3-14}$ cycloalkyl group, q) a —Y—$C_{6-14}$ aryl group, r) a —Y-3-14 membered cycloheteroalkyl group, and s) a —Y-5-14 membered heteroaryl group, wherein each of the $C_{1-20}$ alkyl group, the $C_{2-20}$ alkenyl group, the $C_{2-20}$ alkynyl group, the $C_{3-14}$ cycloalkyl group, the $C_{6-14}$ aryl group, the 3-14 membered cycloheteroalkyl group, and the 5-14 membered heteroaryl group is optionally substituted with 1-5 R⁵ groups, R⁴, at each occurrence, is independently selected from the group consisting of a) H, b) a $C_{1-20}$ alkyl group, c) a $C_{2-20}$ alkenyl group, d) a $C_{2-20}$ alkynyl group, e) a $C_{1-20}$ alkoxy group, f) a $C_{1-20}$ alkylthio group, g) a $C_{1-20}$ haloalkyl group, h) a —Y—$C_{3-14}$ cycloalkyl group, i) a —Y—$C_{6-14}$ aryl group, j) a —Y-3-14 membered cycloheteroalkyl group, and k) a —Y-5-14 membered heteroaryl group, wherein each of the $C_{1-20}$ alkyl group, the $C_{2-20}$ alkenyl group, the $C_{2-20}$ alkynyl group, the $C_{3-14}$ cycloalkyl group, the $C_{6-14}$ aryl group, the 3-14 membered cycloheteroalkyl group, and the 5-14 membered heteroaryl group optionally is substituted with 1-5 R⁵ groups;

R⁵, at each occurrence, is independently selected from the group consisting of a) halogen, b) —CN, c) —NO₂, d) —OH, e) —O—$C_{6-14}$ aryl, f) —NH₂, g) —NH—$C_{1-10}$ alkyl, h) —N($C_{1-10}$ alkyl)₂, i) —NH—$C_{6-14}$ aryl, j) —N($C_{1-10}$ alkyl)-$C_{6-14}$ aryl, k) —N($C_{6-14}$ aryl)₂, l) —CHO, m) —C(O)—$C_{1-10}$-alkyl, n) —C(O)—$C_{6-14}$ aryl, o) —C(O)OH, p) —C(O)—O$C_{1-10}$ alkyl, q) —C(O)—O$C_{6-14}$ aryl, r) —C(O)NH₂, s) —C(O)NH—$C_{1-10}$ alkyl, t) —C(O)N($C_{1-10}$ alkyl)₂, u) —C(O)NH—$C_{6-14}$ aryl, v) —C(O)N($C_{1-10}$ alkyl)-$C_{6-14}$ aryl, w) —C(O)N($C_{6-14}$ aryl)₂, x) a $C_{1-10}$ alkyl group, y) a $C_{2-10}$ alkenyl group, z) a $C_{2-10}$ alkynyl group, aa) a $C_{1-10}$ alkoxy group, ab) a $C_{1-10}$ alkylthio group, ac) a $C_{1-10}$ haloalkyl group, ad) a —Y—$C_{3-14}$ cycloalkyl group, ae) a —Y—$C_{6-14}$ aryl group, af) a —Y-3-14 membered cycloheteroalkyl group, and ag) a —Y-5-14 membered heteroaryl group, wherein each of the $C_{1-10}$ alkyl group, the $C_{2-10}$ alkenyl group, the $C_{2-10}$ alkynyl group, the $C_{3-14}$ cycloalkyl group, the $C_{6-14}$ aryl group, the 3-14 membered cycloheteroalkyl group, and the 5-14 membered heteroaryl group is optionally substituted with 1-5 substituents independently selected from the group consisting of a halogen, CN, a $C_{1-6}$alkyl group, a $C_{1-6}$ haloalkyl group, a $C_{1-6}$alkoxy group, a —O—$C_{1-6}$haloalkyl group, a —C(O)—$C_{1-6}$alkyl group, a —C(O)—$C_{1-6}$haloalkyl group, and a —C(O)—O—$C_{1-6}$ alkyl group; and b is 0, 1, 2, or 3.

5. The device of claim 1, wherein the polymer comprises at least one repeating unit of a formula selected from the group consisting of:

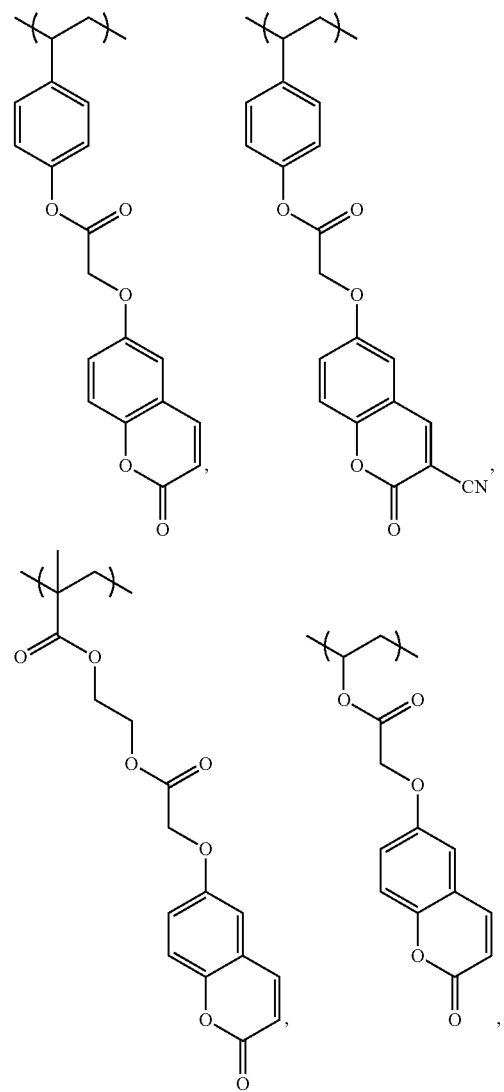

-continued

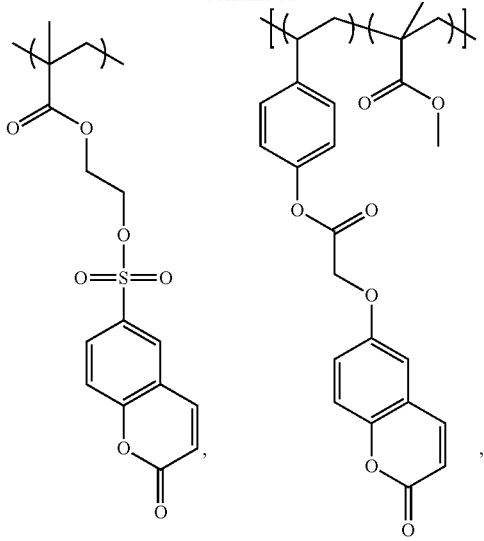

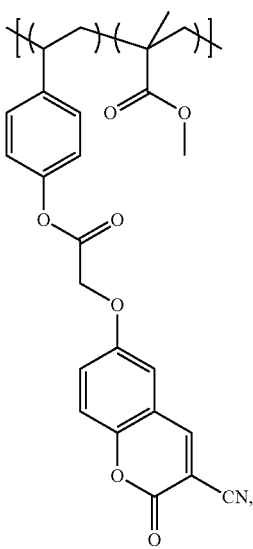

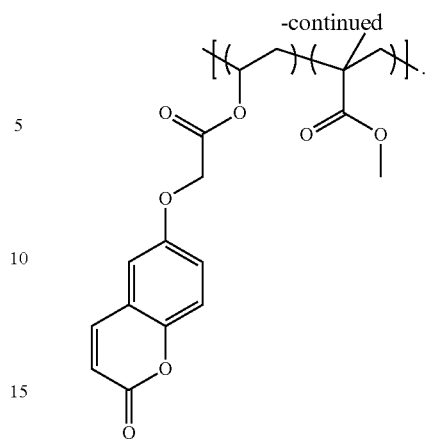

-continued

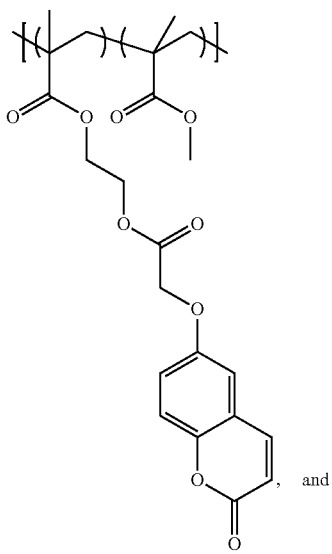

6. The device of claim 1, configured as a top-gate device structure and comprising an interlayer between the dielectric layer and the semiconductor layer.

7. A thin film transistor device, comprising:
a dielectric layer;
a semiconductor layer;
a gate electrode;
a source electrode; and
a drain electrode;
wherein the dielectric layer is disposed between the semiconductor layer and the gate electrode;
wherein the source electrode and the drain electrode are in contact with the semiconductor layer,
wherein the dielectric layer comprises a polymeric film, the polymeric film comprising a polymer comprising a repeating unit having a pendant group comprising an optionally substituted coumarin-6-yl moiety, and
wherein the polymer is selected from the group consisting of a vinyl polymer, a siloxane polymer, polymaleimide, polyethylene amine, and at least one copolymer thereof, and comprises a repeating unit having a pendant group comprising an optionally substituted coumarin-6-yl moiety.

8. The device of claim 7, wherein the polymer is a vinyl polymer selected from the group consisting of polystyrene, polyvinyl phenol, polyvinyl alcohol, polyvinyl acetate, polymethyl methacrylate, and at least one copolymer thereof, and comprises a repeating unit having a pendant group comprising an optionally substituted coumarin-6-yl moiety.

9. The device of claim 7, configured as a top-gate device structure and comprising an interlayer between the dielectric layer and the semiconductor layer.

10. A thin film transistor device, comprising:
a dielectric layer;
a semiconductor layer;
a gate electrode;
a source electrode; and
a drain electrode;
wherein the dielectric layer is disposed between the semiconductor layer and the gate electrode;
wherein the source electrode and the drain electrode are in contact with the semiconductor layer,
wherein the dielectric layer comprises a polymeric film, the polymeric film comprising a polymer comprising a repeating unit having a pendant group comprising an optionally substituted coumarin-6-yl moiety, and
wherein the polymer has at least one selected from the group consisting of:
a dielectric constant between about 1.1 and about 5.0;

a glass transition temperature ($T_g$) between about 100° C. and about 200° C.;

a solubility of greater than about 0.1 mg/mL in a solvent selected from the group consisting of anisole, xylene, cyclopentanone, cyclohexane and cyclohexanone;

a maximum absorbance wavelength in the range of about 250 nm and about 500 nm; and a molecular weight between about 10,000 Da and about 100,000 Da.

11. The device of claim 10, configured as a top-gate device structure and comprising an interlayer between the dielectric layer and the semiconductor layer.

* * * * *